(12) United States Patent
Wolk et al.

(10) Patent No.: US 11,086,056 B2
(45) Date of Patent: Aug. 10, 2021

(54) MICRO-OPTICAL ASSEMBLIES INCLUDING TRANSPARENT SUBSTRATES HAVING GRAPHIC LAYER AND METHOD OF MAKING THEREOF

(71) Applicant: 3M INNOVATIVE PROPERTIES COMPANY, St. Paul, MN (US)

(72) Inventors: Martin B. Wolk, Woodbury, MN (US); Thomas J. Metzler, St. Paul, MN (US); Samuel J. Carpenter, Shoreview, MN (US); Denis Terzic, Minnetonka, MN (US); Mitchell T. Nommensen, Oak Creek, WI (US); Suman K. Patel, Woodbury, MN (US); Mikhail L. Pekurovsky, Bloomington, MN (US); Donald G. Peterson, Shoreview, MN (US); Terry O. Collier, Woodbury, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 296 days.

(21) Appl. No.: 15/577,022

(22) PCT Filed: Jun. 14, 2016

(86) PCT No.: PCT/US2016/037360
§ 371 (c)(1),
(2) Date: Nov. 27, 2017

(87) PCT Pub. No.: WO2016/205189
PCT Pub. Date: Dec. 22, 2016

(65) Prior Publication Data
US 2018/0203168 A1     Jul. 19, 2018

Related U.S. Application Data

(60) Provisional application No. 62/182,061, filed on Jun. 19, 2015.

(51) Int. Cl.
*G02B 5/124* (2006.01)
*G02B 5/04* (2006.01)
(Continued)

(52) U.S. Cl.
CPC ............ *G02B 5/124* (2013.01); *B32B 37/025* (2013.01); *E06B 3/6604* (2013.01); *G02B 5/045* (2013.01); *H01L 51/5275* (2013.01)

(58) Field of Classification Search
CPC ........ G02B 5/124; G02B 5/045; G02B 5/025; G02B 5/0231; G02B 5/0257; G02B 5/02;
(Continued)

(56) References Cited

U.S. PATENT DOCUMENTS

| 4,472,480 A | 9/1984 | Olson |
| 4,567,073 A | 1/1986 | Larson et al. |

(Continued)

FOREIGN PATENT DOCUMENTS

| WO | WO 2005/103770 | 11/2005 |
| WO | WO 2014/081693 | 5/2014 |

(Continued)

OTHER PUBLICATIONS

Shaw, "Negative Photoresists for Optical Lithography," IBM Journal of Research and Development, Jan. 1997, vol. 41, No. 1/2, pp. 81-94.
(Continued)

*Primary Examiner* — Stephone B Allen
*Assistant Examiner* — Rahman Abdur
(74) *Attorney, Agent, or Firm* — Jonathan L. Tolstedt

(57) ABSTRACT

The present disclosure relates to micro-optical assemblies containing at least one optical element adhered to a receptor substrate, e.g. a transparent receptor substrate, the receptor substrate contains at least one graphics layer. The micro-optical assemblies include both functional micro-optical (Continued)

structures that can alter, for example, incident light, and a graphic layer, which includes at least one graphic, e.g. a graphic design, which may include color, patterns, imagery, indicia and the like. The combination of the micro-optical elements with the graphic of the graphics layer can provide unique light altering assemblies that have graphic designs that may be functional, e.g. to display a message, and/or have aesthetic value. The micro-optical assemblies of the present disclosure are useful in a variety of applications which include, but are not limited to, display and graphics applications and architectural glass applications. The present disclosure also provides a method of making the micro-optical assemblies of the present disclosure.

20 Claims, 17 Drawing Sheets

(51) Int. Cl.
E06B 3/66 (2006.01)
B32B 37/00 (2006.01)
H01L 51/52 (2006.01)

(58) Field of Classification Search
CPC ... G02B 5/0252; G02B 6/0053; E06B 3/6604; E06B 3/6715; E06B 9/24; H01L 51/5275; H01L 51/0097; B32B 37/025; B32B 3/30; B32B 7/12; B32B 15/09; B32B 3/28; F21S 11/007; C09J 7/10; C09J 7/385; B05D 3/007; C08G 59/1466
USPC ....... 359/530, 542, 546, 567, 527, 592, 597, 359/599, 613, 615, 641, 707, 742, 834, 359/851, 362
See application file for complete search history.

(56) References Cited

U.S. PATENT DOCUMENTS

| | | |
|---|---|---|
| 4,614,667 A | 9/1986 | Larson et al. |
| 4,919,994 A | 4/1990 | Incremona et al. |
| 5,691,846 A | 11/1997 | Benson, Jr. et al. |
| 5,730,823 A | 3/1998 | Donat |
| 5,977,263 A | 11/1999 | Phillips |
| 6,119,751 A * | 9/2000 | Nilsen .................... B29C 41/26 156/230 |
| 6,461,467 B2 | 10/2002 | Blatchford et al. |
| 6,726,982 B2 | 4/2004 | Christian et al. |
| 6,858,253 B2 | 2/2005 | Williams et al. |
| 7,947,376 B2 | 5/2011 | Sherman et al. |
| 8,506,095 B2 | 8/2013 | Bacon, Jr. et al. |
| 8,534,849 B2 * | 9/2013 | Coggio ................. G02B 5/124 359/530 |
| 8,538,224 B2 | 9/2013 | Lamansky et al. |
| 8,659,221 B2 | 2/2014 | Jones et al. |
| 8,765,881 B2 | 7/2014 | Hays et al. |
| 2005/0118352 A1 | 6/2005 | Suwa |
| 2005/0185279 A1* | 8/2005 | Mullen ................. G02B 5/124 359/530 |
| 2009/0015142 A1 | 1/2009 | Potts et al. |
| 2013/0034682 A1 | 2/2013 | Free et al. |
| 2014/0021492 A1 | 1/2014 | Wolk et al. |
| 2014/0066866 A1 | 3/2014 | Sever et al. |
| 2014/0175707 A1 | 6/2014 | Wolk et al. |
| 2014/0178646 A1* | 6/2014 | Wolk ..................... B32B 3/263 428/161 |
| 2014/0208624 A1 | 7/2014 | Aho |
| 2014/0242343 A1 | 8/2014 | Free et al. |

FOREIGN PATENT DOCUMENTS

| | | |
|---|---|---|
| WO | WO 2015/112711 | 7/2015 |
| WO | WO 2016/064565 | 4/2016 |
| WO | WO 2016/099600 | 6/2016 |
| WO | WO 2016/205112 | 12/2016 |
| WO | WO 2016/205115 | 12/2016 |

OTHER PUBLICATIONS

International Search Report for PCT International Application No. PCT/US2016/037360, dated Aug. 25, 2016, 5 pages.

* cited by examiner

MICRO-OPTICAL ASSEMBLIES INCLUDING TRANSPARENT SUBSTRATES HAVING GRAPHIC LAYER AND METHOD OF MAKING THEREOF

CROSS REFERENCE TO RELATED APPLICATIONS

This application is a national stage filing under 35 U.S.C. 371 of PCT/US2016/037360, filed Jun. 14, 2016, which claims the benefit of U.S. Provisional Application No. 62/182,061, filed Jun. 19, 2015, the disclosure of which is incorporated by reference in its/their entirety herein.

TECHNICAL FIELD

The present disclosure relates to micro-optical assemblies which include a receptor substrate, e.g. a transparent substrate, having at least one graphic layer and methods of making thereof.

BACKGROUND

Articles containing optical structures are described in, for example, U.S. Pat. Nos. 6,726,982; 8,534,849; and 8,506,095.

SUMMARY

The present disclosure relates to micro-optical assemblies containing at least one optical element adhered to a receptor substrate, e.g. a transparent receptor substrate, the receptor substrate contains at least one graphics layer. The micro-optical assemblies include both functional micro-optical structures that can alter, for example, incident light, and a graphic layer, which includes at least one graphic, e.g. a graphic design, which may include color, patterns, imagery, indicia and the like. The combination of the micro-optical elements with the graphic of the graphics layer can provide unique light altering assemblies that have graphic designs that may be functional, e.g. to display a message, and/or have aesthetic value. The micro-optical assemblies of the present disclosure are useful in a variety of applications which include, but are not limited to, display and graphics applications and architectural glass applications. The present disclosure also provides a method of making the micro-optical assemblies of the present disclosure.

In a first aspect, the present disclosure provides a micro-optical assembly comprising:
 a first transparent receptor substrate having a first major surface and a second major surface, wherein the first transparent substrate includes a first graphics layer, including at least one first graphic, disposed on one of the transparent substrate's first and second major surfaces; and
 at least one micro-optical element, the micro-optical element comprising:
  a backfill layer having a structured first major surface and an opposed second major surface, wherein the structured first major surface of the backfill layer includes micro-optical structures; and
  an adhesive layer having a first major surface and an opposed second major surface, wherein the second major surface of the adhesive layer is adjacent to or in contact with the opposed second major surface of the backfill layer; and wherein, the first major surface of the adhesive layer is disposed on at least one of the first major surface of the first transparent receptor substrate and the first graphics layer.

In another aspect, the present disclosure provides a method of making a micro-optical assembly comprising:
 providing a segmented transfer tape comprising:
  a removable template layer having a structured surface and an opposed second surface;
  a transfer layer, the transfer layer comprising:
   a backfill layer disposed on and conforming to at least a portion of the structured surface of the removable template layer, wherein the backfill layer has a structured first major surface adjacent the structured surface of the removable template layer and an opposed second major surface, wherein the structured first major surface of the backfill layer includes micro-optical structures; and
   an adhesive layer having a first major surface and an opposed second major surface, wherein the second major surface of the adhesive layer is adjacent to or in contact with the second major surface of the backfill layer;
  at least one transferable segment formed in the transfer layer, the at least one transferable segment includes an adhesive surface and has a shape, relative to the plane of the adhesive surface;
  at least one non-transferable segment formed in the transfer layer, the at least one non-transferable segment includes an adhesive surface, wherein a passivating layer is disposed on at least a portion of the adhesive surface of the at least one non-transferrable segment; and
  at least one kerf extending from the first major surface of the adhesive layer, through the transfer layer and into at least a portion of the removable template layer, the depth of the kerf is less than the thickness of the transfer tape and, wherein the shape of the at least one transferable segment is defined by the at least one kerf.
 providing a first transparent receptor substrate having a first major surface, wherein the first transparent receptor substrate includes a first graphics layer, including at least one first graphic, disposed on one of the transparent receptor substrate's first and second major surfaces;
 disposing the adhesive surface of the at least one transferable segment of the segmented transfer tape onto the first major surface of the first transparent receptor substrate;
 bonding the adhesive layer of the at least one transferable segment to at least one of the first major surface of the first transparent receptor substrate and the first graphics layer; and
 removing the removable template layer and the at least one non-transferable segment of the transfer tape from the first transparent receptor substrate, while the at least one transferable segment, remains bonded to the first transparent receptor substrate.

Figure 1A:
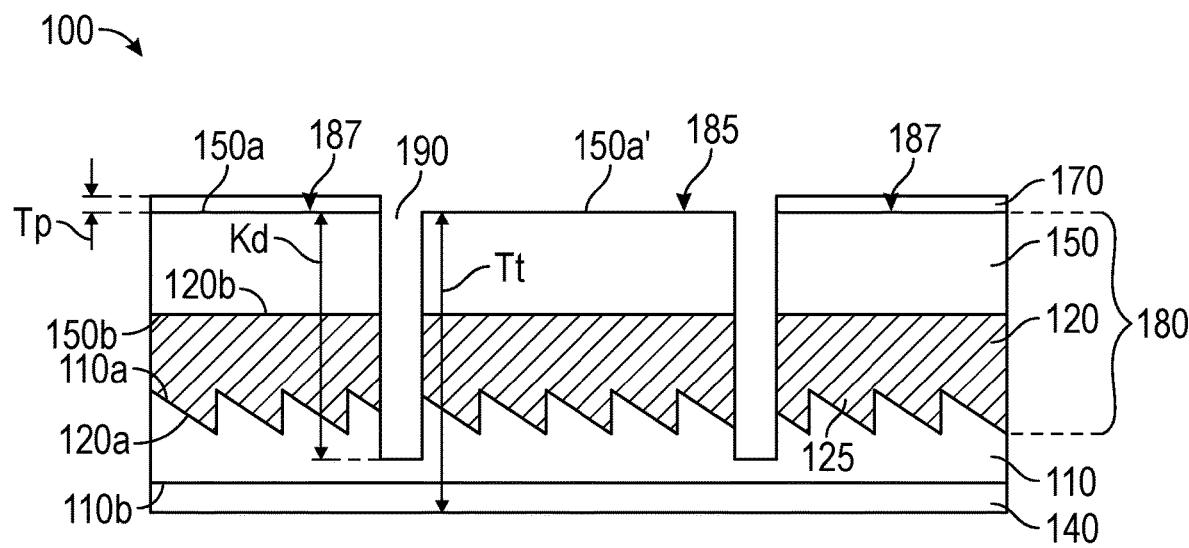
FIG. 1A is a schematic cross-sectional side view of a portion of an exemplary segmented transfer tape according to one exemplary embodiment of the present disclosure.

Repeated use of reference characters in the specification and drawings is intended to represent the same or analogous features or elements of the disclosure. The drawings may not be drawn to scale. As used herein, the word "between", as applied to numerical ranges, includes the endpoints of the ranges, unless otherwise specified. The recitation of numerical ranges by endpoints includes all numbers within that range (e.g. 1 to 5 includes 1, 1.5, 2, 2.75, 3, 3.80, 4, and 5) and any range within that range. Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

It should be understood that numerous other modifications and embodiments can be devised by those skilled in the art, which fall within the scope and spirit of the principles of the disclosure. All scientific and technical terms used herein have meanings commonly used in the art unless otherwise specified. The definitions provided herein are to facilitate understanding of certain terms used frequently herein and are not meant to limit the scope of the present disclosure. As used in this specification and the appended claims, the singular forms "a", "an", and "the" encompass embodiments having plural referents, unless the context clearly dictates otherwise. As used in this specification and the appended claims, the term "or" is generally employed in its sense including "and/or" unless the context clearly dictates otherwise.

Throughout this disclosure, if a layer or a surface of a layer is "adjacent" to a second layer or a surface of a second layer, the nearest surface of each of the two layers are considered to be facing one another. They may be in contact with one another or there may not be in contact with one another, an intervening third layer(s) or substrate(s) being between them. If a layer or a surface of a layer is "in contact" with a second layer or surface of a second layer, at least a portion of the nearest surfaces of each of the two layers are in physical contact, i.e. there is no intervening layer or substrate between them. If a layer or a surface of a layer is "disposed on" a second layer or a surface of a second layer, at least a portion of the nearest surfaces of each of the two layers are in physical contact, i.e. there is no intervening layer between them.

DETAILED DESCRIPTION

There are many applications where providing micro-optical elements to a surface of a receptor substrate can impart useful light altering properties to the substrate. For example, micro-optical elements may be used to improve light extraction from organic light emitting diodes (OLEDs) in OLED displays, alter the color distribution of OLED displays, e.g. improving wide view color of OLED displays, and/or provide daylight redirecting optics (DRO) for insulated glazing units (IGUs), see for example U.S. Pat. No. 8,659,221 and U.S. Pat. Appl. Publ. Nos. 2009/0015142, 2014/0242343, 2014/0178646 and 2014/0021492, all incorporated herein by reference in their entirety. Often in these application, the micro-optical elements may not be required nor desired over the entire receptor substrate surface and are only required to be in specific regions of the receptor substrate. For example, with respect to a daylight redirecting application in an IGU, micro-optical elements may be placed in specific areas of the IGU, in order to provide daylight redirecting properties only in these areas, while allowing light to pass unaltered through other regions of the IGU. Hence, there may be large areas of the receptor substrate surfaces that do not include micro-optical elements, but may be used for various graphical display purposes, for example, to add color, patterns, imagery, indicia and the like. The graphic may be functional, a sign providing a message, for example, or aesthetic in nature, e.g. a graphical design or pattern. Integrating the micro-optical elements with the graphics of the receptor substrate can be difficult. The cutting, placement and bonding of the micro-optical elements in the desired regions of the receptor substrate can be a time consuming and cumbersome process, especially when one or more of these process are done manually. This is particularly true if there are many small regions which require the micro-optical elements and the micro-optical elements are desired to be in a specific pattern or in registry with the graphics of the receptor substrate. Thus, there is a need for improved micro-optical materials, tailored for receptor substrates which include at least one graphics layer. Applicants have found that the use of segmented transfer tapes containing at least one micro-optical element can be used to efficiently transfer one or more micro-optical elements to a receptor substrate the receptor substrate including at least one graphic layer. The micro-optical elements can be transferred in specific alignment, i.e. registry, with the graphic of the graphic layer, thereby combining the light altering properties of the optical elements with graphic design to create unique micro-optical assemblies having light altering and graphic capabilities.

Segmented transfer tapes useful for forming the micro-optical assemblies of the present disclosure are described below. In some embodiments, the segmented transfer tape includes a removable template layer having a structured surface, a transfer layer, at least one transferable segment formed in the transfer layer, at least one non-transferable segment formed in the transfer layer and at least one kerf extending through the transfer layer and into at least a portion of the removable template layer, wherein the depth of the kerf is less than the thickness of the transfer tape. The transfer layer includes a backfill layer disposed on and conforming to at least a portion of the structured surface of the removable template layer. As the backfill layer conforms to the structured surface of the removable template layer, the backfill layer has a structured first major surface adjacent the structured surface of the removable template layer, and an opposed second major surface. The structured first major surface of the backfill layer is, generally, a negative replication of structured surface of the template layer. The structures of the backfill layer and/or removable template layer may be referred to as topographical features. The opposed second major surface of the backfill layer may be planar and may include minor surface roughness. The minor surface roughness may have an average Ra less than about 25%, less than about 10% or even less than about 5% of the average height of the topographical features of the structured first major surface of the backfill layer and/or the topographical features of the structured surface of the removable template layer. The transfer layer also includes an adhesive layer adjacent to or in contact with the second major surface of the backfill layer. The adhesive layer will have a first major surface and an opposed second major surface adjacent to or in contact with the second major surface of the backfill layer.

The at least one transferable segment comprises a portion of the transfer layer, including a portion of the corresponding adhesive layer and backfill layer. The adhesive surface of the at least one transferable segment, i.e. the portion of the first major surface of the adhesive layer associated with the at least one transferable segment, is exposed and may be used to bond the at least one transferable segment to a receptor substrate including at least one graphic layer, e.g. a glass panel of an IGU which includes at least one graphic layer, thereby forming a micro-optical assembly of the present disclosure. In some embodiments, the at least one transferable segment includes a plurality of transferable segments. In some embodiments, the at least one non-transferable segment includes a plurality of non-transferable segments. The at least one non-transferable segment also includes a portion of the transfer layer, including a portion of the corresponding adhesive layer and backfill layer. The adhesive surface of the at least one non-transferable segment includes a passivating layer disposed on at least a portion of this adhesive surface. The passivating layer prevents the adhesive surface of the at least one non-transferable segment from bonding to a receptor substrate. After bonding the at least one transferable segment to a receptor substrate, the at least one non-transferable segment will then remain with the transfer tape during removal of the residual portions of the transfer tape from the receptor substrate. The residual portions of the transfer tape may include the at least one non-transferable segment and the removable template layer. Once the residual portion is removed, the at least one transferable segment, e.g. a micro-optical element, remains adhered to the receptor substrate.

The at least one kerf may extend from the first major surface of the adhesive layer, through the transfer layer and into at least a portion of the removable template layer. The at least one transferable segment has a shape, relative to the plane of its adhesive surface. The shape of the at least one transferable segment is defined by the at least one kerf. The shape of the at least one non-transferable segment is also defined by the shape of the at least one kerf. For example, a circular shaped kerf will produce a circular shaped transferable segment. In some embodiments, the transfer tapes of the present disclosure include a plurality of kerfs. If a plurality of kerfs are present, the depth of the plurality of kerfs may be the same or may be different. The pattern of the plurality of kerfs can be used to create one or more non-transferable segments. When the segmented transfer tape is applied to the receptor substrate, the at least one non-transferable segments does not adhere and is removed from the receptor substrate, creating at least one area of the receptor substrate, without micro-optical elements. A graphic layer may be applied to this area, either prior to or after the attachment of the at least one micro-optical assembly. Several specific, but non-limiting, embodiments of segmented transfer tapes useful for forming the optical assemblies of the present disclosure are shown in FIGS. 1A-1C, 2A-2C, 3A, 3B and 4A FIG. 1A shows a schematic cross-sectional side view of a portion of an exemplary segmented transfer tape. Segmented transfer tape 100 includes a removable template layer 110 having a structured surface 110a and an opposed second surface 110b; a transfer layer 180, the transfer layer 180 includes (i) a backfill layer 120 disposed on and conforming to at least a portion of structured surface 110a of removable template layer 110, wherein backfill layer 120 has a structured first major surface 120a with topographical features 125 adjacent the structured surface 110a of removable template layer 110 and an opposed second major surface 120b; and (ii) an adhesive layer 150 having a first major surface 150a and an opposed second major surface 150b, wherein second major surface 150b of adhesive layer 150 is adjacent to or in contact with second major surface 120b of backfill layer 120. The transfer tape further includes at least one transferable segment 185 formed in the transfer layer 180, the at least one transferable segment 185 includes an adhesive surface 150a' and has a shape, relative to the plane of the adhesive surface 150a'; at least one non-transferable segment 187 formed in the transfer layer, the at least one non-transferable segment 187 includes an adhesive surface 150a", wherein a passivating layer 170 is disposed on at least a portion of adhesive surface 150a" of the at least one non-transferrable segment 187; and at least one kerf 190 extending from first major surface 150a of the adhesive layer 150, through the transfer layer 180 and into at least a portion of the removable template layer 110, the depth of the kerf, Kd, is less than the thickness of the transfer tape, Tt, and, wherein the shape of the at least one transferable segment 185 is defined by the at least one kerf 190. The length and width dimensions of the segmented transfer tape are not particularly limited. The length and width dimensions of the at least one transferable segment is not particularly limited, except by the length and width dimensions of the segmented transfer tape. The length and width dimensions of the micro-optical elements are, therefore, also not particularly limited, except by the length and width dimensions of the segmented transfer tape. The passivating layer 170 has a thickness, Tp. The length and width dimensions of the passivating layer are not particularly limited, except by the length and width dimensions of the transfer tape.

In some embodiments, the transfer tape may include an optional carrier film 140 adjacent to or in contact with the second surface 110b of the removable template layer 110. If optional carrier film 140 is used, kerf 190 may extend into the carrier film 140, as shown in FIG. 1C. However, even if optional carrier film is used, kerf 190 may extend only into a portion of the removable template layer 110 and not into optional carrier film 140. If optional carrier film 140 is not used, the at least one kerf 190 extends from first major surface 150a of the adhesive layer 150, through the transfer layer 180 and into at least a portion of the removable template layer 110, as previously described. In some embodiments, the structured surface 110a of removable template layer 110 may also include an optional release layer 130 (not shown). Optional release layer 130 of removable template layer 110 may be a coating disposed on and conforming to the structured surface 110a of removable template layer 110. Release layer 130 of removable template layer 110 may facilitate the removal of removable template layer 110 from backfill layer 120.

Figure 1B:
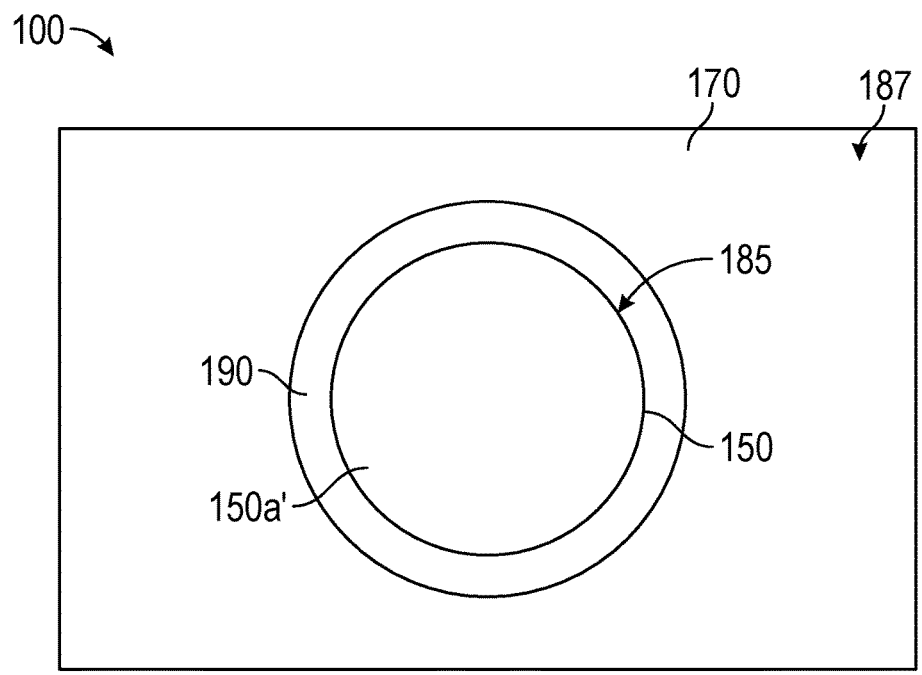
FIG. 1B is a schematic top view of a portion of the exemplary segmented transfer tape of FIG. 1A according to one exemplary embodiment of the present disclosure.
Figure 1C:
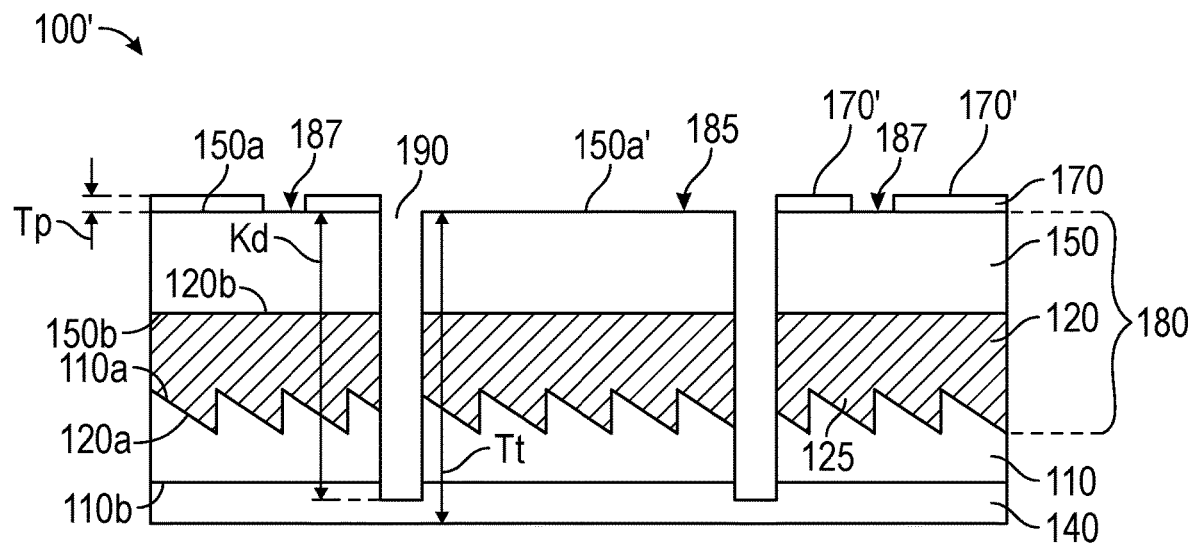
FIG. 1C is a schematic cross-sectional side view of a portion of an exemplary segmented transfer tape according to one exemplary embodiment of the present disclosure.

FIG. 1B shows schematic top view of a portion of the exemplary segmented transfer tape of FIG. 1A. Transfer tape 100 includes at least one transferable segment 185, at least one non-transferable segment 187, at least one kerf 190, adhesive surface 150a' of the at least one transferable adhesive segment 185 and passivating layer 170. In use, the adhesive surface 150a' of the at least one transferable segment 185 will be disposed onto a surface of a substrate. Adhesive layer 150 of the at least one transferable segment 185 will be bonded to surface of the substrate via adhesive surface 150a'. Removable template layer 110, the at least one non-transferable segment, 187 and the optional carrier film 140, if present, will then be removed from the substrate, while the at least one transferable segment 185 remains bonded to the substrate, thereby transferring only the at least one transferable segment 185 of the segmented transfer tape 100 to the surface of the substrate. As depicted in FIGS. 1A and 1B, passivating layer 170 is a continuous layer over adhesive surface 150a" of the at least one non-transferable segment 187. In some embodiments, the passivating layer 170 is a continuous layer. In some embodiments, the passivating layer 170 is a continuous layer and covers the entire surface of adhesive surface 150a" of the at least one non-transferable segment 187. However, it is not a requirement that passivating layer 170 is a continuous layer and it is not a requirement that passivating layer 170 covers the entire surface of adhesive surface 150a" of the at least one non-transferable segment 187.

Figure 1D:
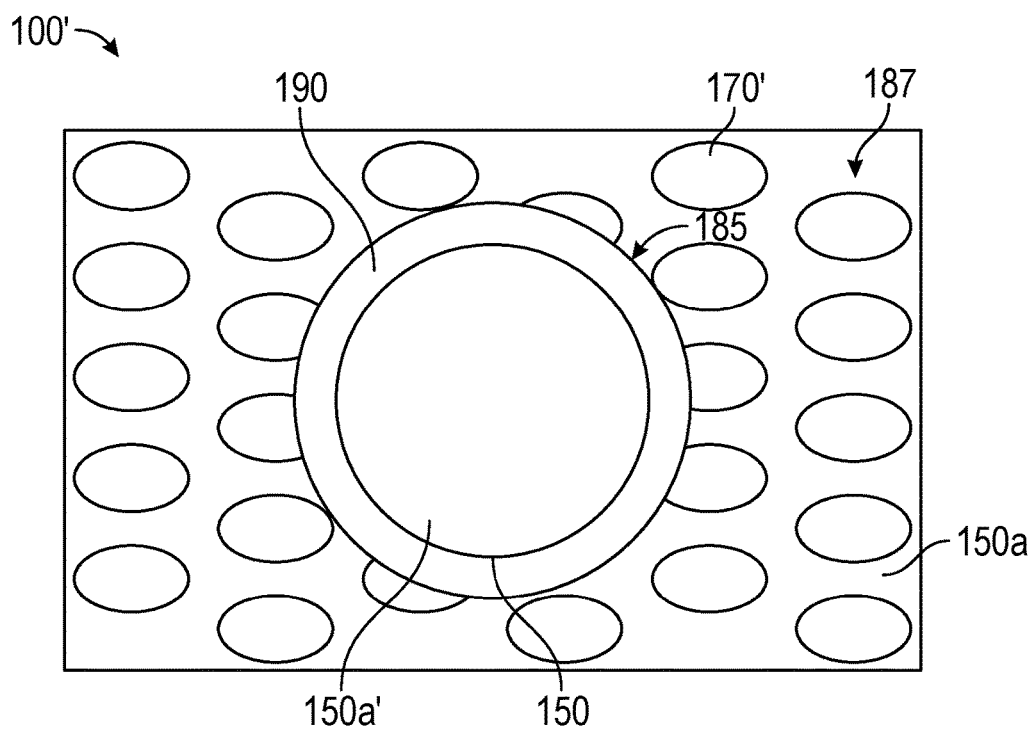
FIG. 1D is a schematic top view of a portion of the exemplary segmented transfer tape of FIG. 1C according to one exemplary embodiment of the present disclosure.

FIGS. 1C and 1D show a schematic cross-sectional side view and a schematic top view, respectively, of a portion of an exemplary segmented transfer tape 100'. Transfer tape 100' is similar to transfer tape 100 of FIGS. 1A and 1B and like elements in the figures employ the same element numbers. Transfer tape 100' differs from transfer tape 100 in that the passivating layer 170 is a non-continuous layer, including a plurality of discrete islands 170' over a portion of adhesive surface 150a" of the at least one non-transferable segment 187. FIG. 1D shows transfer tape 100', including at least one transferable segment 185, at least one non-transferable segment 187, at least one kerf 190, adhesive surface 150a' of the at least one transferable adhesive segment 185 and passivating layer 170. Passivating layer 170 includes a plurality of discrete island 170' over a portion of adhesive surface 150a" of the at least one non-transferable segment 187. Between the discrete islands 170', portions of the adhesive surface 150a" of the at least one non-transferable segment 187 are observed. The number, size, shape and areal coverage of the discrete islands 170' of passivating layer 170 on adhesive surface 150a" of the at least one non-transferable segment 187 are not particularly limited, so long as the passivating layer 170 is able to prevent the at least one non-transferable segment 187 from transferring to the substrate to which the at least one transferable segment will be bonded to during use. In some embodiments, the passivating layer covers from about 30% to about 100%, from about 40% to about 100%, from about 50% to about 100%, from about 60% to about 100%, from about 70% to about 100%, from about 30% to about 90%, from about 40% to about 90%, from about 50% to about 90%, from about 60% to about 90%, from about 70% to about 90%, from about 30% to about 80%, from about 40% to about 80%, from about 50% to about 80%, from about 60% to about 80%, or even from about 70% to about 80%, of the adhesive surface of the at least one non-transferable segment.

In some embodiments, the passivating layer 170, aligns, i.e. is in registry, with the surface area of the non-transferable segment (the surface area of adhesive surface 150a"), and the at least one transferable segment 185 does not include passivating layer over a portion of its surface (the surface area of adhesive surface 150a'). See for example FIG. 1A and FIG. 1B in which the passivating layer 170 covers the entire surface of adhesive surface 150a" of the at least one non-transferable segment 187 and the adhesive surface 150a' of the at least one transferable segment 185 is free of passivating layer 170. As the at least one kerf defines the shape of the at least one transferable segment and the at least one non-transferable segment of the transfer tape and, subsequently, the areas of their respective surfaces, alignment of the passivating layer with the surface area of the non-transferable segment may correspond to alignment of the passivating layer with the at least one kerf.

Figure 2A:
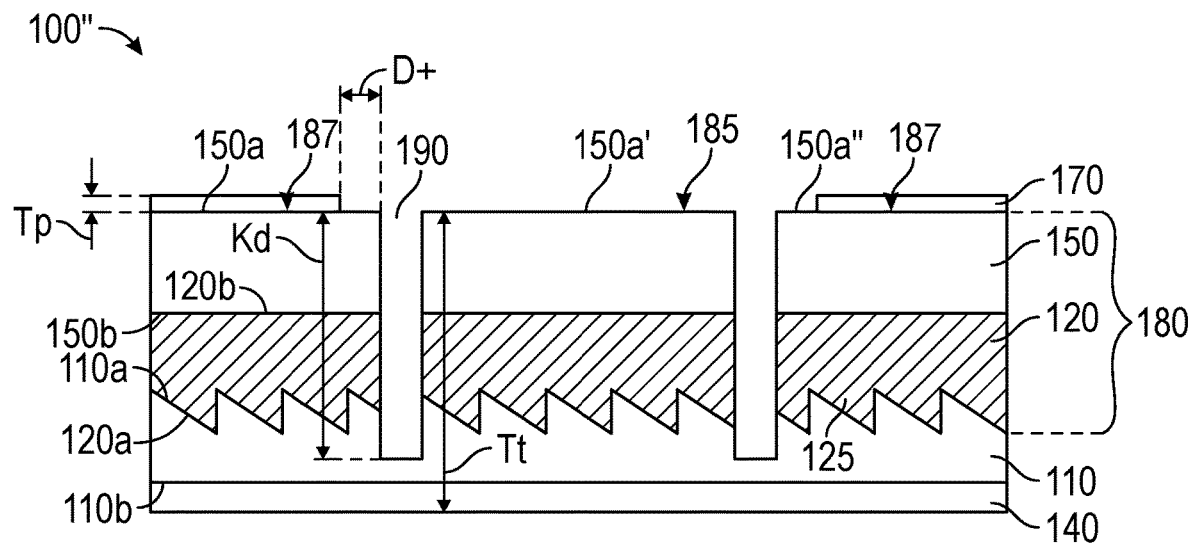
FIG. 2A is a schematic cross-sectional side view of a portion of an exemplary segmented transfer tape according to one exemplary embodiment of the present disclosure.
Figure 2B:
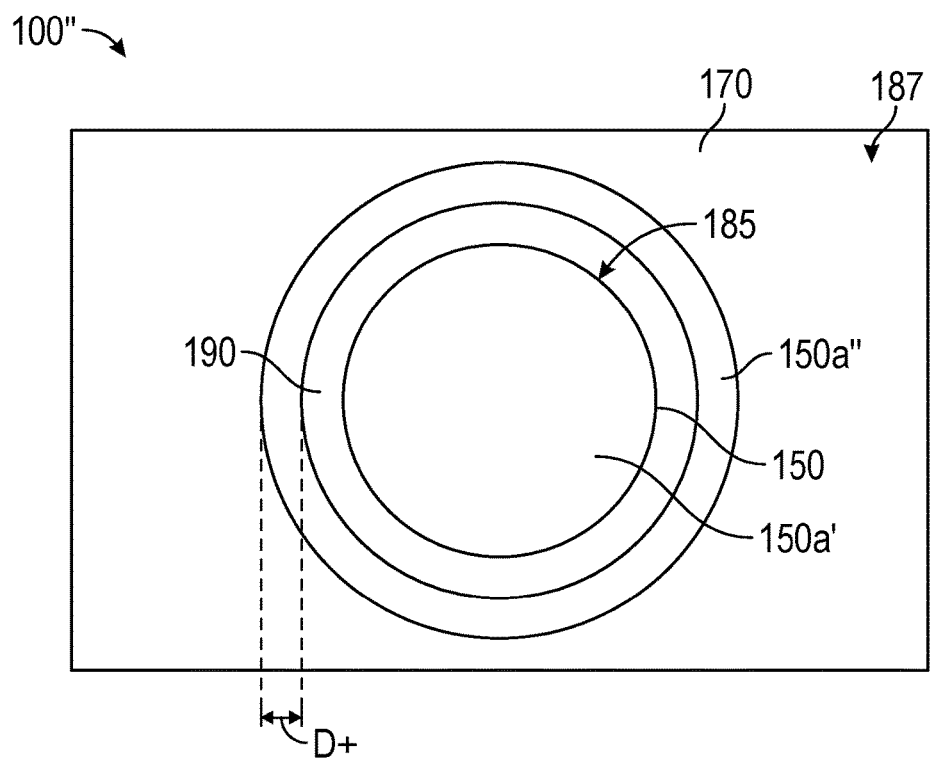
FIG. 2B is a schematic top view of a portion of the exemplary segmented transfer tape of FIG. 2A according to one exemplary embodiment of the present disclosure.
Figure 2C:
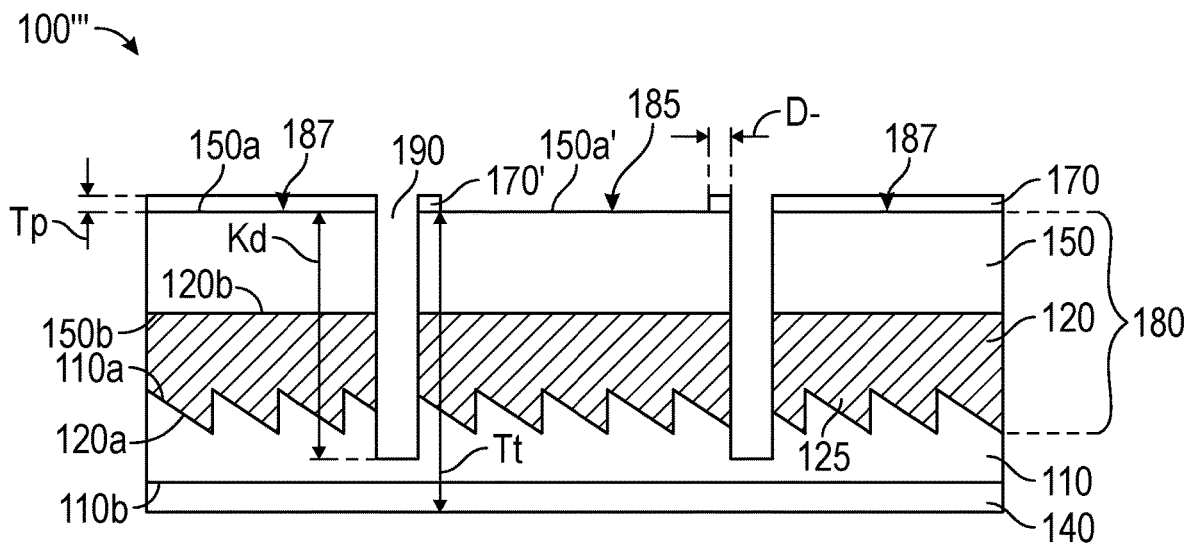
FIG. 2C is a schematic cross-sectional side view of a portion of an exemplary segmented transfer tape according to one exemplary embodiment of the present disclosure.
Figure 2D:
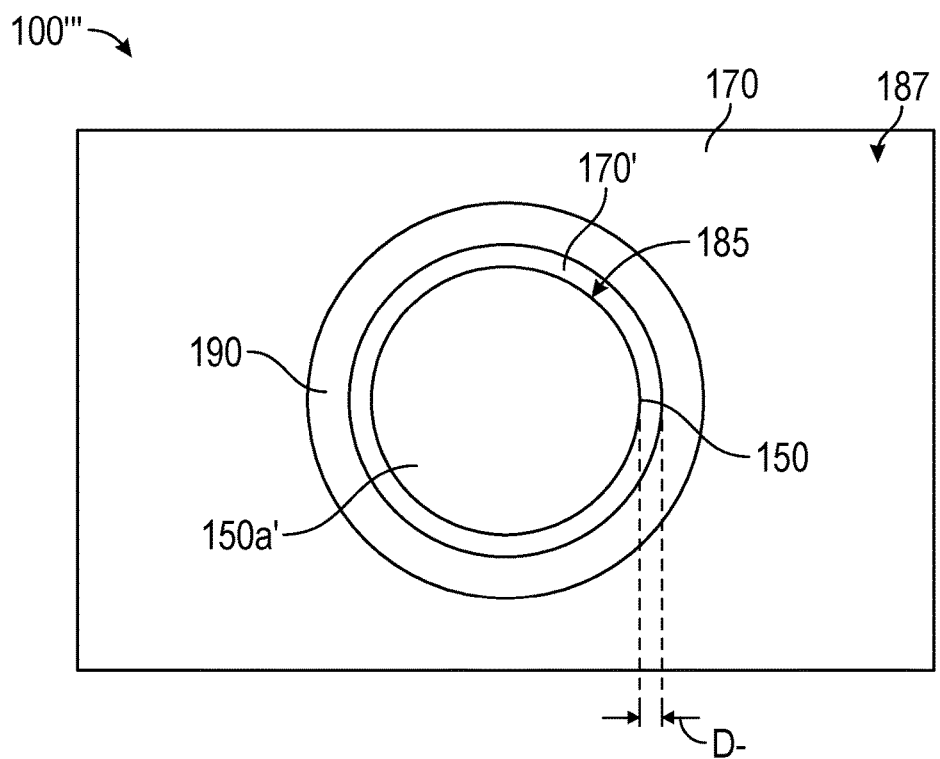
FIG. 2D is a schematic top view of a portion of the exemplary segmented transfer tape of FIG. 2C according to one exemplary embodiment of the present disclosure.

In other embodiments, the passivating layer may be offset from the surface of the at least one non-transferable segment. FIGS. 2A and 2B show a schematic cross-sectional side view and a schematic top view, respectively, of a portion of an exemplary segmented transfer tape 100". Transfer tape 100" is similar to transfer tape 100 and like elements in the figures employ the same element numbers. Transfer tape 100" differs from transfer tape 100 in that the passivating layer 170 is offset from the edge of the at least one non-transferable segment 187, i.e. where the kerf defines the edge of the at least one non-transferable segment. The offset distance is defined as D+. When the offset of passivating layer 170 exposes a portion of the adhesive surface 150a" of the at least one non-transferable segment 187, it will be referred to as a positive offset. FIGS. 2C and 2D show a schematic cross-sectional side view and a schematic top view, respectively, of a portion of an exemplary segmented transfer tape 100'''. Transfer tape 100''' is similar to transfer tape 100 and like elements in the figures employ the same element numbers. Transfer tape 100''' differs from transfer tape 100 in that the passivating layer 170 is offset from the edge of at least one transferable segment 185, i.e. where the kerf defines the edge of the at least one transferable segment, leading to a small portion of perimeter surface (a portion of the perimeter of surface 150a') of the at least one transferable segment to have passivating layer 170 disposed thereon. The offset distance is defined as D−. When the offset causes a portion of the adhesive surface 150a' of the at least one transferable segment 185 to be covered by passivating layer 170, it will be referred to as a negative offset.

Having an offset, either positive or negative, may occur randomly during the fabrication of the transfer tapes of the present disclosure or the offset may be designed into the fabrication process. The offset enables some leeway with respect to the tolerances involved in aligning the passivating layer 170 with the surface of the at least one non-transferable segment 187 and may lead to improved transfer tape yields during fabrication with no detrimental effect on the transferability of the at least one transferable segment and/or the non-transferability of the at least one non-transferable segment. With reference to FIGS. 2A and 2B, the surface area of adhesive surface 150a" exposed by a positive offset is not particularly limited, as long as the passivating layer 170 continues to enable the at least one non-transferable segment 187 from transferring to the substrate to which the at least one transferable segment will be bonded to during use. With reference to FIGS. 2C and 2D, the surface area of adhesive surface 150a' covered by passivating layer 170 having a negative offset is not particularly limited, as long as the area of adhesive surface 150a' covered by passivating layer 170 does not prevent the at least one transferable segment 187 from transferring to the substrate to which it is to be bonded to during use. In some embodiments, the passivating layer covers from less than about 30% to about 0%, from less than about 20% to about 0%, from less than about 10% to about 0%, from less than about 5% to about 0%, or even from less than about 2% to about 0% of the adhesive surface of the at least one transferable segment. In some embodiments the adhesive surface of the at least one transferable segment is free of passivating layer.

In some embodiments, the passivating layer has a positive offset. This may improve the ability of the adhesive surface of the transferable segment to make better contact with the receptor substrate. Similarly, a passivating layer thickness, Tp, that is lower or is thin relative to the thickness of the transfer tape, Tt, may also improve the ability of the adhesive surface of the transferable segment to make better contact with the receptor substrate. Two parameters that may relate to improved transferability of the transferable segment during bonding are the positive passivation parameter, P+, and negative passivating parameter, P−, which are the ratio of the passivation layer thickness to the offset, $P+=Tp/D+$ and $P-=Tp/D-$. In some embodiments, the passivation parameter, P+ and/or P−, may be less than about 0.5 and greater than about 0.001, less than about 0.3 and greater than about 0.001, less than about 0.2 and greater than about 0.001, less than about 0.1 and greater than about 0.001, less than about 0.3 and greater than about 0.01, less than about 0.2 and greater than about 0.01 or even less than about 0.1 and greater than about 0.01. In some embodiments, the thickness of the passivating layer is from about 0.5 microns to about 50 microns, from about 0.5 microns to about 25 microns, from about 0.5 microns to about 10 microns or even from about 0.5 microns to about 5 microns. It should be noted that a transfer tape may have both a positive and negative offset, as the offset could be positive in one area of the surface of the at least one non-transferable segment and negative in another area of the surface of the at least one non-transferable segment or one or more non-transferable segments could have a positive offset and one or more other non-transferable segments of the same transfer tape could have a negative offset. In some embodiments, the passivating layer exhibits only a positive offset. In some embodiments, the passivating layer exhibits only a negative offset. In some embodiments, the passivating layer exhibits both a positive and a negative offset. In some embodiments, the passivating layer exhibits no offset.

The at least one transferable segment of segmented transfer tapes of the present disclosure may include a plurality of transferable segments. The number, size, shape and areal density of transferable segments of the plurality of transferable segments is not particularly limited. In some embodiments, the plurality of transferable segments is in a pattern. With respect to FIG. 3A, transfer tape 101 includes a plurality of transferable segments 185, defined by a plurality of kerfs 190, adhesive surfaces 150a' of transferable segments 185, a non-transferable segment 187 and passivating layer 170. The plurality of transferable segments are in a pattern 188. Pattern 188 shows a gradient pattern that has a decrease in areal density of the plurality of transferable segments 185 moving away from an edge of transfer tape. The patterns of the transfer tapes of the present disclosure are not particular limited and may be selected based on aesthetic or functional reasons with respect to the end use application. For example, the pattern shown in FIG. 3A may be particularly useful, if the structured first major surface of the backfill layer of the transfer tape has micro-optical elements that are daylight redirecting micro-optical elements, i.e. light refracting optics, and the transfer tape will be used to transfer these micro-optical elements, in the indicated pattern, to a glass panel used in an IGU.

In the fabrication of multi-layer films which contain some type of pattern in at least two layers, and the pattern of a first layer is required to be aligned or in registry with the pattern of the second layer of the multi-layer films, one or more fiducial markers are often used to facilitate the alignment process. The fiducial markers may be contained in each layer of the film, in order to align the next layer to the previous layer. A fiducial marker is, generally, a purposely placed, identifiable mark or pattern included in one layer of a multi-layer substrate that is used to facilitate the alignment and placement of one or more subsequent layers of the substrate. If the layers of the film or substrate are transparent, a fiducial marker in one layer may be used to align more than one subsequent layer. In some multi-layer film constructions, a master set of fiducial markers are used in the first layer requiring fiducial markers and the fiducial markers of subsequent layers are fabricated relative to the master set offiducial markers. Throughout this disclosure, the term "registry" means that there is a defined positional relationship between the element, elements or their corresponding pattern of a first set of elements with respect to the element, elements or their corresponding pattern of a second set of elements, e.g. the element(s) of a first set of elements are aligned in a specific positional manner relative to the element(s) or pattern of the element(s) of a second set of elements.

Depending on the fabrication process used to manufacture the transfer films of the present disclosure, it may be challenging to align the passivating layer with the at least one kerf (that defines the at least one non-transferable segment and the at least one transferable segment), if the kerfs are fabricated prior to disposing the passivating layer, or to align the at least one kerf with the passivating layer of the at least one non-transferable segment, if the passivating layer is disposed prior to fabrication of the at least one kerfs. This is particularly true as the number of transferable segments increases and the pattern of the transferable segments becomes more complex in a transfer tape. In order to improve the alignment between the at least one kerf, i.e. the area defined by the at least one kerf, and the passivating layer, i.e. the area of the at least one non-transferable segment that the passivating layer is disposed on, one or more fiducial markers may be used. In some embodiments, the transfer tapes of the present disclosure include at least one fiducial marker in at least one of the carrier film, if present, removable template layer, backfill layer, adhesive layer and passivating layer. The number, size, shape and areal density of the at least one fiducial marker is not particularly limited, as long as the at least one kerf fiducial marker does not inhibit the transferable and non-transferable segments from functioning as designed. The number of fiducial markers in the transfer tapes of the present disclosure in not particularly limited and may include at least one, at least two at least three or even at least four fiducial markers. The number of fiducial markers in a layer of the transfer tapes of the present disclosure in not particularly limited and may include at least one, at least two at least three or even at least four fiducial markers. In some embodiments, the segmented transfer tapes of the present disclosure may include a plurality of fiducial markers. The fiducial markers may be printed or cut, e.g. a fiducial kerf marker, on or in at least one of the carrier film, if present, removable template layer, backfill layer, adhesive layer and passivating layer.

Figure 3A:
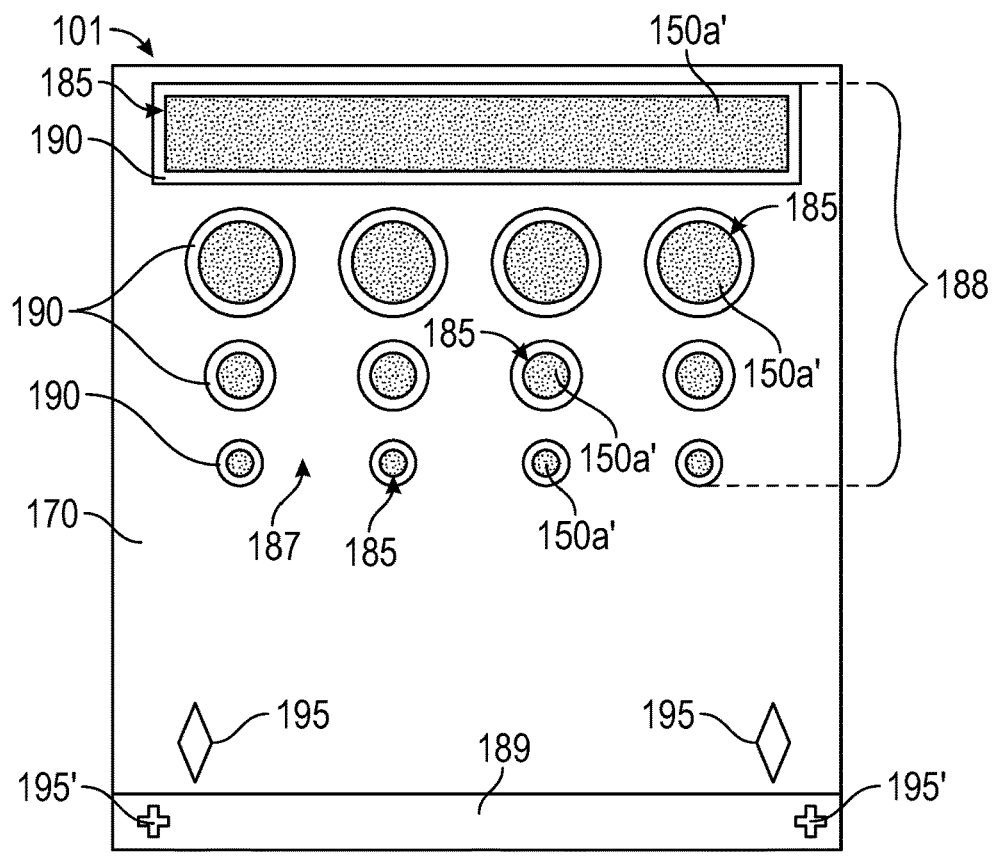
FIG. 3A is a schematic top view of an exemplary segmented transfer tape according to one exemplary embodiment of the present disclosure.

Referring to FIG. 3A, the transfer tape 101, includes fiducial markers 195. Fiducial markers 195 are fiducial kerf markers that have been formed in transfer tape 101 during its fabrication to facilitate the alignment of the passivating layer 170, so that it is disposed on the surface of the transfer tape that corresponds, generally, to the at least one non-transferable segment. In FIG. 3A, fiducial kerf markers 195 are shown as a distinct diamond shape, which have been cut into the transfer layer of the non-transferable segment 187 of transfer tape 101. In some embodiments, the fiducial kerf markers are cut into the at least one non-transferable segment of the segmented transfer tape. The same methods used to fabricate the kerfs 190 may be used to fabricate fiducial kerf markers 195

In some embodiments, the transfer tape may have a border region, 189 (FIG. 3A). The border region is free of at least the adhesive layer of the segmented transfer tape and therefore is a non-transferable region of the segmented transfer film. In addition to being free of the adhesive layer, the border region may be free of one or more of passivating layer, backfill layer and removable template layer. If the border region is free of the removable template layer, then the transfer tape requires a carrier. The border region of FIG. 3A, is shown to be at the lower edge of transfer film 101. However, the location of the border region is not particularly limited and may be in any region of the segmented transfer tape. In a particular embodiment, the border region is not include within the at least one transferable segment of the segmented transfer tape, i.e. the border region is outside the adhesive surface 150a' of the at least one transferable segment 185 and the border region may be included as part of the at least one non-transferable segment. In some embodiments, the border region may contain one or more fiducial markers. In some embodiments, the border region may contain a plurality of fiducial markers. In addition to fiducial kerf markers 195, FIG. 3A shows fiducial kerf markers 195' in border region 189. In FIG. 3A, fiducial kerf markers 195', are shown as a distinct cross shape, which have been cut into the border region 189 of transfer tape 101. In some embodiments, the fiducial kerf markers are cut into the border region of the segmented transfer tape. In some embodiments, the segmented transfer tapes of the present disclosure may include at least one fiducial kerf marker. In some embodiments, the segmented transfer tapes of the present disclosure may include a plurality of fiducial kerf markers. The number, size, shape and areal density of the at least one kerf fiducial marker is not particularly limited, as long as the at least one kerf fiducial marker does not inhibit the transferable and non-transferable segments from functioning as designed.

Figure 3B:
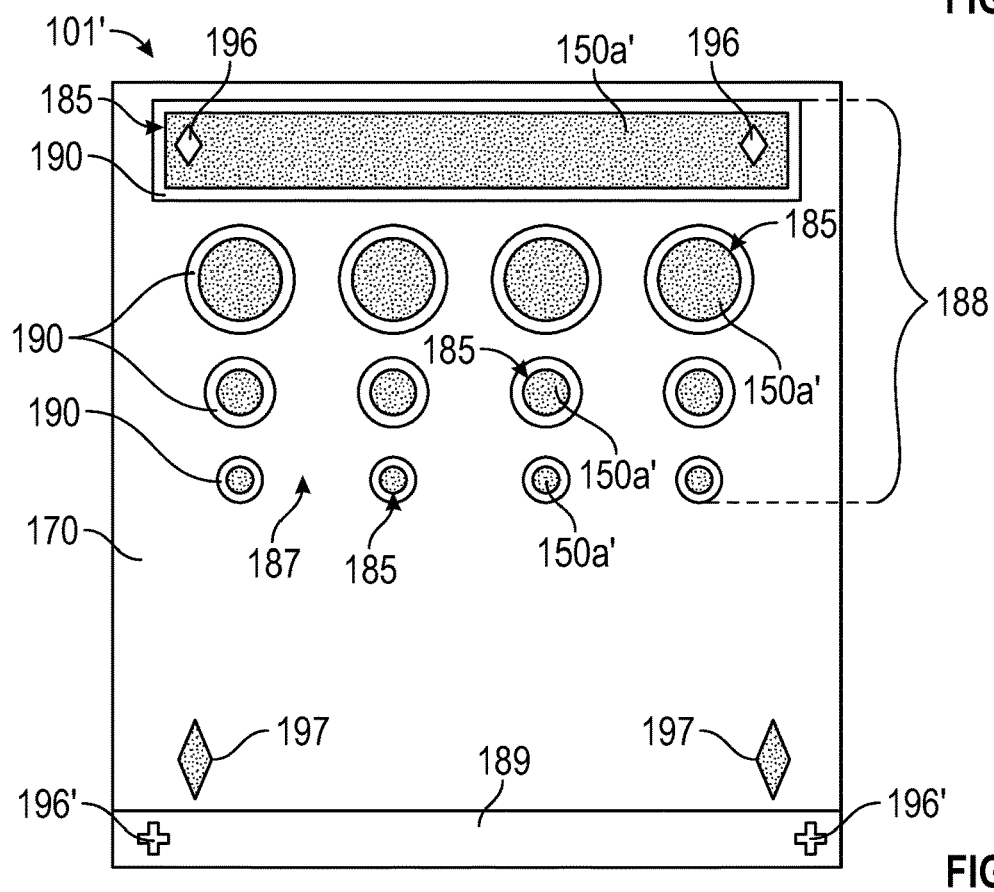
FIG. 3B is a schematic top view of an exemplary segmented transfer tape according to one exemplary embodiment of the present disclosure.

Referring to FIG. 3B, the transfer tape 101' is similar to transfer tape 101 and like elements in the figures employ the same element numbers. Transfer tape 101' differs from transfer tape 101 in that it does not contain fiducial kerf markers, 195. Instead, transfer tape 101' includes passivating layer fiducial markers 196 and 197. Passivating layer fiducial markers may include one or more positive passivating layer fiducial markers, 196, which are passivating fiducial markers fabricated from passivating layer disposed in a region of the transferable segment. They are called "positive" to indicate that additional passivating layer has been added to a region of the transfer tape that would typically exclude passivating layer, i.e. the at least one transferable segment. Passivating layer fiducial markers may include one or more negative passivating layer fiducial markers, 197. They are called "negative" to indicate that passivating layer has been removed from a region of the transfer tape that would typically include passivating layer, i.e. the at least one non-transferable segment. FIG. 3B also shows border region 189 containing positive passivating fiducial markers 196' within the border region. In some embodiments, the segmented transfer tapes of the present disclosure may include at least one passivating layer fiducial markers. In some embodiments, the segmented transfer tapes of the present disclosure may include a plurality of passivating layer fiducial markers. In some embodiments, the at least one passivating layer fiducial marker is a positive passivating layer fiducial marker. In some embodiments, the at least one passivating layer fiducial marker is a negative passivating layer fiducial markers. In some embodiments, the plurality of passivating layer fiducial markers are both positive and negative passivating layer fiducial markers The number, size, shape and areal density of the at least one passivating layer fiducial marker is not particularly limited, as long as the at least one passivating layer fiducial marker does not inhibit the transferable and non-transferable segments from functioning as designed.

The fiducial markers of the segmented transfer tapes of the present disclosure may be print fiducial markers. Print fiducial markers are fiducial markers that are printed on the surface of at least one of the carrier film, if present, removable template layer, backfill layer, adhesive layer and passivating layer of the transfer films of the present disclosure. The number, size, shape and areal density of the at least one print fiducial marker is not particularly limited, as long as the at least one print fiducial marker does not inhibit the transferable and non-transferable segments from functioning as designed. Known techniques, e.g. ink jet printing and materials, e.g. inks, can be used to fabricate the print fiducial markers in the desired shape and pattern on the transfer films of the present disclosure. In some embodiments, the segmented transfer tapes of the present disclosure may include at least one print fiducial marker. In some embodiments, the segmented transfer tapes of the present disclosure may include a plurality of print fiducial markers.

In some embodiments, at least one fiducial marker is located in the border region of the segmented transfer tape, the fiducial marker may be at least one of a kerf fiducial marker, a positive passivating layer fiducial marker, a negative passivating layer fiducial marker and a print fiducial marker. In some embodiments, a plurality of fiducial markers are located in the border region of the segmented transfer tape, the plurality of fiducial markers may be at least one of a kerf fiducial marker, a positive passivating layer fiducial marker, a negative passivating layer fiducial marker and a print fiducial marker. In some embodiments, at least one fiducial marker is located in the non-transferable segment of the segmented transfer tape, the fiducial marker may be at least one of a kerf fiducial marker, a positive passivating layer fiducial marker, a negative passivating layer fiducial marker and a print fiducial marker. In some embodiments, a plurality of fiducial markers are located in the non-transferable segment of the segmented transfer tape, the plurality of fiducial markers may be at least one of a kerf fiducial marker, a positive passivating layer fiducial marker, a negative passivating layer fiducial marker and a print fiducial marker. In some embodiments, at least one fiducial marker is located in the transferable segment of the segmented transfer tape, the fiducial marker may be at least one of a kerf fiducial marker, a positive passivating layer fiducial marker, a negative passivating layer fiducial marker and a print fiducial marker. In some embodiments, a plurality of fiducial markers are located in the transferable segment of the segmented transfer tape, the plurality of fiducial markers may be at least one of a kerf fiducial marker, a positive passivating layer fiducial marker, a negative passivating layer fiducial marker and a print fiducial marker.

Fiducial markers, e.g. print fiducial markers, may also be used on the receptor substrates or second substrates of the micro-optical assemblies of the present disclosure to facilitate alignment of the at least one transferable segments, e.g. at least one micro-optical element, to the surface of the receptor substrate and/or second substrate.

Figure 4A:
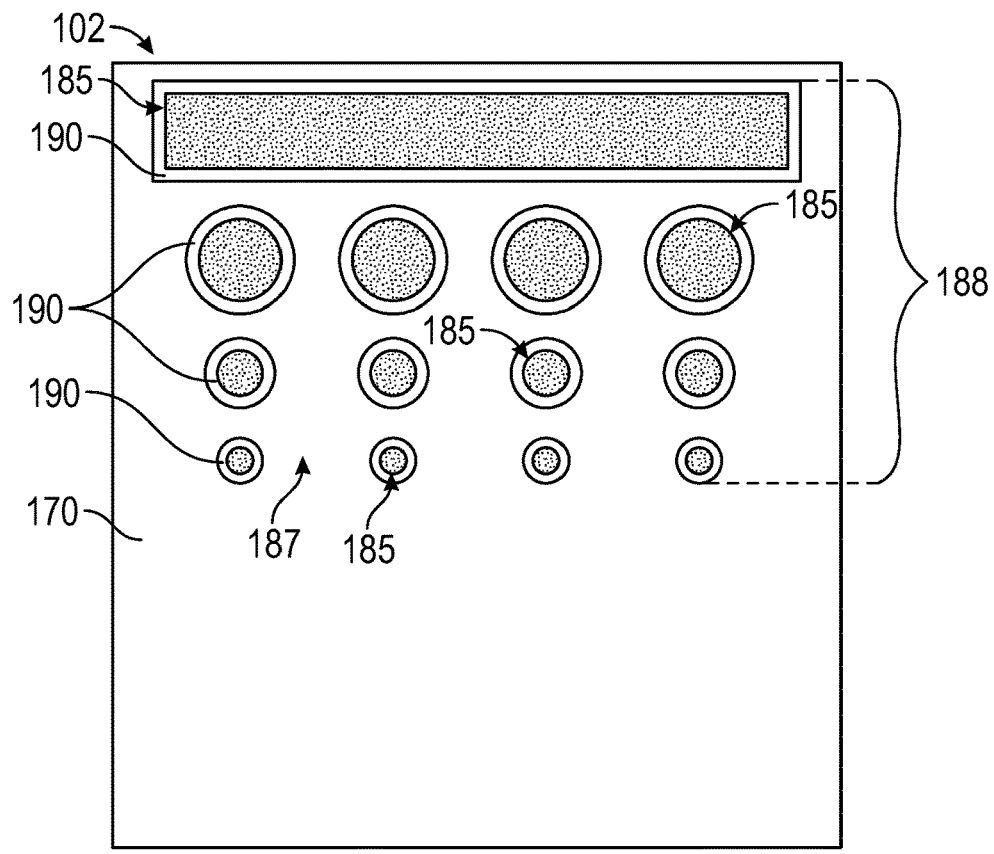
FIG. 4A is a schematic top view of an exemplary segmented transfer tape according to one exemplary embodiment of the present disclosure.
Figure 4B:
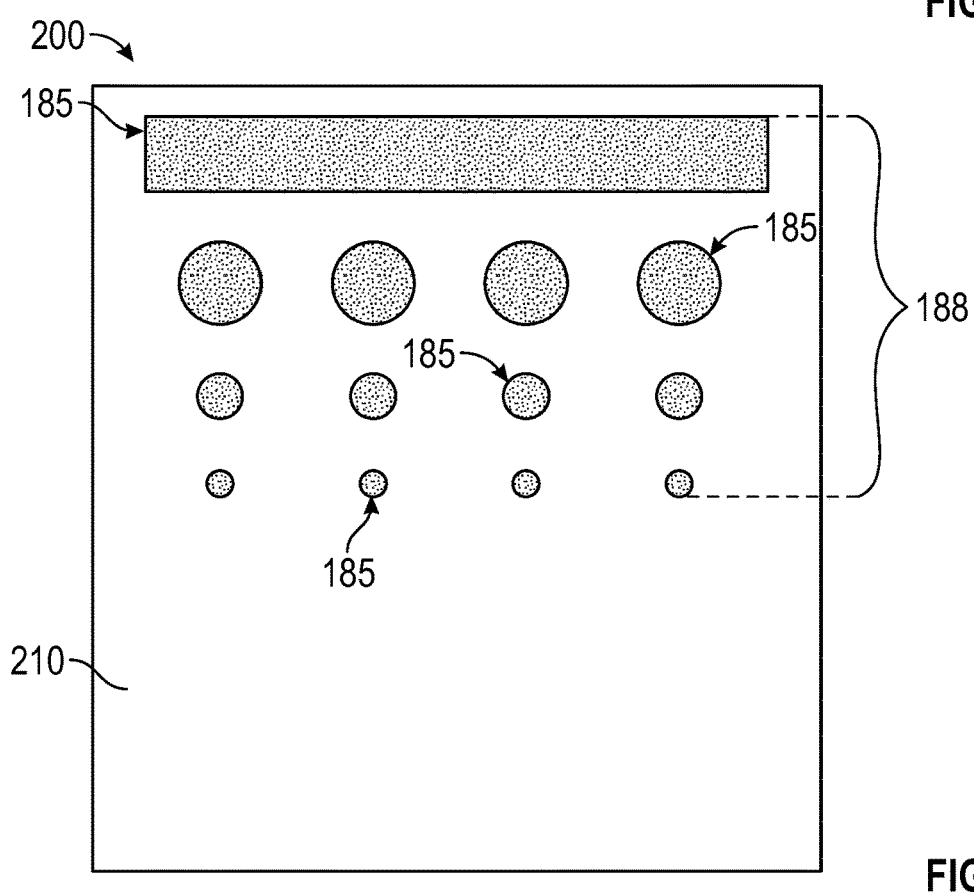
FIG. 4B is a schematic top view of an exemplary micro-optical assembly according to one exemplary embodiment of the present disclosure.

The segmented transfer films of the present disclosure have great utility in precisely transferring the at least one transferable segment to a receptor substrate. FIG. 4A shows transfer film 102 which includes a plurality of transferable segments 185, defined by a plurality of kerfs 190, a non-transferable segment 187, also defined by the plurality of kerfs 190, and passivating layer 170. The plurality of transferable segments are in a pattern 188. Pattern 188 shows a gradient pattern that has a decrease in areal density of the plurality of transferable segments 185 moving away from an edge of transfer tape. FIG. 4B shows the result of a transfer process using the transfer tape 102. FIG. 4B depicts an assembly 200 including receptor substrate 210 and transferable segments 185 that have been transferred to receptor substrate 210 in the identical pattern 188. The non-transferable segment 187 has been cleanly removed from transfer tape 102 so that little or no residual portions of non-transferable segment 187 remain on receptor substrate 210.

Removable Template Layer

The removable template layer of the transfer tapes of the present disclosure, e.g. removable template layer 110 can be formed through embossing, replication processes, extrusion, casting, or surface structuring, for example. It is to be understood that the removable template layer can have a structured surface, e.g. 110a, that may include nanostructures, microstructures, or hierarchical structures. In some embodiments, the removable template layer can be compatible with patterning, actinic patterning, embossing, extruding, and coextruding.

Typically, the removable template layer includes a photocurable material that can have a low viscosity during the replication process and then can be quickly cured to form a permanent crosslinked polymeric network "locking in" the replicated nanostructures, microstructures or hierarchical structures. Any photocurable resins known to those of ordinary skill in the art of photopolymerization can be used for the removable template layer. The resin used for the removable template layer may be capable, when crosslinked, of releasing from the backfill layer, e.g. backfill layer 120, during the use of the disclosed segmented transfer tapes, or should be compatible with application of its optional release layer, e.g. optional release layer 130, and the process for applying the optional layer.

Polymers that can be used as the removable template layer also include the following: styrene acrylonitrile copolymers;

styrene(meth)acrylate copolymers; polymethylmethacrylate; polycarbonate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; cyclic olefin polymers; and copolymers of acrylonitrile, butadiene, and styrene. One preferable polymer is the Lustran SAN Sparkle material available from Ineos ABS (USA) Corporation. Polymers for radiation cured removable template layers include cross linked acrylates such as multifunctional acrylates or epoxies and acrylated urethanes blended with mono- and multifunctional monomers.

Patterned, structured removable template layers can be formed by depositing a layer of a radiation curable composition onto one surface of a radiation transmissive support to provide a layer having an exposed surface, contacting a master with a preformed surface bearing a pattern capable of imparting a three-dimensional microstructure of precisely shaped and located interactive functional discontinuities including distal surface portions and adjacent depressed surface portions into the exposed surface of the layer of radiation curable composition on said support under sufficient contact pressure to impart said pattern into said layer, exposing said curable composition to a sufficient level of radiation through the support and/or master to cure said composition while the layer of radiation curable composition is in contact with the patterned surface of the master. This cast and cure process can be done in a continuous manner using a roll of support, depositing a layer of curable material onto the support, laminating the curable material against a master and curing the curable material using actinic radiation. The resulting roll of support with a patterned, structured template disposed thereon can then be rolled up. This method is disclosed, for example, in U.S. Pat. No. 6,858,253 (Williams et al.).

For extrusion or embossed removable template layers, the materials making up the template layer can be selected depending on the particular topography of the top structured surface that is to be imparted. In general, the materials are selected such that the structure is fully replicated before the materials solidify. This will depend in part on the temperature at which the material is held during the extrusion process and the temperature of the tool used to impart the top structured surface, as well as on the speed at which extrusion is being carried out. Typically, the extrudable polymer used in the top layer has a $T_g$ of less than about 140° C., or a $T_g$ of from about 85° C. to about 120° C., in order to be amenable to extrusion replication and embossing under most operating conditions. In some embodiments, the optional carrier film and the removable template layer can be coextruded at the same time. This embodiment requires at least two layers of coextrusion: a top layer with one polymer and a bottom layer with another polymer. If the top layer comprises a first extrudable polymer, then the first extrudable polymer can have a $T_g$ of less than about 140° C. or a $T_g$ or of from about 85° C. to about 120° C. If the top layer comprises a second extrudable polymer, then the second extrudable polymer, which can function as the optional carrier film, has a $T_g$ of less than about 140° C. or a $T_g$ of from about 85° C. to about 120° C. Other properties such as molecular weight and melt viscosity should also be considered and will depend upon the particular polymer or polymers used. The materials used in the removable template layer should also be selected so that they provide good adhesion to the optional carrier film so that delamination of the two layers is minimized during the lifetime of the article.

The extruded or coextruded removable template layer can be cast onto a master roll that can impart patterned structure to the removable template layer. This can be done batchwise or in a continuous roll-to-roll process. Additionally, the optional carrier film can be extruded onto the extruded or coextruded removable template layer. In some embodiments, both layers: optional carrier film and removable template layer can be coextruded at once.

Useful polymers that may be used as the removable template layer polymer include one or more polymers selected from the group consisting of styrene acrylonitrile copolymers; styrene (meth)acrylate copolymers; polymethylmethacrylate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; and copolymers of acrylonitrile, butadiene, and styrene. Particularly useful polymers that may be used as the first extrudable polymer include styrene acrylonitrile copolymers known as TYRIL copolymers available from Dow Chemical; examples include TYRIL 880 and 125. Other particularly useful polymers that may be used as the template polymer include styrene maleic anhydride copolymer DYLARK 332 and styrene acrylate copolymer NAS 30, both from Nova Chemical. Also useful are polyethylene terephthalate blended with nucleating agents such as magnesium silicate, sodium acetate, or methylenebis (2,4-di-t-butylphenol) acid sodium phosphate.

Additional useful polymers include CoPENs (copolymers of polyethylenenaphthalate), CoPVN (copolymers of polyvinylnaphthalene) and polyimides including polyetherimide. Suitable resin compositions include transparent materials that are dimensionally stable, durable, weatherable, and readily formable into the desired configuration. Examples of suitable materials include acrylics, which have an index of refraction of about 1.5, such as PLEXIGLAS brand resin manufactured by Rohm and Haas Company; polycarbonates, which have an index of refraction of about 1.59; reactive materials such as thermoset acrylates and epoxy acrylates; polyethylene based ionomers, such as those marketed under the brand name of SURLYN by E. I. Dupont de Nemours and Co., Inc.; (poly)ethylene-co-acrylic acid; polyesters; polyurethanes; and cellulose acetate butyrates. The removable template layer may be prepared by casting directly onto an optional carrier film, such as disclosed in U.S. Pat. No. 5,691,846 (Benson). Polymers for radiation cured structures include cross linked acrylates such as multifunctional acrylates or epoxies and acrylated urethanes blended with mono- and multifunctional monomers.

The polymerizable composition used to prepare the removable template layer may be monofunctional or multifunctional (e.g, di-, tri-, and tetra-) in terms of radiation curable moieties. Examples of suitable monofunctional polymerizable precursors include styrene, alpha-methylstyrene, substituted styrene, vinyl esters, vinyl ethers, octyl (meth)acrylate, nonylphenol ethoxylate (meth)acrylate, isobornyl (meth)acrylate, isononyl (meth)acrylate, 2-(2-ethoxyethoxy)ethyl (meth)acrylate, 2-ethylhexyl (meth)acrylate, lauryl (meth)acrylate, beta-carboxyethyl (meth)acrylate, isobutyl (meth)acrylate, cycloaliphatic epoxide, alpha-epoxide, 2-hydroxyethyl (meth)acrylate, isodecyl (meth)acrylate, dodecyl (meth)acrylate, n-butyl (meth)acrylate, methyl (meth)acrylate, hexyl (meth)acrylate, (meth) acrylic acid, N-vinylcaprolactam, stearyl (meth)acrylate, hydroxyl functional caprolactone ester (meth)acrylate, isooctyl (meth)acrylate, hydroxyethyl (meth)acrylate, hydroxypropyl (meth)acrylate, hydroxyisopropyl (meth)

acrylate, hydroxybutyl (meth)acrylate, hydroxyisobutyl (meth)acrylate, tetrahydrofuryl (meth)acrylate, and any combinations thereof.

Examples of suitable multifunctional polymerizable precursors include ethyl glycol di(meth)acrylate, hexanediol di(meth)acrylate, triethylene glycol di(meth)acrylate, tetraethylene glycol di(meth)acrylate, trimethylolpropane tri(meth)acrylate, trimethylolpropanepropane tri(meth)acrylate, glycerol tri(meth)acrylate, pentaerythritol tri(meth)acrylate, pentaerythritol tetra(meth)acrylate, neopentyl glycol di(meth)acrylate, bisphenol A di(meth)acrylate, poly (1,4-butanediol) di(meth)acrylate, any substituted, ethoxylated or propoxylated versions of the materials listed above, or any combinations thereof.

The polymerization reactions generally lead to the formation of a three-dimensional "crosslinked" macromolecular network and are also known in the art as negative-tone photoresists, as reviewed by Shaw et al., "Negative photoresists for optical lithography," IBM Journal of Research and Development (1997) 41, 81-94. Crosslinking of the network may occur through either covalent, ionic, or hydrogen bonding, or through physical crosslinking mechanisms such as chain entanglement. The polymerization reactions and/or curing reactions can also be initiated through one or more intermediate species, such as free-radical generating photoinitiators, photosensitizers, photoacid generators, photobase generators, or thermal acid generators. The type of curing agent used depends on the polymerizable precursor used and on the wavelength of the radiation used to cure the polymerizable precursor. Examples of suitable commercially available free-radical generating photoinitiators include benzophenone, benzoin ether, and acylphosphine photoinitiators, such as those sold under the trade designations "IRGACURE" and "DAROCUR" from Ciba Specialty Chemicals, Tarrytown, N.Y. Other exemplary photoinitiators include 2,2-dimethoxy-2-phenylacetophenone (DMPAP), 2,2-dimethoxyacetophenone (DMAP), xanthone, and thioxanthone.

Co-initiators and amine synergists may also be included to improve curing rates. Suitable concentrations of the curing agent in the crosslinking matrix range from about 1 wt. % to about 10 wt. %, with particularly suitable concentrations ranging from about 1 wt. % to about 5 wt. %, based on the entire weight of the polymerizable precursor. The polymerizable precursor may also include optional additives, such as heat stabilizers, ultraviolet light stabilizers, free-radical scavengers, and combinations thereof. Examples of suitable commercially available ultraviolet light stabilizers include benzophenone-type ultraviolet absorbers, which are available under the trade designation "UVINOL 400" from BASF Corp., Florham Park, N.J.; under the trade designation "CYASORB UV-1164" from Cytec Industries, West Patterson, N.J.; and under the trade designations "TINUVIN 900," and "TINUVIN 1130" from BASF Corp., Florham Park, N.J. Examples of suitable concentrations of ultraviolet light stabilizers in the polymerizable precursor range from about 0.1 wt. % to about 10 wt. %, with particularly suitable total concentrations ranging from about 1 wt. % to about 5 wt. %, relative to the entire weight of the polymerizable precursor.

Examples of suitable free-radical scavengers include hindered amine light stabilizer (HALS) compounds, hydroxylamines, sterically hindered phenols, and combinations thereof. Examples of suitable commercially available HALS compounds include the trade designated "TINUVIN 292" and "TINUVIN 123" from BASF Corp., Florham Park, N.J., and the trade designated "CYASORB UV-24" from Cytec Industries, West Patterson, N.J. Examples of suitable concentrations of free radical scavengers in the polymerizable precursor range from about 0.05 wt. % to about 0.25 wt. %.

In some embodiments, the removable template layer has an elastic modulus of from about 0.01 GPa to about 10 GPa, from about 0.01 GPa to about 6 GPa, from about 0.01 GPa to about 4 GPa, from about 0.01 GPa to about 2 GPa, from about 0.05 GPA to about 10 GPa, from about 0.05 GPa to about 6 GPa, from about 0.05 GPa to about 4 GPa, from about 0.05 GPA to about 2 GPa, from about 0.1 GPa to about 10 GPa, from about 0.1 GPA to about 6 GPa, from about 0.1 GPA to about 4 GPa or even from about 0.1 GPA to about 2 GPa.

The removable template layer is typically removed from the backfill layer, resulting in the final transferable portion of the transferable segment, i.e. the backfill layer and corresponding adhesive layer of the transferable segment. One method to reduce the adhesion of the backfill layer to the removable template layer is for removable template layer to include an optional release layer which is adjacent the backfill layer, i.e. optional release layer 130.

Backfill Layer

The backfill layer, e.g. backfill layer 120, typically may meet several requirements. First, it may conform to the structured surface 110*a* of the removable template layer 110 onto which it is disposed. This means, for example, that the viscosity of a precursor liquid that will from the backfill layer should be low enough to be able to flow into very small features without the entrapment of air bubbles, which will lead to good fidelity of the replicated structure. The backfill precursor liquid include, but is not limited to, at least one of a liquid, e.g. a low viscosity liquid, a colloid, a suspension, a gel-like material and paste. In some embodiments, deposition of the backfill layer may be conducted under vacuum, to facilitate removal of gas bubbles. If it is solvent based coating solution, it should be coated from a solvent that does not dissolve the underlying removable template layer, which would cause cracking, or other detrimental defects of the backfill layer. It is desirable that the solvent has a boiling point below glass transition temperature of the removable template layer. The solvent may include, but is not limited to, at least one of isopropanol, butyl alcohol other alcoholic solvents, ketones, e.g. methyl ethyl ketone, and ester solvent. Second, if the backfill layer is the reaction product of a curable precursor liquid, the curable precursor liquid may cure with sufficient mechanical integrity (e.g., "green strength"). If the curable precursor liquid which forms the backfill layer does not have enough green strength after curing, the topographical features 125 of structured surface 120*a* of backfill layer 120 can slump and the replication fidelity may be degraded. Third, for some embodiments, the refractive index of the backfill layer may be tailored to produce the proper optical effect. Fourth, the backfill layer may be thermally stable (e.g., showing minimal cracking, blistering, or popping) above the temperature of the upper range of the future process steps. Fifth, the backfill layer may be UV stable. Known UV stabilizers may be included in the backfill layer, e.g. included in the backfill precursor liquid and/or may be included as a surface coating of the backfill layer.

In some embodiments, the backfill layer comprises a polymeric material. In some embodiments, the polymer material of the backfill layer has a glass transition temperature of greater than about 30 degrees centigrade, greater than about 50 degrees centigrade, greater than about 75 degrees centigrade, greater than about 100 degrees centigrade or even greater than about 150 degrees centigrade. The glass transition temperature of the polymeric material may be less than 400 degrees centigrade. In some embodiments, the polymer material of the backfill layer has an elastic modulus of from about 0.01 GPa to about 80 GPa, from about 0.01 GPa to about 40 GPa, from about 0.01 GPa to about 20 GPa, from about 0.01 GPa to about 10 GPa, from about 0.05 GPA to about 80 GPa, from about 0.05 GPa to about 40 GPa, from about 0.05 GPa to about 20 GPa, from about 0.05 GPA to about 10 GPa, from about 0.1 GPa to about 80 GPa, from about 0.1 GPA to about 40 GPa, from about 0.1 GPA to about 20 GPa or even from about 0.1 GPA to about 10 GPa.

In some embodiments of the present disclosure, the polymeric material of the backfill layer may be derived from a polymer precursor liquid, i.e. the polymeric material is the reaction product of a polymer precursor liquid. A polymer precursor liquid may be at least one of a polymer solution and a reactive polymer precursor liquid, each capable of being at least one of polymerized, chain extended, cured, dried and fused to form the polymeric material of the backfill layer. A polymer solution may include at least one polymer dissolved in at least one solvent. A polymer solution may be capable of being at least one of chain extended, cured, dried and fused to form a polymeric material. In some embodiments, the polymer solution is dried to form a polymeric material. A reactive polymer precursor liquid includes at least one of liquid monomer and liquid oligomer. The monomer may be a single monomer or may be a mixture of at least two different monomers. The oligomer may be a single oligomer or a mixture at least two different oligomers. Mixtures of one or more monomers and one or more oligomers may also be used. The reactive polymer precursor liquid may include at least one, optional, solvent. The reactive polymer precursor liquid may include at least one, optional, polymer, which is soluble in the liquid components of the reactive polymer precursor liquid. The reactive polymer precursor liquid may be capable of being at least one of polymerized, cured, dried and fused to form the polymeric material of the backfill layer. In some embodiments, the reactive polymer precursor liquid is cured to form a polymeric material. In some embodiments, the reactive polymer precursor liquid is polymerized to form a polymeric material. In some embodiments, the reactive polymer precursor liquid is cured and polymerized to form a polymeric material. The terms "cure", "curing", "cured" and the like are used herein to refer to a reactive polymer precursor liquid that is increasing its molecular weight through one or more reactions that include at least one crosslinking reaction. Generally, curing leads to a thermoset material that may be insoluble in solvents. The terms "polymerize", "polymerizing", "polymerized and the like, generally refer to a reactive polymer precursor liquid that is increasing its molecular weight through one or more reactions that do not include a crosslinking reaction. Generally, polymerization leads to a thermoplastic material that may be soluble in an appropriate solvent. A reactive polymer precursor liquid that is reacting by crosslinking reaction and polymerization reaction may form either a thermoset or thermoplastic material, depending on the degree of polymerization achieved and the amounted crosslinking of the final polymeric material. Monomers and/or oligomers useful in the preparation of a reactive polymer precursor liquid may include, but are not limited to, monomers and oligomers conventionally used to form non-tacky polymers, e.g. non-tacky thermosets, non-tacky thermoplastics and non-tacky thermoplastic elastomers.

Polymers are known in the art that contain a combination of organic and inorganic moieties. The organic moiety in the polymer may be used for curability, flexibility, etc, while the inorganic moiety may be used for higher heat resistance, weatherability, durability, etc. The inorganic moieties may also enable cure of the polymeric material of the backfill layer, e.g. condensation of silanol functional groups (Si—OH) to from Si—O—Si moieties while producing water as a byproduct of the cure reaction. One such polymer is available from Nagase Co., Osaka, Japan under the trade designation "SA-250P". The polymer can be cured using methods known in the art, such as ultraviolet irradiation combined a photoinitiator that absorbs ultraviolet light, for example. After curing, this polymer has a refractive index of ~1.6, and a high transmittance (T>88%) as measured by a refractometer and a UV-Vis spectrophotometer, respectively. Other curable polymers that contain a combination of organic and inorganic moieties have a refractive index of about 1.50 after curing.

In some embodiments, the backfill layer may include an organosilicon polymeric material. The organosilicon polymeric material may include organosilicon oligomers, organosilicon polymers, or combinations thereof. The organosilicon polymeric material may further include inorganic particles, such as glasses or ceramics that can be index-matched to the organosilicon material, forming a composite material, such as a nanoparticle-filled silsesquioxane.

The polymeric material of the backfill layer may comprise or consist essentially of organosilicon polymers of a general formula (as below) which can be further reacted to form crosslinked networks by homo-condensation of Si—OH groups, hetero-condensation with the remaining hydrolyzable groups (e.g. alkoxy), and/or by reactions of the functional organic groups (e.g. ethylenically unsaturated such as vinyl, acrylate, or methacrylate). This class of polymeric materials is derived primarily from organosilanes of a general formula:

wherein

R is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these.

Z is a hydrolyzable group, such as halogen (containing the elements F, Br, Cl, or I), $C_1$-$C_{20}$ alkoxy, $C_5$-$C_{20}$ aryloxy, and/or combinations of these.

The majority of the composition may consist of $RSiO_{3/2}$ units thus the class of materials is often called silsesquioxanes (or T-resins), however they may also contain mono-($R_3Si$—$O_{1/2}$), di-($R_2SiO_{2/2}$) and tetrafunctional groups (Si—$O_{4/2}$). Organically-modified disilanes of the formula:

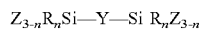

are often used in the hydrolyzable compostions to further modify the properties of the materials (to form the so-called bridged silsesquioxanes), the R and Z groups are defined above. The polymeric materials can be further formulated and reacted with metal alkoxides (M(OR)$_m$) to form metallosilsesquioxanes.

The polymeric material of the backfill layer may comprise or consist of organosilicon oligomers and polymers of a general formula:

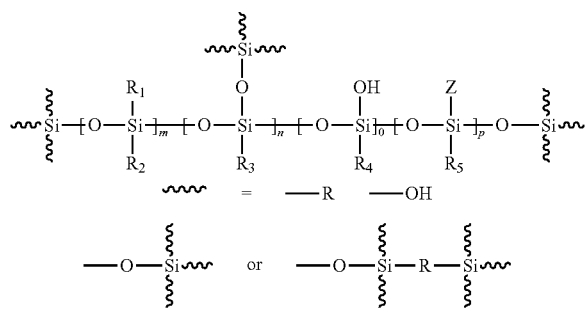

$R_1$, $R_2$, $R_3$, $R_4$, and $R_5$ are independently selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

Z is a hydrolyzable group, such as halogen (containing the elements F, Br, Cl, or I), $C_1$-$C_{20}$ alkoxy, C-$C_{20}$ aryloxy, and/or combinations of these.

m is an integer from 0 to 500;
n is an integer from 1 to 500;
p is an integer from 0 to 500;
q is an integer from 0 to 100.

As used herein, the term "substituted" refers to one substituted with at least a substituent selected from the group consisting of a halogen (containing the elements F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, alkyl group, a $C_2$ to $C_{20}$ alkenyl group, a $C_2$ to $C_{20}$ alkynyl group, $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a heterocycloalkyl group, and a combination thereof, instead of hydrogen of a compound.

The resulting organosilicon polymer has a molecular weight in a range from 150 to 300,000 Da or preferably in a range from 150 to 30,000 Da.

Materials that may be used for the backfill layer include polysiloxanes, polysilazanes, polyimides, silsesquioxanes, e.g silsesquioxanes of the bridge or ladder-type, and siloxane hybrid materials and many others. These molecules typically have an inorganic component which leads to high dimensional stability, mechanical strength, and chemical resistance, and an organic component that helps with solubility and reactivity. In some embodiments the polymeric material of the backfill layer is a copolymer that includes at least one organic moiety and at least one inorganic moieties. In some embodiments the inorganic moiety includes Si. In some embodiments, the organic moiety includes a substituted or unsubstituted C1-C20 alkyl moiety.

In some embodiments, the backfill layer may include thermally stable molecular species, including, but not limited to, at least one of silicon, hafnium, strontium, titanium and zirconium. In some embodiments the thermally stable molecular species includes a metal, metal oxide or metal oxide precursor. Metal oxide precursors may be used in order to act as an amorphous "binder" for inorganic nanoparticles, or they may be used alone.

In some embodiments, the backfill layer may include inorganic nanoparticles. These nanoparticles can be of various sizes and shapes. The nanoparticles can have an average particle diameter less than about 1000 nm, less than about 100 nm, less than about 50 nm, or less than about 35 nm. The nanoparticles can have an average particle diameter from about 3 nm to about 50 nm, or from about 3 nm to about 35 nm, or from about 5 nm to about 25 nm. If the nanoparticles are aggregated, the maximum cross sectional dimension of the aggregated particle can be within any of these ranges, and can also be greater than about 100 nm. "Fumed" nanoparticles, such as silica and alumina, with primary size less than about 50 nm, may also be used, such as CAB-OSPERSE PG 002 fumed silica, CAB-O-SPERSE 2017A fumed silica, and CAB-OSPERSE PG 003 fumed alumina, available from Cabot Co. Boston, Mass. Their measurements can be based on transmission electron microscopy (TEM). Nanoparticles can be substantially fully condensed. Fully condensed nanoparticles, such as the colloidal silicas, typically have substantially no hydroxyls in their interiors. Non-silica containing fully condensed nanoparticles may have a degree of crystallinity (measured as isolated particles) greater than 55%, preferably greater than 60%, and more preferably greater than 70%. For example, the degree of crystallinity may be up to about 86% or greater. The degree of crystallinity can be determined by X-ray diffraction techniques. Condensed crystalline (e.g. zirconia) nanoparticles have a high refractive index whereas amorphous nanoparticles typically have a lower refractive index. Various shapes of the inorganic or organic nanoparticles may be used, such as sphere, rod, sheet, tube, wire, cube, cone, tetrahedron, and the like.

The size of the nanoparticles is generally chosen to create a desired optical effect such as transparence or scattering. The nanoparticles of the backfill layer can also impart various optical properties (i.e refractive index, birefringence), electrical properties (e.g conductivity), mechanical properties (e.g toughness, pencil hardness, scratch resistance) or a combination of these properties. It may be desirable to use a mix of organic and inorganic oxide particle types to optimize an optical or material property and to lower total composition cost.

Examples of suitable inorganic nanoparticles include metal nanoparticles or their respective oxides, including the elements zirconium (Zr), titanium (Ti), hafnium (Hf), aluminum (Al), iron (Fe), vanadium (V), antimony (Sb), tin (Sn), gold (Au), copper (Cu), gallium (Ga), indium (In), chromium (Cr), manganese (Mn), cobalt (Co), nickel (Ni), zinc (Zn), yttrium (Y), niobium (Nb), molybdenum (Mo), technetium (Te), ruthenium (Ru), rhodium (Rh), palladium (Pd), silver (Ag), cadmium (Cd), lanthanum (La), tantalum (Ta), tungsten (W), rhenium (Rh), osmium (Os), iridium (Ir), platinum (Pt), and any combinations thereof.

Examples of suitable inorganic nanoparticles include elements known as rare earth elements and their oxides, such as lanthanum (La), cerium ($CeO_2$), praseodymium ($Pr_6O_{11}$), neodymium ($Nd_2O_3$), samarium ($Sm_2O_3$), europium ($Eu_2O_3$), gadolinium ($Gd_2O_3$), terbium ($Tb_4O_7$), dysprosium ($Dy_2O_3$), holmium ($Ho_2O_3$), erbium ($Er_2O_3$), thulium ($Tm_2O_3$), ytterbium ($Yb_2O_3$) and lutetium ($Lu_2O_3$).

The nanoparticles are typically treated with a surface treatment agent. Surface-treating the nano-sized particles can provide a stable dispersion in the polymer material of the backfill layer and/or polymer precursor liquid used to form the backfill layer. Preferably, the surface-treatment stabilizes the nanoparticles so that the particles will be well dispersed in a substantially homogeneous composition. Furthermore, the nanoparticles can be modified over at least a portion of its surface with a surface treatment agent so that the stabilized particle can copolymerize or react with the parts of the precursor material during curing. In some embodiments, a surface treatment agent has a first end that will attach to the particle surface (covalently, ionically or through strong physisorption) and a second end that imparts compatibility of the particle with the composition and/or reacts with composition during curing. In some embodiments, both the first and second end of the surface treatment attach to the particle and chemical moieties between the ends of the agent impart compatibility of the particle with the composition and/or reacts with composition during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and other for siliceous fillers. Silanes and carboxylic acids are preferred for metal oxides such as zirconia. The surface modification can be done either subsequent to mixing with the monomers or after mixing. It is preferred in the case of silanes to react the silanes with the particle or nanoparticle surface before incorporation into the composition. The required amount of surface modifier is dependent upon several factors such particle size, particle type, modifier molecular weight, and modifier type. In general it is preferred that approximately a monolayer of modifier is attached to the surface of the particle. The attachment procedure or reaction conditions required also depend on the surface modifier used. For silanes, it is preferred to surface treat at elevated temperatures under acidic or basic conditions for from 1-24 hr approximately. Surface treatment agents such as carboxylic acids may not require elevated temperatures or extended time.

Representative embodiments of surface treatment agents suitable for the compositions include compounds such as, for example, isooctyl trimethoxy-silane, N-(3-triethoxysilylpropyl) methoxyethoxyethoxyethyl carbamate ($PEG_3TES$), N-(3-triethoxysilylpropyl) methoxyethoxyethoxyethyl carbamate ($PEG_2TES$), 3-(methacryloyloxy)propyltrimethoxysilane, 3-acryloxypropyltrimethoxysilane, 3-(methacryloyloxy)propyltriethoxysilane, 3-(methacryloyloxy) propyl methyldimethoxysilane, 3-(acryloyloxypropyl)methyldimethoxysilane, 3-(methacryloyloxy)propyldimethylethoxysilane, 3-(methacryloyloxy) propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiacetoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy) silane, styrylethyltrimethoxysilane, mercaptopropyltrimethoxysilane, 3-5 glycidoxypropyltrimethoxysilane, acrylic acid, methacrylic acid, oleic acid, stearic acid, dodecanoic acid, 2-[2-(2-methoxyethoxy)ethoxy]acetic acid (MEEAA), beta-carboxyethylacrylate, 2-(2-methoxyethoxy)acetic acid, methoxyphenyl acetic acid, and mixtures thereof. Further, a proprietary silane surface modifier, commercially available from OSI Specialties, Crompton South Charleston, W. Va. under the trade designation "Silquest A1230", has been found particularly suitable.

In some embodiments, the polymeric material of the backfill layer includes a photocurable precursor liquid that can have a low viscosity during the replication process which forms the structured first major surface of the backfill layer and then can be quickly cured to form the backfill layer, by forming a permanent crosslinked polymeric network "locking in" the replicated nanostructures, microstructures or hierarchical structures of the backfill layer. The backfill layer may be capable of being cured by actinic radiation such as ultraviolet (UV) radiation, ionizing radiation, thermally, or by a combination thereof.

In some embodiments, the backfill layer has a refractive index of from about 1.40 and 2.20, from about 1.50 to about 2.20, from about 1.60 to about 2.20, from about 1.65 to about 2.20 from about 1.70 to about 2.20, from about 1.75 to about 2.20, from about 1.40 and 2.10, from about 1.50 to about 2.10, from about 1.60 to about 2.10, from about 1.65 to about 2.10 from about 1.70 to about 2.10, from about 1.75 to about 2.10, from about 1.40 and 2.00, from about 1.50 to about 2.00, from about 1.60 to about 2.00, from about 1.65 to about 200 from about 1.70 to about 2.00, or even from about 1.75 to about 2.00.

The topographical features 125 of structured surface 120*a* of backfill layer 120 are defined by the structured first major surface of the removable template layer. In some embodiments, the structured surface of the backfill layer comprises topographical features having a height from about 0.05 micron to about 1000 microns, from about 0.05 micron to about 100 microns, from about 0.05 micron to about 10 microns, from about 0.1 micron to about 1000 microns, from about 0.1 micron to about 100 microns, or even from about 0.1 micron to about 10 microns. In some embodiments, the structured first major surface of the backfill layer includes micro-optical structures. Micro-optical structures are structures having a size and shape, such that, they can alter visible light, as it propagates through the backfill layer. Micro-optical structures may be able to reflect, diffract, collimate and/or disperse the light. In some embodiments, the structured first major surface of the backfill layers includes micro-optical structures that are at least one of a light refracting, e.g. light redirecting and wide angle color distribution; light collimating, e.g. light extracting; and light reflecting. In some embodiments, the structured first major surface of the backfill layer may include micro-optical structures that are capable of at least one of reflecting, diffracting, collimating and dispersing at least 10%, at least 20% or even at least 30% of the light in at least the visible region of the electromagnetic spectrum propagating to the structured surface. In some embodiments the micro-optical structures include at least one of daylight redirecting optical structures, light extraction optical structures and wide angle color distribution optical structures. More than one type of micro-optical structure may be included in the structured surface of the backfill layer. The micro-optical structures may include at least one of microlens arrays, linear prismatic lenses, linear rectangular optical elements, retroreflectors, linear cylindrical lenses, micro-Fresnel lenses, diffractive optics, photonic arrays, and digital or holographic optics.

In some embodiments, the backfill layer includes from about 60 percent to about 100 percent, from about 70 percent to about 100 percent, from about 80 percent to about 100 percent or even from about 90 percent to about 100 percent polymeric material by weight.

The backfill layer may be coated on the removable template layer by any one of a variety of techniques known in the art, including, but not limited to, hand brush coating; notch bar coating; die coating; wire-wound rod coating; knife coating, e.g. slot-fed knife coating; roll coating, e.g. three-roll coating, spray coating; and extrusion. The backfill layer may then be cured and/or polymerized by conventional techniques, including but not limited to thermally curing and/or polymerizing and actinic radiation curing and/or polymerizing.

Adhesive Layers

The adhesive layer includes at least one adhesive. In some embodiments, the adhesive layer may include multiple layers, the adhesive of the multiple layers may be the same or different. In some embodiments, the adhesive of the adhesive layer includes at least one of a pressure sensitive adhesive, a heat activated adhesive, e.g. a hot melt adhesive, and a B-staged adhesive. A B-stage adhesive is an adhesive that has been initially cured so that it has sufficient green strength to maintain its shape, yet can be further cured to improve its adhesive properties and/or strength. In some embodiments, the adhesive layer may include a backing, with adhesive disposed on both major surfaces of the backing. In some embodiments, the adhesive of the adhesive layer may be a structural adhesive. In some embodiments, the adhesive is of the adhesive layer may be an optical adhesive. An optical adhesive is optically clear and may have a luminous transmission of greater than about 90 percent, a haze of less than about 2 or even 1.5 percent, in the 350 to 800 nm wavelength range. The haze is typically less than 1 or 0.5 percent. Further, the opacity is typically less than about 1 percent. Both the luminous transmission and the haze can be determined using, for example, ASTM-D 1003-95. Typically, the optical adhesive may be visually free of bubbles. The optical adhesive is also desirably non-yellowing initially and after accelerated aging. For example, the CIELAB b* is typically less than 1.5, or 1.0 or 0.5 for a thickness of 10 mils (about 250 microns).

Although various optical adhesives are known in the art, in some embodiments, the optical adhesive of the adhesive layer comprises an organosilicon polymer, such as a polydiorganosiloxane. The term "polydiorganosiloxane" refers to a divalent segment of formula

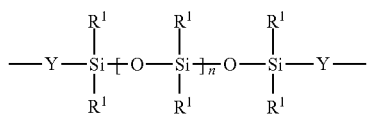

where each $R^1$ is independently an alkyl, haloalkyl, aralkyl, alkenyl, aryl, or aryl substituted with an alkyl, alkoxy, or halo; each Y is independently an alkylene, aralkylene, or a combination thereof; and subscript n is independently an integer of 1 to 1500. In some embodiments, n is at least 25, 50, or greater.

In some embodiments, the optical adhesive comprises a polydiorganosilane polyoxamide copolymer, such as described in U.S. Pat. Nos. 7,947,376 and 8,765,881.

The polydiorganosiloxane have many desirable properties such as low glass transition temperatures, thermal and oxidative stability, resistance to ultraviolet radiation, low surface energy and hydrophobicity, and high permeability to many gases. Additionally, the copolymers exhibit good to excellent mechanical strength.

Pressure sensitive adhesives and heat activated adhesives can be formulated by combining the polydiorganosiloxane polyoxamides with a tackifier such as a silicate tackifying resin. As used herein, the term "pressure sensitive adhesive" refers to an adhesive that possesses sufficiently aggressive and permanent tack; sufficient strength to bond the transfer layer to a receptor substrate such as glass; and in some embodiments typical sufficient cohesive strength to be removed cleanly from the receptor substrate. As used herein, the term "heat activated adhesive" refers to an adhesive that is essentially non-tacky at room temperature but that becomes tacky above room temperature above an activation temperature such as above about 30° C. Heat activated adhesives typically have the properties of a pressure sensitive adhesive above the activation temperature.

Tackifying resins such as silicate tackifying resins are added to the polydiorganosiloxane polyoxamide copolymer to provide or enhance the adhesive properties of the copolymer. The silicate tackifying resin can influence the physical properties of the resulting adhesive. For example, as silicate tackifying resin content is increased, the glassy to rubbery transition of the adhesive occurs at increasingly higher temperatures.

Suitable silicate tackifying resins include those resins composed of the following structural units M (i.e., monovalent $R'_3SiO_{1/2}$ units), D (i.e., divalent $R'_2SiO_{2/2}$ units), T (i.e., trivalent $R'SiO_{3/2}$ units), and Q (i.e., quaternary $SiO_{4/2}$ units), and combinations thereof. Typical silicate resins include MQ silicate tackifying resins, MQD silicate tackifying resins, and MQT silicate tackifying resins. These silicate tackifying resins usually have a number average molecular weight in the range of 100 to 50,000 or in the range of 500 to 15,000 and generally have methyl R' groups.

MQ silicate tackifying resins are copolymeric resins having $R'_3SiO_{1/2}$ units ("M" units) and $SiO_{4/2}$ units ("Q" units), where the M units are bonded to the Q units, each of which is bonded to at least one other Q unit. Some of the $SiO_{4/2}$ units ("Q" units) are bonded to hydroxyl radicals resulting in $HOSiO_{3/2}$ units ("$T^{OH}$" units), thereby accounting for the silicon-bonded hydroxyl content of the silicate tackifying resin, and some are bonded only to other $SiO_{4/2}$ units.

Suitable silicate tackifying resins are commercially available from sources such as Dow Corning, Midland, Mich., and Wacker Chemie AG, Munich, Germany. Examples of particularly useful MQ silicate tackifying resins include those available under the trade designations SR-545 and SR-1000, both of which are commercially available from GE Silicones, Waterford, N.Y. Such resins are generally supplied in organic solvent and may be employed in the formulations of the adhesives of the present invention as received. Blends of two or more silicate resins can be included in the adhesive.

The adhesive of the adhesive layer may contain 20 to 80 weight percent polydiorganosiloxane polyoxamide and 20 to 80 weight percent silicate tackifying resin based on the combined weight of polydiorganosiloxane polyoxamide and silicate tackifying resin. For example, the adhesive may contain 30 to 70 weight percent polydiorganosiloxane polyoxamide and 30 to 70 weight percent silicate tackifying resin, 35 to 65 weight percent polydiorganosiloxane polyoxamide and 35 to 65 weight percent silicate tackifying resin, 40 to 60 weight percent polydiorganosiloxane polyoxamide and 40 to 60 weight percent silicate tackifying resin, or 45 to 55 weight percent polydiorganosiloxane polyoxamide and 45 to 55 weight percent silicate tackifying resin.

The adhesive can be solvent-free or can contain a solvent. Suitable solvents include, but are not limited to, toluene, tetrahydrofuran, dichloromethane, aliphatic hydrocarbons (e.g., alkanes such as hexane), or mixtures thereof. The adhesive of the adhesive layer can further include other additives as known in the art.

In some embodiments, the adhesive layer has a refractive index of from about 1.40 and 1.80, from about 1.45 to about 2.00, from about 1.50 to about 2.00, from about 1.55 to about 2.00, from about 1.60 to about 2.00, from about 1.40 and 1.90, from about 1.45 to about 1.90, from about 1.50 to about 1.90, from about 1.55 to about 1.90, from about 1.60 to about 1.90, from about 1.40 and 1.80, from about 1.45 to about 1.80, from about 1.50 to about 1.80, from about 1.55 to about 1.80, or even from about 1.60 to about 1.80. In some embodiments, the refractive index of the backfill layer is higher than the refractive index of the adhesive layer. In some embodiments the difference between the refractive index of the backfill layer and the refractive index of the adhesive layer is between about 0.03 and about 0.7, between 0.05 and about 0.6 or even between about 0.10 and about 0.50.

The adhesive layer may be coated on the backfill layer by any one of a variety of techniques known in the art, including, but not limited to, hand brush coating; notch bar coating; die coating; wire-wound rod coating; knife coating, e.g. slot-fed knife coating; roll coating, e.g. three-roll coating, spray coating; and extrusion. The adhesive may also be coated as an adhesive precursor solution and polymerized and/or cured, for example, by thermal or actinic radiation.

Additionally, an optional release liner, not shown in the figures, may be adjacent to or in contact with the surface of the adhesive layer of the transfer tapes of the present disclosure or the adhesive layer during any step in the fabrication of the segmented transfer tapes of the present disclosure, to protect the adhesive layer from marring and/or debris. Release liners know in the art may be used. In some embodiments, the segmented transfer tape includes a release liner adjacent to or in contact with the adhesive layer of the at least one transferable segment. The release liner may be removed, prior to using the segmented transfer tape.

Optional Carrier Film

The optional carrier film of the transfer tapes of the present disclosure, e.g. optional carrier film 140, can be any suitable film, including, for example, thermally stable flexible films that can provide mechanical support for the other layers. The thickness of the optional carrier film is not particularly limited. In some embodiments the thickness of the carrier film may be from about 10 microns to about 2000 microns, from about 10 microns to about 500 microns, from about 10 microns to about 250 microns or even from about 10 microns to about 100 microns. The optional carrier film may be thermally stable above 50° C., or alternatively 70° C., or alternatively above 120° C. One example of an optional carrier film is polyethylene terephthalate (PET). In some embodiments, the optional carrier film can include paper, release-coated paper, non-wovens, wovens (fabric), metal films, and metal foils.

Various organic polymeric film substrates comprised of various thermosetting or thermoplastic polymers are suitable for use as the optional carrier film. The support may be a single layer or multi-layer film. Illustrative examples of polymers that may be employed as the optional carrier film include (1) fluorinated polymers such as poly(chlorotrifluoroethylene), poly(tetrafluoroethylene-cohexafluoropropylene), poly(tetrafluoroethylene-co-perfluoro(alkyl)vinylether), poly(vinylidene fluoride-cohexafluoropropylene); (2) ionomeric ethylene copolymers poly(ethylene-co-methacrylic acid) with sodium or zinc ions such as SURLYN-8920 Brand and SURLYN-9910 Brand available from E. I. duPont Nemours, Wilmington, Del.; (3) low density polyethylenes such as low density polyethylene; linear low density polyethylene; and very low density polyethylene; plasticized vinyl halide polymers such as plasticized poly(vinylchloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, et cetera, or CH3 (CH2)n- where n is 0 to 12, and poly(ethylene-co-vinylacetate) "EVA"; and (5) (e.g.) aliphatic polyurethanes. The optional carrier film can be an olefinic polymeric material, typically comprising at least 50 wt-% of an alkylene having 2 to 8 carbon atoms with ethylene and propylene being most commonly employed. Other body layers include for example poly(ethylene naphthalate), polycarbonate, poly(meth)acrylate (e.g., polymethyl methacrylate or "PMMA"), polyolefms (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like. In some embodiments, the optional carrier film can include paper, release-coated paper, non-wovens, wovens (fabric), metal films, and metal foils.

The optional carrier film is removed with the removable template layer once the at least one transferable segments is transferred onto the receptor substrate (e.g. pane of glass or a substrate of an OLED display) to form an assembly. Thus, once the at least one transferable segment is transferred onto the receptor substrate and the carrier film, removable template layer and the at least one non-transferable segment are removed from the receptor substrate, the assembly does not contain the carrier film.

Optional Release Layer

The optional release layer of the removable template layer, e.g. optional release layer 130, may comprise any release layer known in the art, as long as it facilitates the removal of the removable template layer from the backfill layer of the transfer layer. In some embodiments low surface energy materials known in the art may be used.

One method of applying a release coating to the structured surface of the removable template layer is with plasma deposition. An oligomer can be used to create a plasma crosslinked release coating. The oligomer may be in liquid or in solid form prior to coating. Typically the oligomer has a molecular weight greater than 1000. Also, the oligomer typically has a molecular weight less than 10,000 so that the oligomer is not too volatile. An oligomer with a molecular weight greater than 10,000 typically may be too non-volatile, causing droplets to form during coating. In one embodiment, the oligomer has a molecular weight greater than 3000 and less than 7000. In another embodiment, the oligomer has a molecular weight greater than 3500 and less than 5500. Typically, the oligomer has the properties of providing a low-friction surface coating. Suitable oligomers include silicone-containing hydrocarbons, reactive silicone containing trialkoxysilanes, aromatic and aliphatic hydrocarbons, fluorochemicals and combinations thereof. For example, suitable resins include, but are not limited to, dimethylsilicone, hydrocarbon based polyether, fluorochemical polyether, ethylene teterafluoroethylene, and fluorosilicones. Fluorosilane surface chemistry, vacuum deposition, and surface fluorination may also be used to provide a release layer.

Plasma polymerized thin films constitute a separate class of material from conventional polymers that can be used as a release layers. In plasma polymers, the polymerization is random, the degree of cross-linking is extremely high, and the resulting polymer film is very different from the corresponding "conventional" polymer film. Thus, plasma polymers are considered by those skilled in the art to be a uniquely different class of materials and are useful in the disclosed articles. In addition, there are other ways to apply a release layer to the removable template layer, including, but not limited to, blooming, coating, coextrusion, spray coating, electrocoating, or dip coating.

The optional release layer may be at least one of a fluorine-containing material, a silicon-containing material and a low surface energy polymer, including but not limited to, a fluoropolymer, e.g. polytetrafluoroethylene, a silicone polymer, e.g. polysiloxane polymer, a polyalkyl, e.g. polyethylene and polypropylene, or a poly(meth)acrylate ester derived from a monomer comprising an alkyl (meth)acrylate having an alkyl group with 12 to 30 carbon atoms. In one embodiment, the alkyl group can be branched. Illustrative examples of useful fluoropolymers and silicone polymers can be found in U.S. Pat. No. 4,472,480 (Olson), U.S. Pat. Nos. 4,567,073 and 4,614,667 (both Larson et al.). Illustrative examples of a useful poly(meth)acrylate ester can be found in U. S. Pat. Appl. Publ. No. 2005/118352 (Suwa). The removal of the removable template layer should not negatively alter the surface topology of the backfill layer.

Passivating Layer

The passivating layer of the present invention is not particularly limited, so long as the passivating layer can lower the adhesion, e.g. the peel strength, of the adhesive surface of the non-transferable segment to the receptor substrate, such that it does not transfer. In some embodiments, the adhesion of the passivated adhesive surface of the at least one non-transferable segment is lower than the adhesion of the adhesive surface of the at least one transferable segment. In some embodiments, the adhesion of the passivated adhesive surface of the at least one non-transferable segment is at least 30% lower, at least 50% lower, at least 70% lower, at least 80% lower, at least 90% lower or even at least 95% lower than the adhesion of the adhesive surface of the at least one transferable segment and, at the lower limit, the passivated adhesive surface of the non-transferable segment exhibits no measurable adhesion. The adhesion of the transferable and non-transferable segments to a substrate surface may be determined by a standard adhesion test, e.g. bonding it to a substrate and applying a conventional 90 degree or 180 degree peel test, as known in the art. The substrate of the test is not particularly limited and may be the desired receptor substrate, however, the substrate of the adhesion test may be glass. The peel test may be run at a speed of 90 in/min (229 cm/min) and the sample may be in the form of a rectangle having a width of 1 inch (2.54 cm). The length of the rectangular shaped sample is not particularly limited and is generally selected with respect to the testing equipment to insure the sample can be appropriately configured in the test equipment.

In some embodiments, when the passivating layer is non-tacky, the non-transferable segment will not transfer. In some embodiments, the passivating layer is non-tacky, i.e. a non-tacky passivating layer. In some embodiments, the passivating layer is non-tacky at a temperature of about 20 degrees centigrade, about 30 degrees centigrade, about 50 degrees centigrade, about 75 degrees centigrade, about 100 degrees centigrade, about 125 degrees centigrade or even about 150 degrees centigrade. In some embodiments, the passivating layer is at least one of an organic coating and an inorganic coating. In some embodiments, the passivating layer is at least one of a non-tacky organic coating and a non-tacky inorganic coating. In some embodiments, the non-tacky organic and inorganic coatings are non-tacky at a temperature of about 20 degrees centigrade, about 30 degrees centigrade, about 50 degrees centigrade, about 75 degrees centigrade, about 100 degrees centigrade, about 125 degrees centigrade or even about 150 degrees centigrade. Inorganic coatings include, but are not limited to, metal coatings and ceramic coatings. Organic coatings include, but are not limited to, polymeric coatings. In some embodiments the passivating layer is a polymeric coating, wherein the polymeric coating has a glass transition temperature of greater than about 30 degrees centigrade, greater than about 50 degrees centigrade, greater than about 75 degrees centigrade, greater than about 100 degrees centigrade or even greater than about 150 degrees centigrade. The glass transition temperature of the polymeric coating may be less than 400 degrees centigrade. The passivating layer may include at least one of a metal, e.g. a metal coating; ceramic, e.g. a ceramic coating; and polymer, e.g. a polymeric coating. The polymeric coating may be a thermoplastic, thermoset or thermoplastic elastomer, thermosets being particularly useful. In some embodiments, the polymeric coating further includes an inorganic particle. In some embodiments, the polymeric coating may be a polymeric ink or dispersion, e.g. ink of an ink jet printer. The metal coating may include, but is not limited to, gold, silver, aluminum, copper, tungsten, zinc, nickel, tantalum, titanium. The ceramic coating may include but is not limited to, at least one of silicone oxide, aluminum oxide, silicon carbide, silicon nitride, and for the present disclosure, diamond and diamond like carbon. In some embodiments, the passivating layer is at least one of a non-tacky polymeric coating, non-tacky metal coating and non-tacky ceramic coating.

The passivating layer may be disposed on the adhesive layer by any techniques known in the art that allow for patterned deposition. For example, the passivating layer may be disposed on the surface of the adhesive layer using printing techniques, including but not limited to letter press printing, offset printing, gravure printing flexographic printing, inkjet printing, laser printing, i.e. toner printing, pad printing, screen printing, thermal printing and the like. In one embodiment, the passivating layer may printed on the surface of the adhesive layer using UV curing ink and an inkjet printer. Printing techniques, generally, employ liquid inks or powders, the inks and powders may include a non-tacky, polymeric material. In some embodiments, the passivating layer is an ink that may include a non-tacky, polymeric material. The passivating layer, may be disposed on the adhesive layer by CVD coating techniques, with appropriate masking of the adhesive layer to apply the CVD coating to the desired regions of the surface of the adhesive layer, e.g. the adhesive surface of the at least one non-transferable segment. CVD coating of organic and inorganic materials may be conducted.

Kerfs

The kerfs of the segmented transfer tapes of the present disclosure may be fabricated by known techniques in the art, including, but not limited to die cutting, e.g. kiss cutting, laser cutting, e.g. laser scoring, and water jet cutting. The desired pattern for the kerf, i.e. the pattern that defines the at least one transferable segment and at least one non-transferable segment, can be incorporated into the die design, if for example die cutting is used to form the at least one kerf or may be programed into the software of a computer driven cutting technique, e.g. laser cutting or water jet cutting. The depth of the kerf is defined by the overall thickness of the segmented transfer tape, thus the depth of the kerf will be dependent on the thickness of the adhesive layer, backfill layer, removable template layer and, if present, may be dependent on the thickness of optional carrier film. The at least one kerf must extend from the first major surface of the adhesive layer, through the transfer layer and into at least a portion of the removable template layer, while the depth of the kerf is less than the thickness of the segmented transfer tape and the shape of the at least one transferable segment is defined by the at least one kerf.

Other Additives

Various additives, as known in the art, may be included in any of the layers of the transfer tape such as antioxidants, stabilizers, inhibitors, and the like to prevent premature curing during the process of storage, shipping and handling of the film.

Receptor Substrate and Second Substrate

A particular advantage of the segmented transfer tapes and the associated process of applying the segmented transfer tapes, is the ability to impart structure, e.g. optical elements, to receptor surfaces with large surfaces, such as architectural glass. The large dimensions of the lamination transfer tapes are possible by using a combination of roll-to-roll processing and a cylindrical master template. An additional advantage of the transfer process disclosed herein is the ability to impart structure to receptor surfaces that are not planar. The receptor substrate can be curved, bent twisted, or have concave or convex features, due to the flexible format of the transfer tape. The receptor substrate and second substrate may be a transparent receptor substrate and a second transparent substrate, respectively. The second substrate may be a second receptor substrate, e.g. a second transparent receptor substrate. Transparent receptor substrates and second transparent substrates may have a transmission of incident visible light of between about 50% and 100%, between about 60% and 100%, between about 70% and about 100%, between about 80% and about 100%, between about 85% and about 100%, between about 90% and about 100%, between about 95% and about 100% or even between about 97% and 100%. Receptor substrates and second substrates may include, for example, glass, automotive glass, sheet glass, flexible electronic substrates such as circuitized flexible film, display backplanes, LED or OLED substrates, solar glass, metal, polymers, polymer composites, and fiberglass. The first transparent receptor substrate may be at least one of a transparent glass substrate and a transparent polymer substrate. The second transparent substrate may be at least one of a transparent glass substrate and a transparent polymer substrate. The first transparent receptor substrate may be a glass panel for an insulated glazing unit and/or the second transparent substrate may be a glass panel for an insulated glazing unit. Still further, an additional advantage can be the ability to apply transferable segments of the transfer tape in a precisely defined pattern on a receptor substrate, the pattern being fabricated in the segmented transfer tape by the pattern of the at least one kerf and the transferability of the segments being facilitated by the application of the passivating layer to the surface of the at least one non-transferable segment of the transfer tape. The receptor substrates and second substrates and/or the major surfaces of the receptor substrate and second substrates may include adhesion promoters, which may be in the form of a coating, to facilitate the adhesion of the transferable segments, e.g. micro-optical elements, of the transfer tapes of the present disclosure to their major surfaces and/or to facilitate the adhesion of graphic layers to their major surfaces.

Graphics Layer

The receptor substrate and second substrate of the micro-optical assemblies of the present disclosure may include at least one graphics layer, e.g. a first graphics layer. The graphics layer is used to form at least one graphic in the micro-optical assemblies of the present disclosure. The graphics layer include at least one first graphic. The graphic is not particularly limited and may provide at least one of color; pattern; imagery; indicia and the like to the transfer tapes of the present disclosure. The graphics layer may be a single complex pattern. The graphics layer may itself be multiple layers. In some embodiments the graphics layer includes a plurality of graphics. If a plurality of graphic are used, the graphics may be the same or different. The plurality of graphics may be random. The plurality of graphics may be in a pattern, e.g. a repeating pattern. The graphics layer can be a continuous or discontinuous layer. The graphics layer may include a pixelated pattern of primary colors, the primary colors being used to generate a wide palette of colors within the graphics layer, as is known, for example in ink jet printing techniques. The pattern may include finer detail, including dots of primary printing colors, e.g. cyan, magenta, yellow, black, and specialty or spot colors.

The graphics layer may comprise an ink. Any suitable commercially available ink can be used. The inks may include pigments and dyes. The graphics layer may include other additives, to promote the life span of the graphics layer, e.g. to prevent color fading or ink migration. The graphics layer may include stabilizers, including, but not limited to UV stabilizers, antioxidants, heat stabilizers, corrosion inhibitors and the like. The graphics layer may also include plasticizers, fillers and other conventional additives known in the art. The thickness, Tgr, of the graphics layer is not particularly limited and only needs to be thick enough to provide the desired graphic and graphic quality.

The graphics layer may also include a transparent, graphics film substrate, where graphics, as previously described, may be printed on and/or embedded in a graphics film substrate, producing a graphics layer. The graphics layer may then be disposed on the first or second major surface of the first receptor substrate. In some embodiments, the graphics layer does not include a graphics film substrate. A graphics film substrate may be a polymer film, e.g., a transparent polymer film know in the art. The film substrate may be surface treated to facilitate the printing of the graphics.

In some embodiments, the thickness of the graphics layer may be between about 0.5 micron and about 500 micron, between about 0.5 micron and about 250 microns, between about 0.5 microns and about 100 microns, between about 0.5 micron and about 50 microns, between about 0.5 microns and about 25 microns, between about 0.5 microns and about 10 microns or even between about 0.5 microns and about 5 microns. Printed graphics may have a narrow range of thickness and graphic layers including a graphics film substrate may have broader range of thicknesses.

The graphics layer may also provide some optical functionality, including but not limited to, absorption, reflection, scattering and filtering of light. Whether or not the graphics layer includes an optical function is based on the design and function of the final article the at least one transferable segment and/or the optical assembly contain at least one transferable segment are to be utilized in.

If some embodiments, the graphics layer may include an adhesion promoter, to improve the adhesion of the graphics layer to at least one to a surface of the receptor substrate and/or second substrate. However, in preferred embodiments, the material comprising the graphics layer is selected to be chemically compatible with adjacent layers of the micro-optical assembly, i.e. the first and second major surface of the receptor substrate and/or the first and second major surface of the second substrate. In some embodiments, the graphics layer is free of an adhesion promoter. In some embodiments, the first and/or second major surface of the receptor substrate and/or the first and/or second major surface of the second substrate may include an adhesion promotion layer or coating to facilitate adhesion between the surfaces and the at least one graphics layer.

In some embodiments, the receptor substrate of the micro-optical assemblies includes at least one graphics layer. In some embodiments, the at least one graphics layer is disposed on the first or second major surface of the first receptor substrate. A second graphic layer having at least one first graphic may be disposed on the major surface of the first receptor substrate opposite the first graphics layer. The micro-optical assemblies may include a second substrate. The second substrate may include a third graphics layer, including at least one first graphic, disposed on the second transparent substrate's first or second major surface, The second substrate may include a fourth graphics layer, including at least one first graphic, disposed on the major surface of the second receptor substrate opposite the third graphics layer. The descriptions, materials and methods of use associated with the graphics layers of the receptor substrate may also be applicable to the graphic layer(s) of the second substrate, i.e. the third and fourth graphic layers.

The transfer tapes of the present disclosure may be fabricated by a variety of methods. One method for forming a segmented transfer tape includes (i) providing a removable template layer and a transfer layer, the removable template layer having a structured surface and the transfer layer includes a backfill layer and adhesive layer, the backfill layer has a structured first major surface, an opposed second major surface and is disposed on and conforms to at least a portion of the structured surface of the removable template layer, wherein the opposed second major surface of the backfill layer includes a first graphics layer, including at least one first graphic; (ii) forming at least one kerf in the transfer layer, thereby producing at least one transferable segment having an adhesive surface and at least one non-transferable segment having an adhesive surface in the transfer layer; and (iii) disposing a passivating layer on at least a portion of the adhesive surface of the at least one non-transferable segment. The at least one transferable segment has a shape, relative to the plane of its adhesive surface, defined by the at least one kerf and the opposed second major surface of the backfill layer of the at least one transferable segment includes the at least one first graphic. The at least one kerf extends from the first major surface of the adhesive layer, through the transfer layer and into at least a portion of the removable template layer.

Segmented transfer tapes, their corresponding transferable optical elements, e.g. micro-optical elements, and methods of making thereof which are useful in the micro-optical assemblies and fabrication thereof of the present disclosure include, but are not limited to, those described in U.S. Patent Application Ser. No. 62/181,985, entitled "SEGMENTED TRANSFER TAPE AND METHOD OF MAKING AND USE THEREOF" and U.S. Patent Application Ser. No. 62/182,000 entitled "SEGMENTED AND NON-SEGMENTED TRANSFER TAPES, ARTICLES THEREFROM AND METHOD OF MAKING AND USE THEREOF", filed on an even date herewith, which are both hereby incorporated herein by reference in their entirety. One method for forming a segmented transfer tape includes providing a removable template layer and a transfer layer, the removable template layer having a structured surface and the transfer layer includes a backfill layer, having a structured first major surface and an opposed second major surface, and adhesive layer, the backfill layer is disposed on and conforms to at least a portion of the structured surface of the removable template layer; forming at least one kerf in the transfer layer, thereby producing at least one transferable segment having an adhesive surface and at least one non-transferable segment having an adhesive surface in the transfer layer; and disposing a passivating layer on at least a portion of the adhesive surface of the at least one non-transferable segment. The at least one transferable segment has a shape, relative to the plane of its adhesive surface, defined by the at least one kerf. The at least one kerf extends from the first major surface of the adhesive layer, through the transfer layer and into at least a portion of the removable template layer.

Figure 5A:
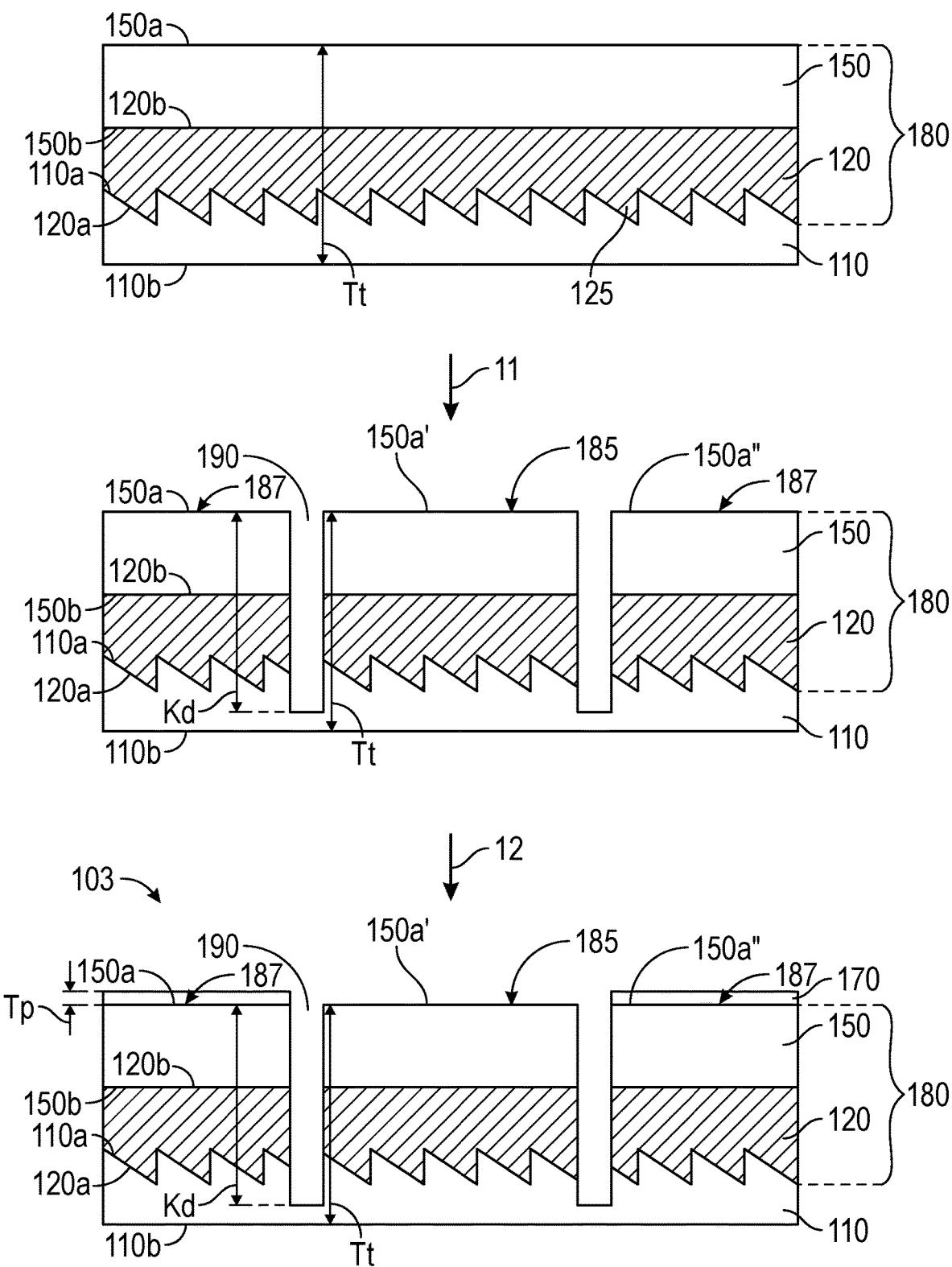
FIG. 5A is a schematic process flow diagram forming an exemplary segmented transfer tape according to one exemplary embodiment of the present disclosure.

Referring to FIG. 5A, a schematic process flow diagram forming an exemplary segmented transfer tape according to one exemplary embodiment of the present disclosure, the method of forming a segmented transfer tape 103 includes providing a removable template layer 110, having a structured surface 110a and an opposed second surface 110b, and a transfer layer 180, wherein the transfer layer 180 includes (i) a backfill layer 120 disposed on and conforming to at least a portion of structured surface 110a of removable template layer 110, wherein backfill layer 120 has a structured first major surface 120a with topographical features 125 adjacent the structured surface 110a of removable template layer 110 and an opposed second major surface 120b; and (ii) an adhesive layer 150 having a first major surface 150a and an opposed second major surface 150b, wherein second major surface 150b of adhesive layer 150 is adjacent to or in contact with second major surface 120b of backfill layer 120. In some embodiments, the backfill layer is disposed on and conforms to the structured surface of the removable template layer, forming a continuous backfill layer, the continuous backfill layer may be disposed on the entire structured surface of the removable template layer. In some embodiments, the adhesive layer is adjacent to or in contact with the second major surface of the backfill layer, forming a continuous adhesive layer, the continuous adhesive layer may be adjacent to or in contact with on the entire second surface of the backfill layer. In some embodiments, the transfer layer may be a continuous layer.

The method further includes step 11; forming at least one kerf 190 in transfer layer 180, thereby producing at least one transferable segment 185 having an adhesive surface 150a' and at least one non-transferable segment 187, having an adhesive surface 150a'', in the transfer layer 180, the at least one transferable segment 185 having a shape, relative to the plane of its adhesive surface 150a', defined by the at least one kerf 190, wherein the at least one kerf 190 extends from the first major surface 150a of the adhesive layer 150, through the transfer layer 180 and into at least a portion of the removable template layer 110. The at least one kerf may also defines the shape of the at least one non-transferable segment, relative to the plane of its adhesive surface.

The method further includes step 12; disposing a passivating layer 170 on at least a portion of the adhesive surface 150*a*" of the at least one non-transferable segment 187. As previously discussed, in some embodiments, the passivating layer 170, aligns, i.e. is in registry, with the surface area of the non-transferable segment (the surface area of adhesive surface 150*a*"), and the at least one transferable segment 185 does not include passivating layer over a portion of its surface (the surface area of adhesive surface 150*a*'), unless an negative offset is present. In some embodiments, the at least one kerf defines the shape of the at least one non-transferable segment, relative to the plane of its adhesive surface, and disposing of the passivating layer is conducted in registry with the shape of the at least one non-transferable segment. One or more fiducial markers may be included in the transfer layer. The fiducial markers aide in aligning the passivating layer with the surface of the non-transferable segment, i.e. aide in aligning the passivating layer with the shape of the at least one non-transferable segment, the shape being relative to the plane of its adhesive surface. In some embodiments, the method of forming a segmented transfer tape further includes providing at least one fiducial marker in the transfer layer, prior to disposing the passivating layer. In some embodiments, the at least one fiducial marker is a fiducial kerf marker.

Another method for forming a segmented transfer tape includes providing a removable template layer and a transfer layer, the removable template layer having a structured surface and the transfer layer includes a backfill layer and adhesive layer, the backfill layer is disposed on and conforms to at least a portion of the structured surface of the removable template layer; disposing a passivating layer, having a shape relative to the plane of the adhesive layer, on at least a portion of the adhesive layer; and forming at least one kerf in the transfer layer, thereby producing at least one transferable segment having an adhesive surface and at least one non-transferable segment having an adhesive surface with the passivating layer disposed thereon. The at least one transferable segment has a shape, relative to the plane of its adhesive surface, defined by the at least one kerf. The at least one kerf extends from the first major surface of the adhesive layer, through the transfer layer and into at least a portion of the removable template layer.

Figure 5B:
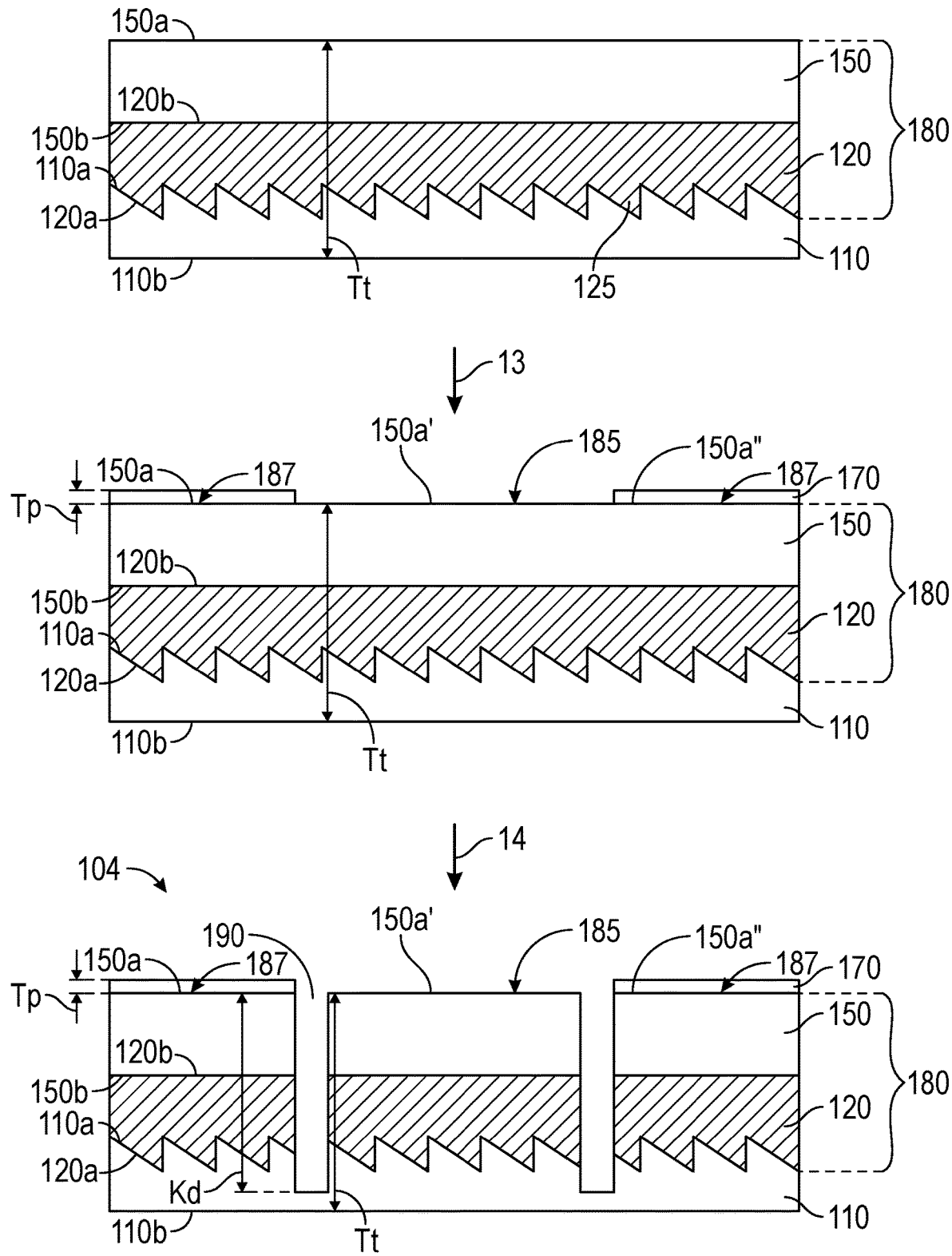
FIG. 5B is a schematic process flow diagram forming an exemplary segmented transfer tape according to one exemplary embodiment of the present disclosure.

Referring to FIG. 5B, a schematic process flow diagram forming an exemplary segmented transfer tape according to one exemplary embodiment of the present disclosure, the method of forming a segmented transfer tape 104 includes providing a removable template layer 110, having a structured surface 110*a* and an opposed second surface 110*b*, and a transfer layer 180, wherein the transfer layer 180 includes (i) a backfill layer 120 disposed on and conforming to at least a portion of structured surface 110*a* of removable template layer 110, wherein backfill layer 120 has a structured first major surface 120*a* with topographical features 125 adjacent the structured surface 110*a* of removable template layer 110 and an opposed second major surface 120*b*; and (ii) an adhesive layer 150 having a first major surface 150*a* and an opposed second major surface 150*b*, wherein second major surface 150*b* of adhesive layer 150 is adjacent to or in contact with second major surface 120*b* of backfill layer 120. In some embodiments, the backfill layer is disposed on and conforms to the structured surface of the removable template layer, forming a continuous backfill layer, the continuous backfill layer may be disposed on the entire structured surface of the removable template layer. In some embodiments, the adhesive layer is adjacent to or in contact with the second major surface of the backfill layer, forming a continuous adhesive layer, the continuous adhesive layer may be adjacent to or in contact with the entire second surface of the backfill layer. In some embodiments, the transfer layer may be a continuous layer.

The method further includes step 13, disposing a passivating layer 170, having a shape relative to the plane of the adhesive layer, on at least a portion of the first major surface 150*a* of the adhesive layer 150; and step 14, forming at least one kerf 190 in the transfer layer 180, thereby producing at least one transferable segment 185 having an adhesive surface 150*a*' and at least one non-transferable segment 187 having an adhesive surface 150*a*" with the passivating layer disposed thereon, the at least one transferable segment 185 having a shape, relative to the plane of its adhesive surface 150*a*', defined by the at least one kerf 190, wherein the at least one kerf 190 extends from the first major surface 150*a* of the adhesive layer 150, through the transfer layer 180 and into at least a portion of the removable template layer 110. One or more fiducial markers may be included in the transfer layer. The fiducial markers aide in aligning the passivating layer with the surface of the at least one non-transferable segment, i.e. aide in aligning the passivating layer with the shape of the at least one non-transferable segment, the shape being relative to the plane of its adhesive surface. The method of forming a segmented transfer tape may further include providing at least one fiducial marker prior to forming the at least one kerf. In some embodiments, the at least one fiducial marker is a fiducial passivating layer marker. The passivating fiducial marker may be at least one of a positive passivating layer fiducial marker and a negative passivating layer fiducial marker. In some embodiments, the method of forming a segmented transfer tape may include that forming of the at least one kerf is conducted in registry with the shape of the passivating layer.

In the methods of making the segmented transfer tape of the present disclosure, forming the at least one kerf may be conducted by at least one of die cutting, laser cutting, and water jet cutting. In the methods of making the segmented transfer tape of the present disclosure, disposing the passivating layer may be conducted by at least one of letter press printing, offset printing, gravure printing, flexographic printing, inkjet printing, laser printing, i.e. toner printing, pad printing, screen printing, thermal printing and the like. Additionally, the method of forming the transfer tape may further include providing an optional carrier film 140 and applying the optional carrier film 140 adjacent to or in contact with the second surface 110*b* of the removable template layer 110, as shown in FIG. 5B.

The segmented transfer tapes of the present disclosure may be used to transfer at least one transferable segment of the transfer tape to a receptor substrate. In some embodiments, the transfer tapes of the present disclosure may be used to transfer a plurality of transferable segment to a receptor substrate. In some embodiments, the plurality of transferable segments may all have the same shape and size, may all have different shapes and sizes, or a portion of the plurality of segments may all have the same shape and size and a portion may have a different shape and/or size. There is no particular limitation as to the number of segments that may have the same shape and size and the number that may have differing shapes and/or sizes and groups of transferable segments. Groups of transferable segments having the same shape and size, may be used, the number of different groups is not particularly limited. The shape of the at least one transferable segment, relative to the plane of its adhesive surface is not limited. In some embodiments, the shape of the at least one transferable segment may be at least one of circle, ellipse, polygon, regular polygon and quadrilateral. Regular polygons include, but are not limited to equilateral triangle, square, hexagon and octagon. Quadrilateral shapes may include trapezoid, trapezium and kite. In some embodiments, the segmented transfer tapes of the present disclosure include a plurality of transferable segments. The transferable segments may be randomly distributed in the transfer tape or may be distributed in a pattern in the transfer tape. The transfer tapes of the present disclosure are particularly well suited for the transferring of a pattern of transferrable segments, to a receptor substrate. The transferable segments may include micro-optical elements.

The present disclosure also provides a micro-optical assembly. A micro-optical assembly includes a first receptor substrate, e.g. a first transparent receptor substrate, and at least one micro-optical element. The first receptor substrate has a first and second major surfaces and a first graphics layer, the first graphics layer includes at least one first graphic, the first graphics layer is disposed on one of the first receptor substrate's first and second major surfaces. The micro-optical element may be the at least one transferable segment of any one of the segmented transfer tapes of the present disclosure. The micro-optical element includes a backfill layer having a structured first major surface and an opposed second major surface. The structured first major surface of the backfill layer of the at least one micro-optical element includes topographical features, the topographical features being micro-optical structures. The adhesive layer of the at least one micro-optical element has a first major surface and an opposed second major surface. The first major surface of the adhesive layer is disposed on at least one of the first major surface of the first receptor substrate and the first graphics layer, and the second major surface of the adhesive layer is adjacent to or in contact with the opposed second major surface of the backfill layer. The adhesive layer bonds the micro-optical element to the first receptor substrate. In some embodiments, the at least one micro-optical element is a plurality of micro-optical elements. In some embodiments, the plurality of micro-optical element is in a pattern. In some embodiments, the at least one first graphic of the first graphics layer is a plurality of first graphics. In some embodiments, the plurality of first graphics is in a pattern. In some embodiments, the first graphics layer is disposed on the first major surface of the first receptor substrate. In other embodiments, the first graphics layer is disposed on the second major surface of the first receptor substrate. In some embodiments, the first receptor substrate further includes a second graphics layer, including at least one first graphic. The second graphics layer may be disposed on the major surface of the first receptor substrate opposite the first graphics layer.

In some embodiments, the optical element, e.g. micro-optical element, includes at least one through hole. The through hole extends through the thickness of the optical element and creates a region in the optical element that is free of both the backfill layer (and corresponding micro-optical structures) and the adhesive layer. In some embodiments, the at least one through hole is a plurality of through holes and, optionally, the plurality of through holes is in a pattern. The number of through holes in an optical element, e.g. micro-optical element, is not particularly limited. In some embodiment, the number of through holes may range from 1 through hole to 100,000 through holes or even more. Additionally, the size of the through holes, i.e. length and width, is not particular limited. In some embodiment the length and/or width of the through holes may range from about 0.1 mm to about 3 meters or even more. The at least one through hole may be used to provide additional desired patterns, for aesthetic purposes, for example, or may have a functional purpose, altering the areal density of the micro-optical structures throughout the at least one micro-optical element and, thereby altering the light altering properties of the optical element.

In some embodiments, the at least one first graphic of the first graphics layer is in registry with the at least one micro-optical element. Any of the graphics of the graphic layers, e.g. first graphics layer, second graphics layer, third graphics layer and fourth graphics layer, disclosed herein, may be in registry with one another and/or be in registry with the at least one micro-optical element, e.g. a plurality of micro-optical elements. Any of the graphics of the graphic layers, e.g. first graphics layer, second graphics layer, third graphics layer and fourth graphics layer, disclosed herein may be in registry with one another and/or be in registry with the at least one through hole, e.g. a plurality of through holes, of the at least micro-optical element. In some embodiments, the at least one first graphic of a graphics layer, e.g. a first, second, third or fourth graphics layer, is in registry with the at least one micro-optical element. In some embodiments, the at least one first graphic of a graphics layer, e.g. a first, second, third or fourth graphics layer, is in registry with the at least one through hole of the at least one micro-optical element. In some embodiments, the at least one graphic of a graphics layer, e.g. a first, second, third or fourth graphics layer, does not overlap with the at least one micro-optical element. In other embodiments, the at least one graphic of a graphics layer, e.g. a first, second, third or fourth graphics layer, overlaps with the at least one micro-optical element. In some embodiments, the at least one graphic of a graphics layer, e.g. a first, second, third or fourth graphics layer, overlaps with the at least one through hole of the backfill layer. In some embodiments, a portion of the plurality of the graphics of a first graphics layer e.g. a first, second, third or fourth graphics layer, overlap with the at least one micro-optical element. In some embodiments, all of the graphics of the at least one graphic of a graphics layer, e.g. a first, second, third or fourth graphics layer, overlap with the at least one micro-optical element.

Figure 6A:
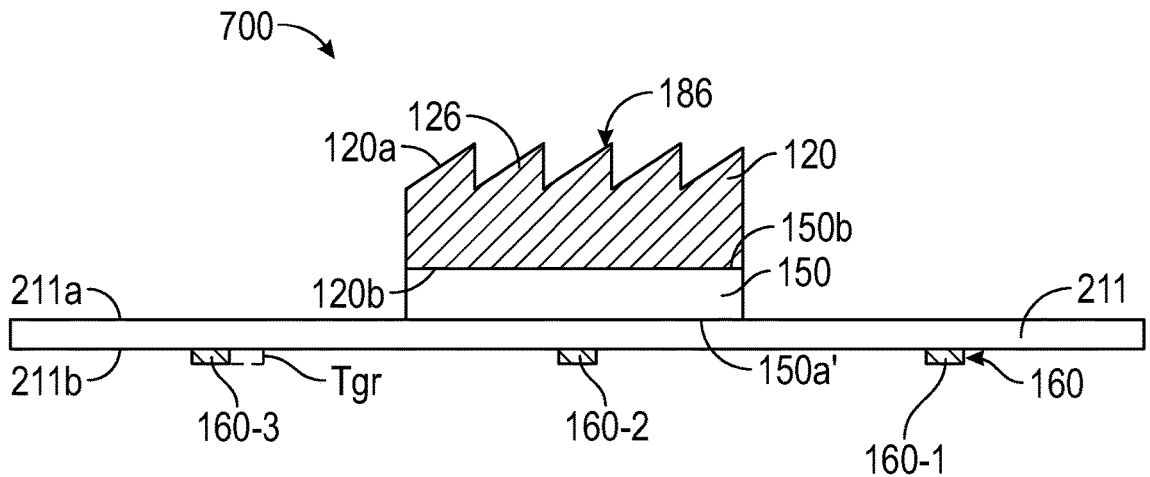
FIG. 6A is a schematic cross-sectional side view of a portion of an exemplary micro-optical assembly according to one exemplary embodiment of the present disclosure.

Referring to FIG. 6A, a schematic cross-sectional side view of a portion of an exemplary optical assembly according to one exemplary embodiment of the present disclosure, micro-optical assembly 700 includes a first receptor substrate, e.g. a first transparent receptor substrate, 211 having a first major surface 211*a* and a second major surface 211*b*. The first receptor substrate 211 includes a first graphics layer 160, including at least one first graphic 160-1, disposed on one of the first receptor substrate's first and second major surfaces, in this embodiment, the second major surface 211*b*. In this embodiment, graphics layer 160 includes three graphics, 160-1, 160-2 and 160-3. The thickness of the graphics layer is Tgr. Graphics 160-1 and 160-3 do not overlap with micro-optical element 186. Graphic 160-2 overlaps with micro-optical element 186. With respect to a graphic overlapping with a micro-optical element, overlap relates to the area of a major surface of the optical element overlapping with an area of the surface of a graphic. The micro-optical assembly 700 includes at least one micro-optical element 186, micro-optical element 186 includes (i) a backfill layer 120 having a structured first major surface 120*a* and an opposed second major surface 120*b*, wherein the structured first major surface 120*a* of the backfill layer 120 includes micro-optical structures 126 and (ii) an adhesive layer 150 having a first major surface 150*a*' and an opposed second major surface 150*b*, wherein the first major surface 150a' of the adhesive layer 150 is disposed on the first major surface 211a of the first receptor substrate 211 and the second major surface 150b of the adhesive layer 150 is adjacent to or in contact with the opposed second major surface 120b of the backfill layer 120. Adhesive layer 150 bonds the micro-optical element 186 to the first receptor substrate 211. In some embodiments, the at least one micro-optical element is a plurality of micro-optical elements. In some embodiments, the plurality of micro-optical elements is in a pattern. The micro-optical assembly may further include a second graphic layer.

Figure 6B:
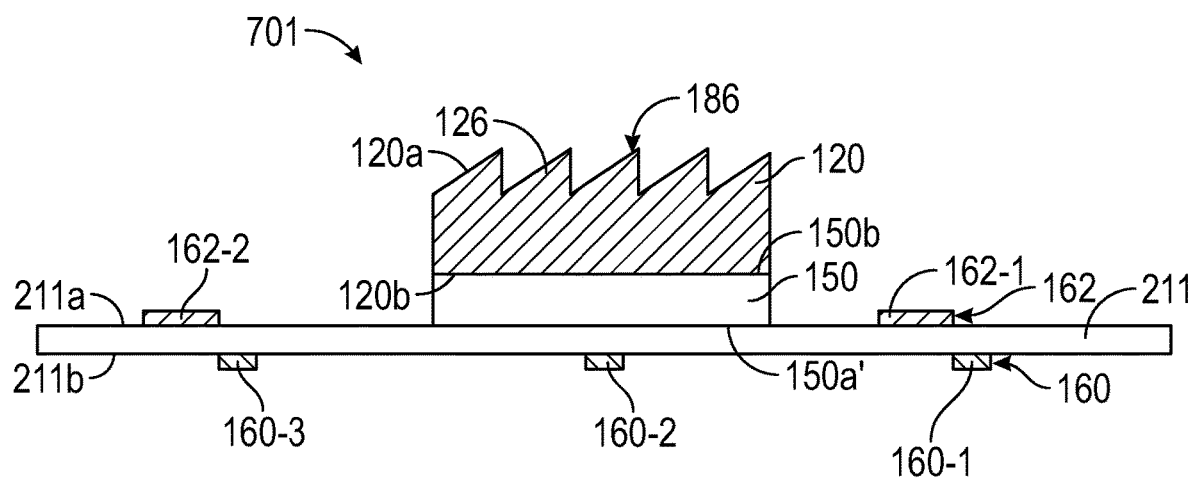
FIG. 6B is a schematic cross-sectional side view of a portion of an exemplary micro-optical assembly according to one exemplary embodiment of the present disclosure.

FIG. 6B shows micro-optical assembly 701, which is similar to micro-optical assembly 700 with like elements in the figures employing the same element numbers. The first receptor substrate 211 of micro-optical assembly 701 further includes a second graphics layer 162, including at least one first graphic 162-1. The second graphics layer 162 is disposed on the major surface of the first receptor substrate opposite the first graphics layer, in this embodiment, first major surface 211a of the first receptor substrate 211. In this embodiment, graphics layer 162 includes two graphics, 162-1 and 162-2. Neither one of graphics 162-1 and 162-2 overlap with micro-optical element 186.

Figure 6C:
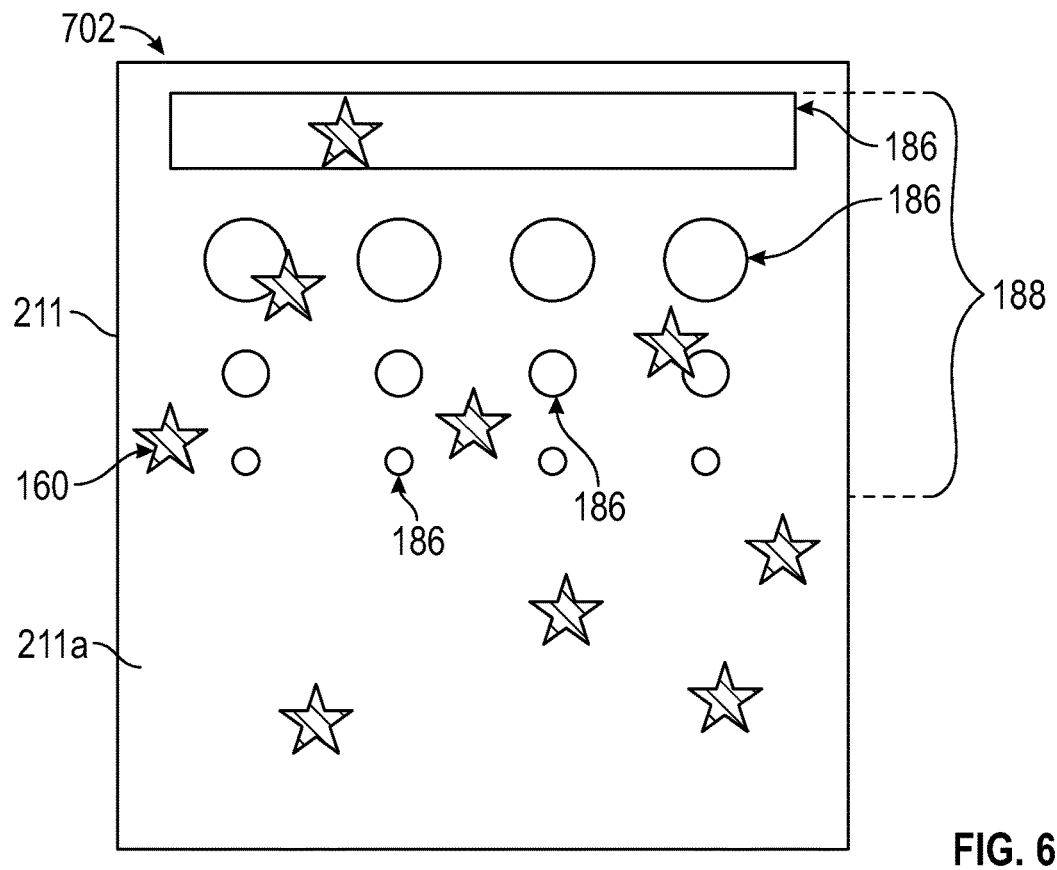
FIG. 6C is a schematic top view of a portion of an exemplary micro-optical assembly according to one exemplary embodiment of the present disclosure.
Figure 6D:
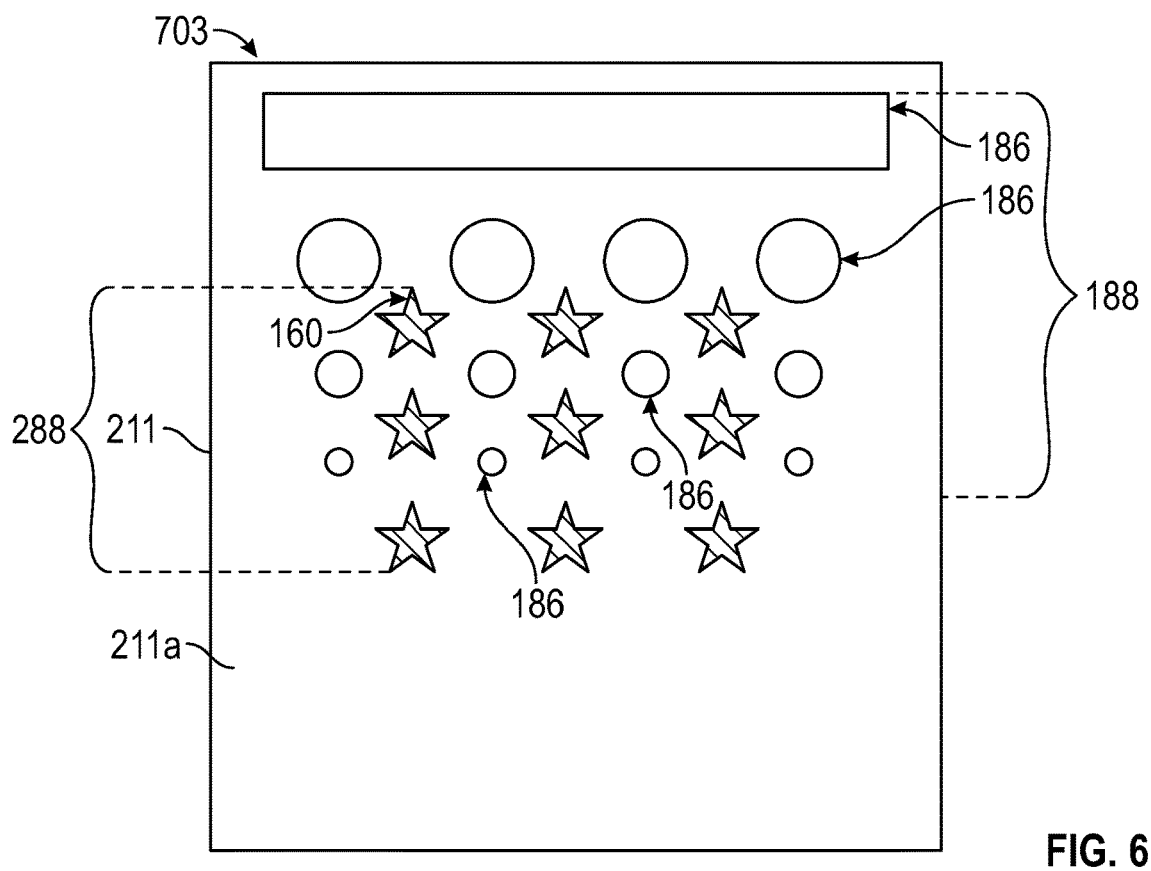
FIG. 6D is a schematic top view of a portion of an exemplary micro-optical assembly according to one exemplary embodiment of the present disclosure.

FIG. 6C is a schematic cross-sectional top view of a portion of an exemplary micro-optical assembly according to one embodiment of the present disclosure. Micro-optical assembly 702 includes a first receptor substrate 211, e.g. a first receptor substrate, having a first major surface 211a and at least one micro-optical element 186. In this embodiment, the at least one micro-optical element 186 includes a plurality of micro-optical elements shown as twelve circles and one rectangle in a pattern 188 (similar to the transferable segments of FIG. 4B). First receptor substrate 211 includes at least one first graphics layer 160 having at least one first graphic. In this embodiment, the at least one first graphic of the first graphics layer is a plurality of graphics that includes nine graphics which appear as nine stars in FIG. 6C. The nine stars are randomly located and disposed on first surface 211a of first receptor substrate 211. Three of the graphics of the first graphics layer overlap with the plurality of micro-optical element and six do not overlap. The micro-optical elements are as previously described with respect to FIGS. 6A and 6B and the first major surface of the adhesive layer of each micro-optical element is disposed on the first major surface 211a of first receptor substrate 211, bonding the micro-optical element to the first receptor substrate. Although the first graphics layer 160 is shown to be disposed on the first major surface 211a of first receptor substrate 211, it may be disposed on second major surface 211b, i.e. the surface opposed (opposite), to first major surface 211a, of first receptor substrate 211. FIG. 6D is a schematic cross-sectional top view of a portion of an exemplary micro-optical assembly according to one embodiment of the present disclosure. Micro-optical assembly 703 is similar to micro-optical assembly 702 and like elements in the figures employ the same element numbers. Micro-optical assembly 703 differs from micro-optical assembly 702 in that the first receptor substrate 211, of micro-optical assembly 703 includes a first graphics layer 160 which in in the form of a pattern 288. The pattern is a rectangular grid array of nine stars. In this embodiment, the at least one first graphic of the first graphics layer is in registry with the at least one micro-optical element. In some embodiments, the pattern of the at least one graphic, e.g. the pattern of a plurality of graphics, of a graphics layer may be in registry with the pattern of the at least micro-optical elements, e.g. a pattern of a plurality of micro-optical elements. Specifically the nine stars of the graphics of the first graphics layer, which form pattern 288, are in registry with the micro-optical elements 186 and/or their pattern 188. In some embodiments the plurality of micro-optical elements is in registry with the plurality of graphics of the first graphics layer. In some embodiments the graphic of the first graphics layer may be in a pattern.

In some embodiments, the micro-optical assembly further comprising a second substrate or a second receptor substrate, e.g. a second transparent substrate or a second transparent receptor substrate, each having a first major surface and a second major surface. In some embodiments, the first major surface of the second substrate is adjacent the backfill layer of the micro-optical element. The first receptor substrate and second substrate may be any of the receptor substrates and second substrates disclosed herein. In some embodiments, the first receptor substrate is a transparent receptor substrate. In some embodiments, the second substrate is a transparent receptor substrate. In some embodiments, the first receptor substrate is a first transparent receptor substrate and the second substrate is a second transparent receptor substrate. In some embodiments, the first receptor substrate is a first transparent glass substrate. In some embodiments, the second receptor substrate is a second transparent glass substrate. In some embodiments, the first receptor substrate is a first transparent glass substrate and the second receptor substrate is a second transparent glass substrate. The first transparent glass substrate may be a glass panel for an insulated glazing unit and/or the second transparent glass substrate may be a glass panel for an insulated glazing unit.

Figure 6E:
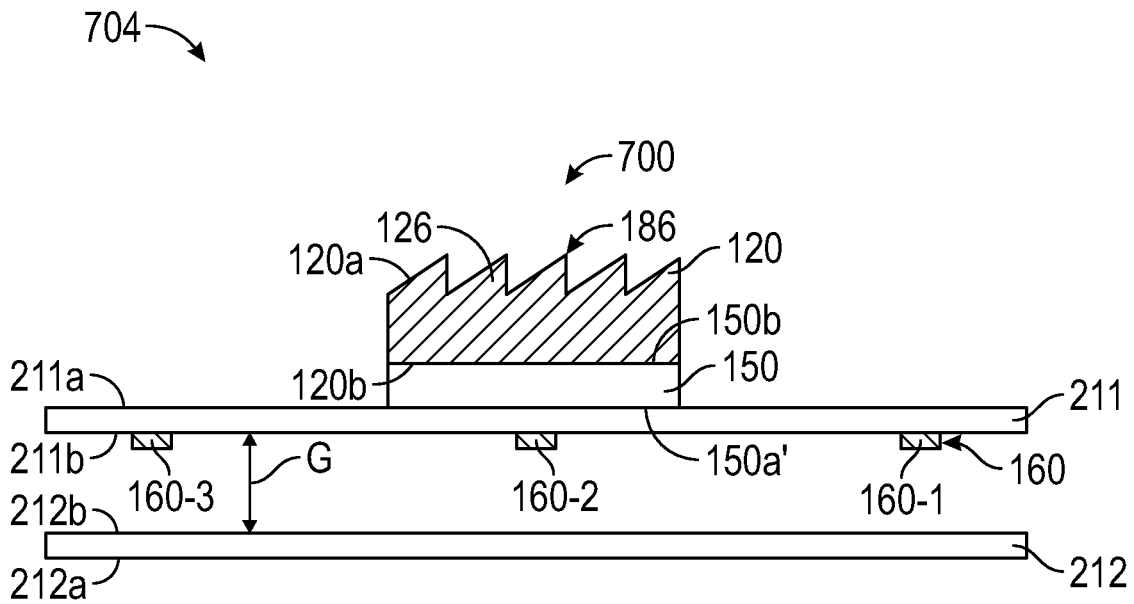
FIG. 6E is a schematic cross-sectional side view of a portion of an exemplary micro-optical assembly according to one exemplary embodiment of the present disclosure.
Figure 6F:
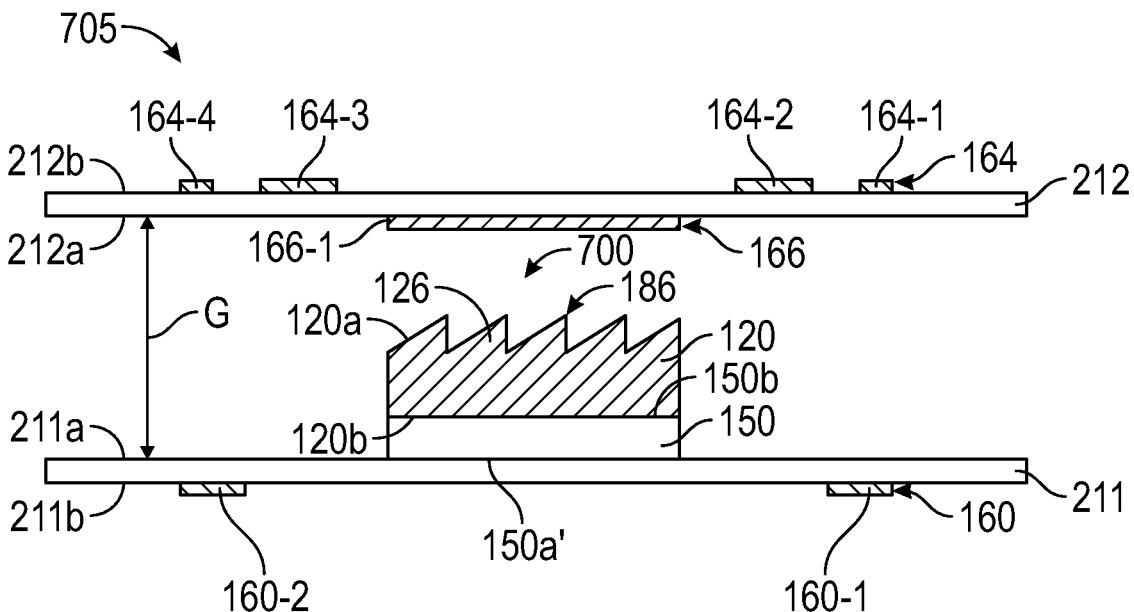
FIG. 6F is a schematic cross-sectional side view of a portion of an exemplary micro-optical assembly according to one exemplary embodiment of the present disclosure.

FIG. 6E is a schematic cross-sectional side view of a portion of an exemplary micro-optical assembly according to one embodiment of the present disclosure. Micro-optical assembly 704 includes micro-optical assembly 700, as previously described and shown in FIG. 6A. Micro-optical assembly 704 further includes a second substrate, 212, e.g. a second transparent substrate, having a first major surface 212a and a second major surface 212b. The second substrate is adjacent the second major surface 211b of first receptor substrate 211, i.e. the second substrate is opposite the first major surface of the first receptor substrate that includes the at least one micro-optical element 186. In some embodiments, the first major surface of the second substrate is adjacent the backfill layer of the at least one micro-optical element. In some embodiments, the first major surface of the second substrate contacts the backfill layer of the at least one micro-optical element. In some embodiments, the first major surface of the second substrate does not contact the backfill layer of the at least one micro-optical element. In some embodiments, the at least one micro-optical element is disposed between the major surfaces of the first receptor substrate and the second substrate. As depicted in FIGS. 6E and 6F, there is a gap, G, between the first receptor substrate and the second substrate. The gap may be formed and maintained by techniques known in the art, including, but not limited to, utilizing spacers of thickness G that may be added between the two substrates and fabricating a frame around the peripheral edges of the two substrates, the frame maintain gap G, as would be found, for example, in a dual pane window.

FIG. 6F is a schematic cross-sectional side view of a portion of an exemplary micro-optical assembly according to one embodiment of the present disclosure. Micro-optical assembly 705 includes micro-optical assembly 700, as previously described and shown in FIG. 6A. Micro-optical assembly 705 further includes a second substrate, 212, e.g. a second transparent substrate, having a first major surface 212a and a second major surface 212b. The second substrate 212 is adjacent the first major surface 211a of first receptor substrate 211, i.e. the second substrate 212 is adjacent first major surface 211a of first receptor substrate 211 that includes the at least one micro-optical element 186. The first major surface 212a of the second substrate 211 is also adjacent the backfill layer 120 of the at least one micro-optical element 186. In some embodiments, the first major surface 212a of the second substrate 211 contacts the backfill layer 120 of the at least one micro-optical element 186. In some embodiments, the first major surface 212a of the second substrate 212 does not contact the backfill layer 120 of the at least one micro-optical element 186. In some embodiments, the at least one micro-optical element 186 is disposed between the major surfaces 211a and 212a of the first receptor substrate 211 and the second substrate 211, respectively. Although not shown, the first receptor substrate may include a second graphics layer disposed on the major surface of the first substrate opposite the second graphics layer, e.g. first major surface 212a.

Micro-optical assembly 705 further includes a third graphics layer 164 which includes at least one first graphic 164-1. As depicted in FIG. 6F, third graphics layer 164 includes four graphics, 164-1, 164-2, 164-3 and 164-4. Third graphics layer 164 is disposed on the second major surface 212b of second substrate 212. Micro-optical assembly 705 further includes a fourth graphics layer 166 which includes at least one first graphic 166-1. As depicted in FIG. 6F, fourth graphics layer 166 includes one graphic, 166-1. Fourth graphics layer 166 is disposed on the first major surface 212a of second substrate 212. The fourth graphic layer 166 is disposed on the major surface of the second substrate opposite the third graphics layer.

In some embodiments, a second graphics layer is disposed on the major surface of the first transparent receptor substrate opposite the first graphics layer. In some embodiments, the micro-optical assembly may include a third or even a fourth graphics layer, each disposed on one of the major surface of the first and second substrate. In some embodiments, at least one, at least two, at least three or even all four of the four major surface of the first receptor substrate and the second substrate may have a graphics layer disposed thereon. The first, second, third and fourth graphics layers may each include at least one first graphic or may include a plurality of graphics. One graphics layer may include a single graphic while another graphics layer may include a plurality of graphics. In some embodiments the second substrate may be a second receptor substrate and may include at least one micro-optical element. The micro-optical element of the second receptor substrate may be the same or different from the micro-optical element of the first receptor substrate. If a plurality of optical elements are used, e.g. on one or both major surfaces of a receptor substrate, the optical elements may all be the same or they may be different, for example, they may all have the same optical function or at least one of the micro-optical elements may have a different optical function. In some embodiments, the first major surface and second major surface of the first receptor substrate may each include at least one micro-optical element, e.g. a plurality of micro-optical elements. The at least one micro-optical element on each major surface of the first receptor substrate may be the same or may be different. In some embodiments, the first major surface and second major surface of the second receptor substrate may each include at least one micro-optical element, e.g. a plurality of micro-optical elements. The at least one micro-optical element on each major surface of the second receptor substrate may be the same or may be different.

Figure 6G:
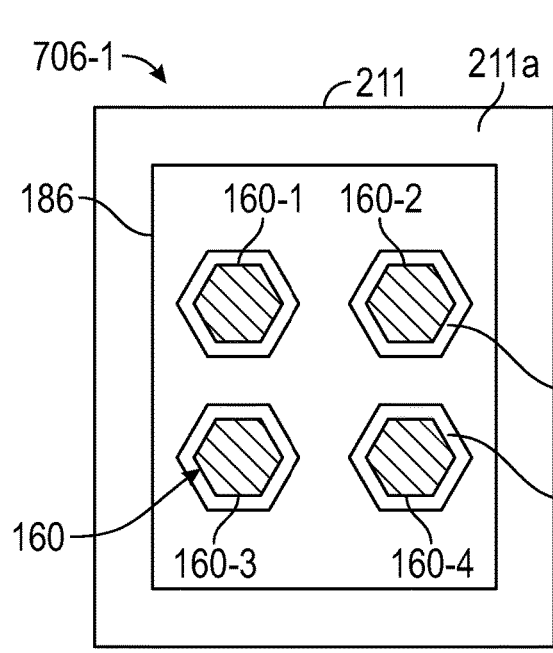
FIG. 6G is a schematic top view of a portion of an exemplary micro-optical assembly according to one exemplary embodiment of the present disclosure.

FIGS. 6G, 6H, 6I and 6J each show schematic top views of additional, non-limiting, embodiments of micro-optical assemblies of the present disclosure. FIG. 6G shows micro-optical assembly 706-1 which includes first receptor substrate 211, having first major surface 211a, and a single micro-optical element 186 attached thereto. Micro-optical element 186 includes at least one through hole 198, in this case a plurality of four through holes. The plurality of through holes are each in the shape of a hexagon and the four hexagons form a pattern, a square in this embodiment. First receptor substrate 211 also includes a first graphics layer 160, including at least one first graphic 160-1, in this case, a plurality of graphics, i.e. a first graphic 160-1, a second graphic 160-2, a third graphic 160-3 and a fourth graphic 160-4 disposed on first major surface 211a of first receptor substrate 211. First, second, third and fourth graphics are each in the shape of a hexagon and form a pattern, a square in this embodiment. The plurality of graphics of the first graphics layer are in registry with the micro-optical element, e.g. the through holes of the micro-optical element, specifically the hexagons of the first graphic layer are spatially positioned to be in the center of the through holes of the micro-optical element.

Figure 6H:
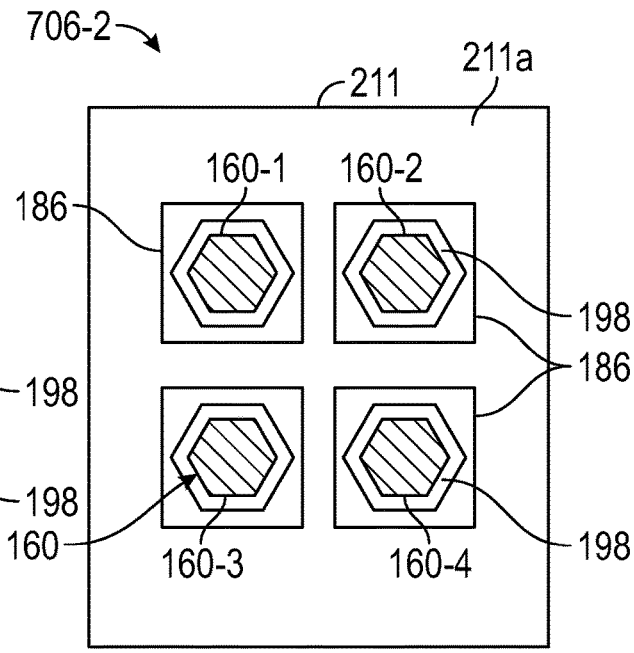
FIG. 6H is a schematic top view of a portion of an exemplary micro-optical assembly according to one exemplary embodiment of the present disclosure.

FIG. 6H shows micro-optical assembly 706-2, which is similar to micro-optical assembly 706-1 and like elements in the figures employ the same element numbers. Micro-optical assemblies 706-2 differs from micro-optical assembly 706-1 in that micro-optical assembly 706-2 includes a plurality of micro-optical elements 186, specifically four micro-optical elements. Each micro-optical element includes a single through hole 198 each in the shape of a hexagon. The four micro-optical elements and subsequently the four hexagonal shaped through holes form a pattern, a square in this embodiment. Similar to FIG. 6G, the plurality of graphics of the first graphics layer 160 are in registry with the micro-optical elements, and thus are also in registry with the through holes of the micro-optical elements. Specifically the hexagons of the first graphic layer are spatially positioned to be in the center of the through holes of the micro-optical elements.

Figure 6I:
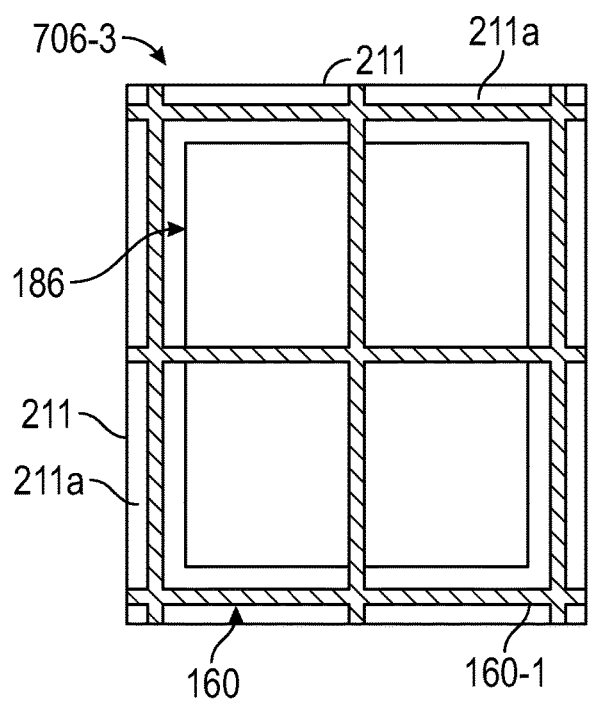
FIG. 6I is a schematic top view of a portion of an exemplary micro-optical assembly according to one exemplary embodiment of the present disclosure.

FIG. 6I shows micro-optical assembly 706-3 which includes first receptor substrate 211, having first major surface 211a, and a single micro-optical element 186 attached thereto. Micro-optical element 186 is a continuous micro-optical element with no through holes. First receptor substrate 211 also includes a first graphics layer 160, including at least one first graphic 160-1. In this embodiment, the first graphic is a series of interconnecting lines running parallel and perpendicular to each other. The first graphic is in a pattern, a grid pattern. Portions of the first graphic overlaps with the micro-optical element.

Figure 6J:
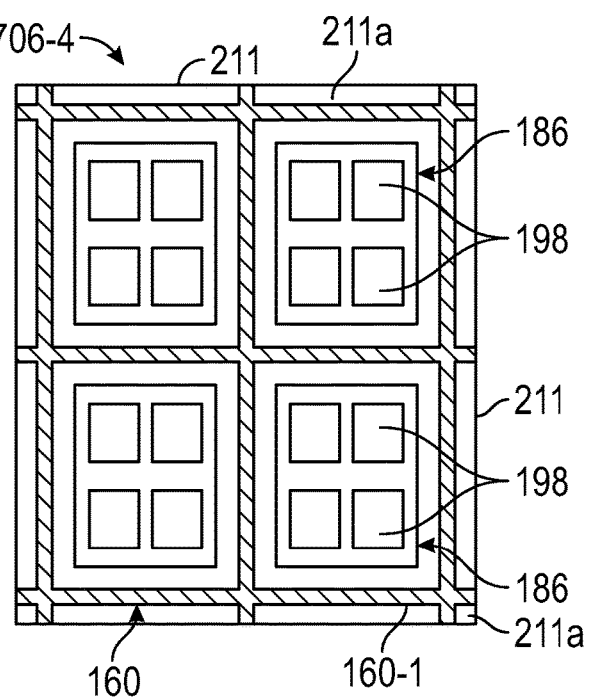
FIG. 6J is a schematic top view of a portion of an exemplary micro-optical assembly according to one exemplary embodiment of the present disclosure.

FIG. 6J shows micro-optical assembly 706-4 which includes first receptor substrate 211, having first major surface 211a, and a plurality of micro-optical elements 186 attached thereto. The plurality of micro-optical elements 186, in this embodiment, is four micro-optical elements, each in the shape of a rectangle. The four micro-optical elements form a pattern, a rectangular pattern. Each individual micro-optical element further includes a plurality of through holes 198. In this embodiment, each micro-optical element includes four through holes. The through holes are rectangular in shape. The four through holes in each micro-optical element also form a pattern, a rectangular pattern. First receptor substrate 211 also includes a first graphics layer 160, including at least one first graphic 160-1. In this embodiment, the first graphic is a series of interconnecting lines running parallel and perpendicular to each other. The first graphic is in a pattern, a grid pattern. The first graphic does not overlap with the micro-optical elements. The graphic 160-1 of graphic layer 160 is in registry with the plurality of micro-optical elements. The micro-optical elements are spatially positioned to reside between the pattern of lines of first graphic layer 160.

The present disclosure also provides for a method of making a micro-optical assembly. A method of making a micro-optical assembly includes providing any one of the segmented transfer tape of the present disclosure, wherein the structured first major surface of the backfill layer includes micro-optical structures; providing a transparent receptor substrate having a first major surface; disposing the adhesive surface of the at least one transferable segment of the segmented transfer tape onto the first major surface of the transparent receptor substrate; bonding the adhesive layer of the at least one transferable segment to the first major surface of the transparent receptor substrate; and removing the removable template layer and the at least one non-transferable segment of the segmented transfer tape from the receptor substrate, while the at least one transferable segment remains bonded to the receptor substrate. The segmented transfer tape may include a removable template layer having a structured surface and an opposed second surface; a transfer layer, the transfer layer comprising (i) a backfill layer disposed on and conforming to at least a portion of the structured surface of the removable template layer, wherein the backfill layer has a structured first major surface adjacent the structured surface of the removable template layer and an opposed second major surface, wherein the structured first major surface of the backfill layer includes micro-optical structures; and (ii) an adhesive layer having a first major surface and an opposed second major surface, wherein the second major surface of the adhesive layer is adjacent to or in contact with the second major surface of the backfill layer; at least one transferable segment formed in the transfer layer, the at least one transferable segment includes an adhesive surface and has a shape, relative to the plane of the adhesive surface; at least one non-transferable segment formed in the transfer layer, the at least one non-transferable segment includes an adhesive surface, wherein a passivating layer is disposed on at least a portion of the adhesive surface of the at least one non-transferrable segment; and at least one kerf extending from the first major surface of the adhesive layer, through the transfer layer and into at least a portion of the removable template layer, the depth of the kerf is less than the thickness of the transfer tape and, wherein the shape of the at least one transferable segment is defined by the at least one kerf.

Figure 7:
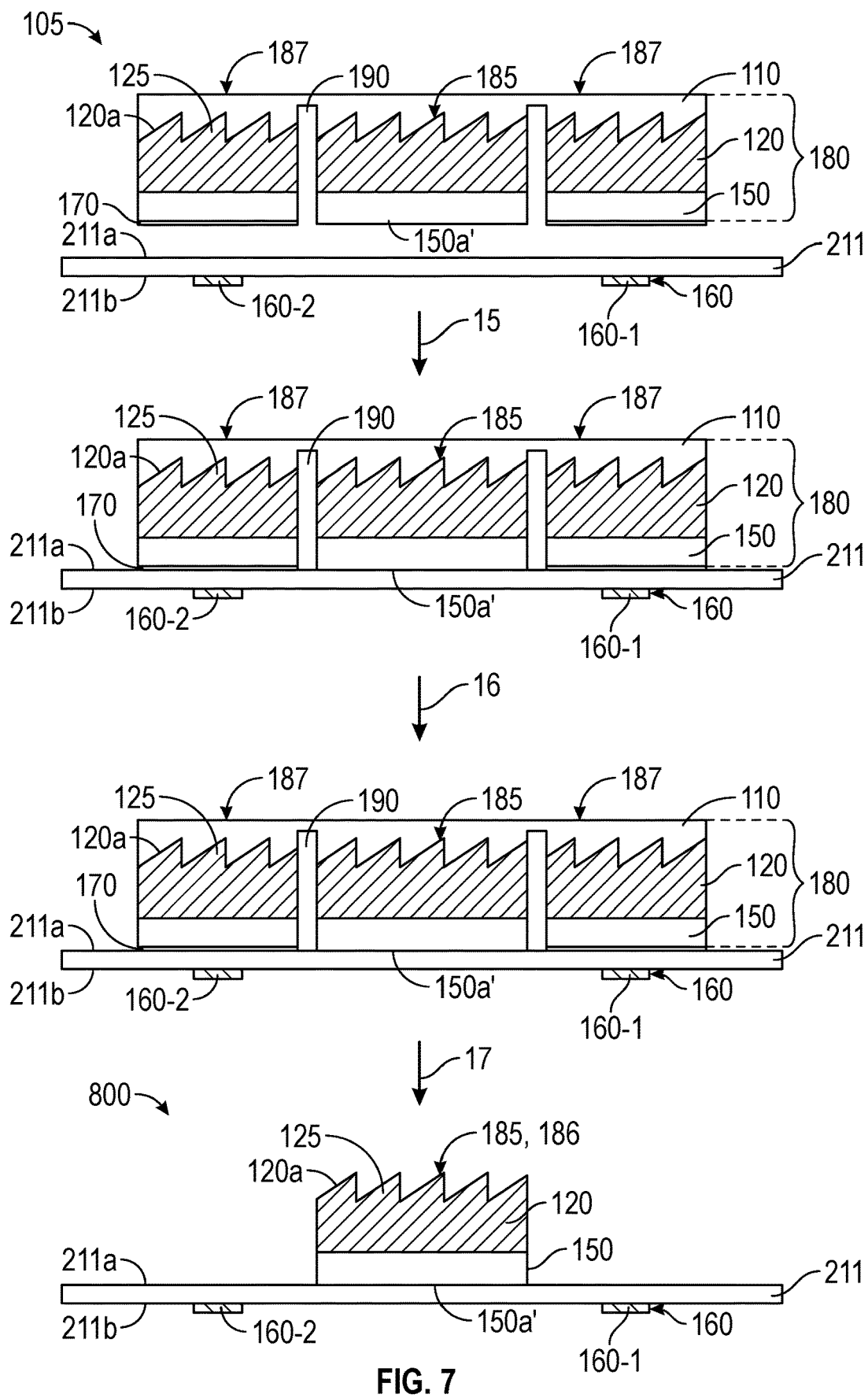
FIG. 7 is a schematic process flow diagram forming an exemplary micro-optical assembly according to one exemplary embodiment of the present disclosure.
Figure 8B:
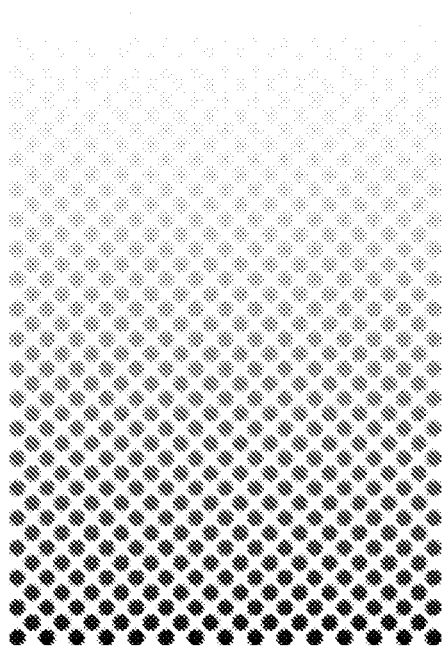
FIG. 8B is the pattern of the graphics layer of Example 1.
Figure 8D:
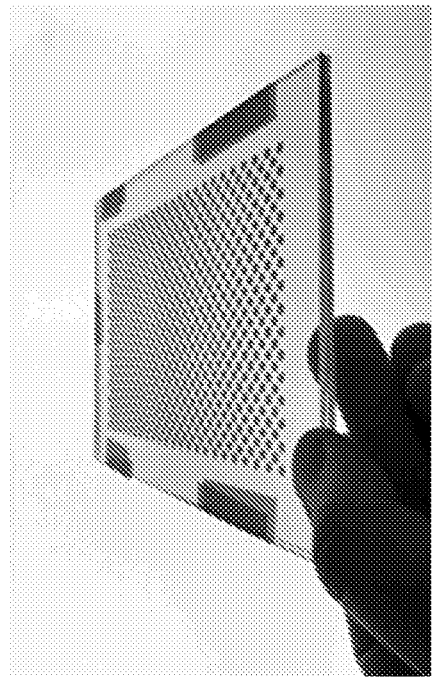
FIG. 8D is a backlit photograph (tilt view) of the micro-optical assembly of Example 1.
Figure 8A:
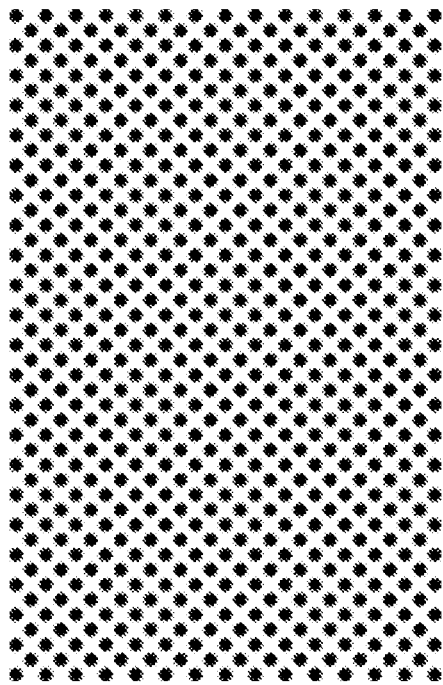
FIG. 8A is the pattern of the micro-optical elements of Example 1.
Figure 8C:
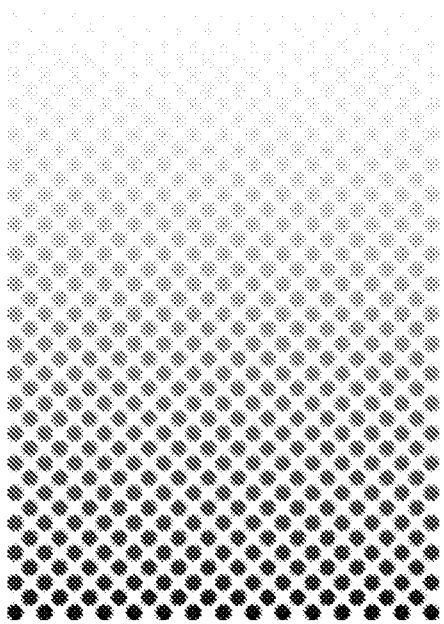
FIG. 8C is a backlit photograph (top view) of the micro-optical assembly of Example 1.
Figure 9A:
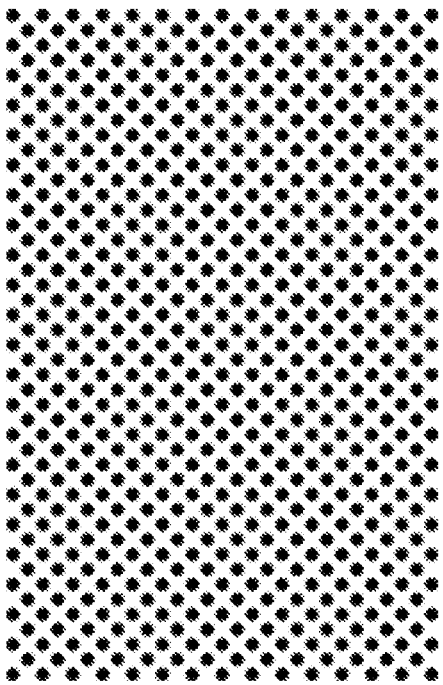
FIG. 9A is the pattern of the micro-optical element of Example 2.
Figure 9B:
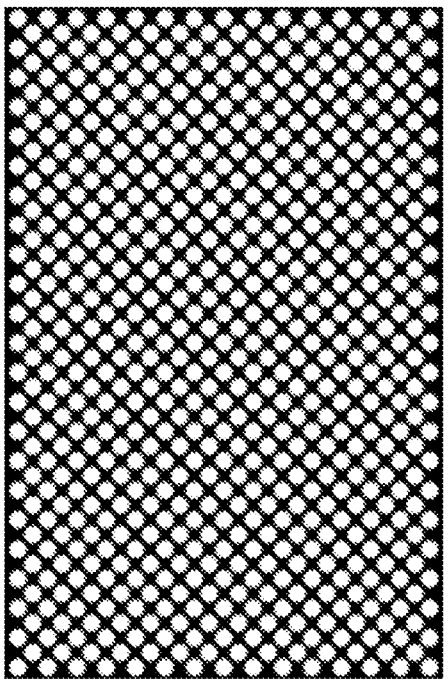
FIG. 9B is the pattern of the graphics layer of Example 2.
Figure 9C:
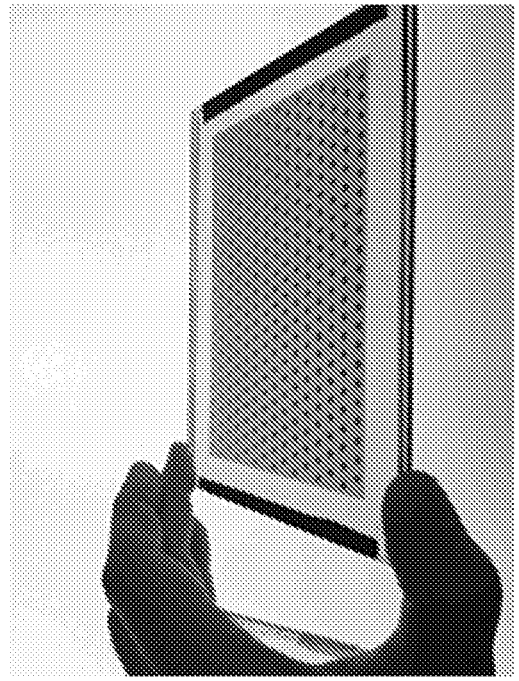
FIG. 9C is a backlit photograph (top view) of the micro-optical assembly of Example 2.
Figure 9D:
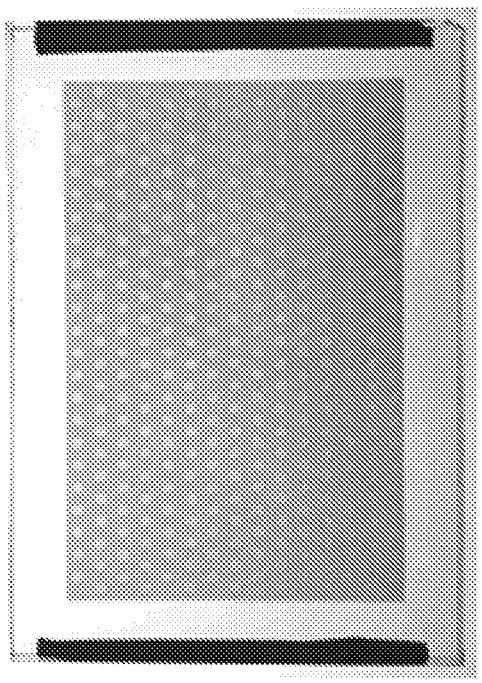
FIG. 9D is a backlit photograph (tilt view) of the micro-optical assembly of Example 2.
Figure 10A:
FIG. 10A is the pattern of the micro-optical element of Example 3.
Figure 10B:
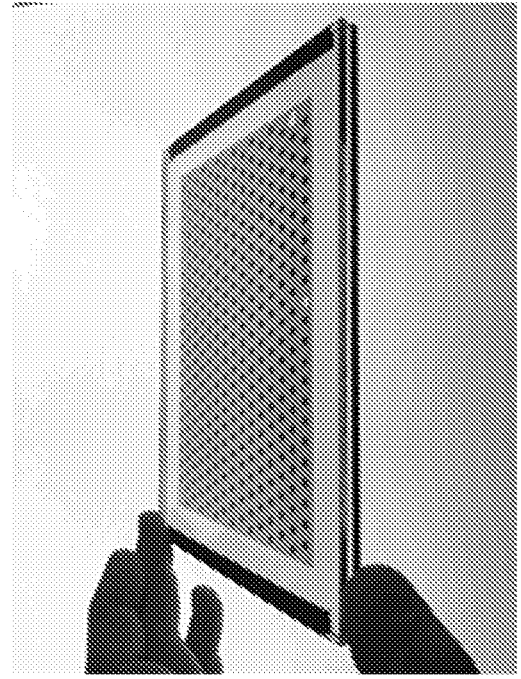
FIG. 10B is the pattern of the graphics layer of Example 3.
Figure 10C:
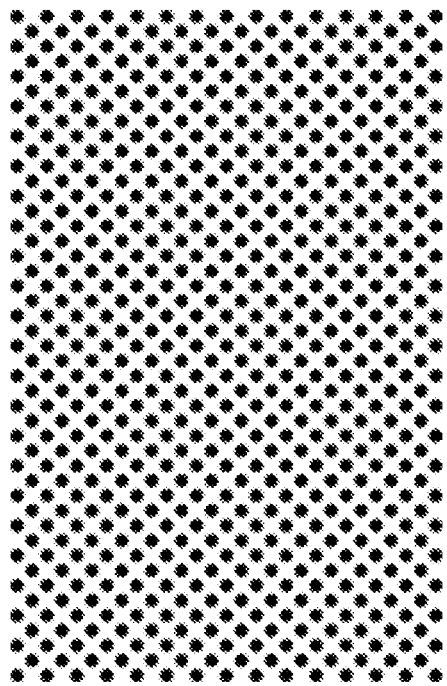
FIG. 10C is a backlit photograph (top view) of the micro-optical assembly of Example 3.
Figure 10D:
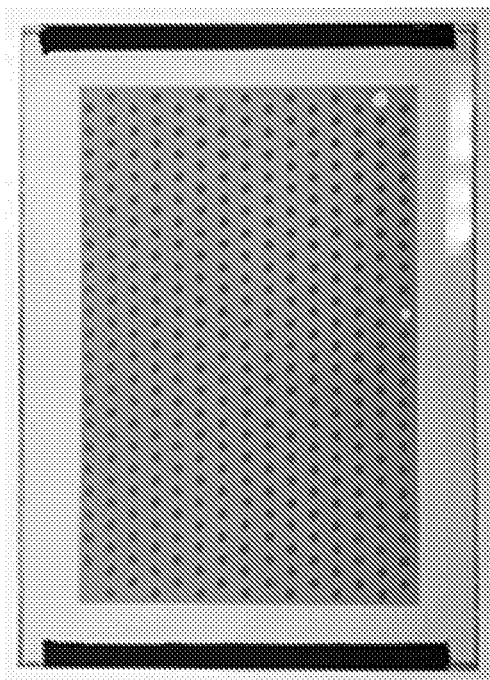
FIG. 10D is a backlit photograph (tilt view) of the micro-optical assembly of Example 3.

FIG. 7 shows a method of making a micro-optical assembly 800, including providing segmented transfer tape 105, segmented transfer tape 105 includes removable template layer 110, backfill layer 120, adhesive layer 150, passivating layer 170, at least one kerf 190, at least one transferable segment 185 and at least one non-transferable segment 187, all as previously described herein, wherein the structured surface 120a of the backfill layer 120 includes topographical features 125, which are micro-optical structures in this embodiment; providing a transparent receptor substrate 211 having a first major surface 211a and an opposed second major surface 211b, transparent receptor substrate 211 includes a first graphics layer 160, having a first graphic 160-1 and a second graphic 160-2, disposed on the second major surface 211b; disposing the adhesive surface 150a' of the at least one transferable segment 185 of segmented transfer tape 105 onto the first major surface 211a of the transparent receptor substrate 211 (step 15); bonding the adhesive layer 150 of the at least one transferable segment 185 to the first major surface 211a of the transparent receptor substrate 211 (step 16); and removing the removable template layer 110 and the at least one non-transferable segment 187 of the segmented transfer tape from the transparent receptor substrate 211, leaving the at least one transferable segment 185 of the segmented transfer tape (a micro-optical element 186) bonded to the transparent receptor substrate 211 (step 17).

The method of making a micro-optical assembly may further include wherein the at least one transferable segment includes a plurality of transferable segments. In some embodiments, the plurality of transferable segments is in a pattern. In some embodiments, the method of making a micro-optical assembly includes wherein the refractive index of the adhesive layer is no more than 0.15 higher or lower than the refractive index of the receptor substrate. In some embodiments, the refractive index of the backfill layer is higher than the refractive index of the adhesive layer. In some embodiments of the method of making the micro-optical assembly, the transparent receptor substrate includes a second graphics layer, including at least one first graphic, the second graphics layer is disposed on the major surface of the first transparent receptor substrate opposite the first graphics layer. In some embodiments, the at least one first graphic of the first graphics layer does not overlap, with the at least one transferable segment. In some embodiments, the at least one first graphic of the first graphics layer is in registry with the at least one transferable segment.

The method of making the micro-optical assembly may further include providing a second transparent substrate and, optionally, wherein the second transparent substrate is adjacent to the backfill layer of the at least one transferable segment. The second transparent substrate may be a glass panel for an insulated glazing unit. In some embodiments, the method of making a micro-optical assembly includes wherein the first transparent receptor substrate is a glass panel for an insulated glazing unit and/or wherein the micro-optical structures are daylight redirecting optical structures. In some embodiments, the second transparent substrate is a glass panel for an insulated glazing unit.

The step of bonding of the adhesive layer to the receptor substrate, e.g. a transparent receptor substrate, is conducted based on the type of adhesive used in the adhesive layer. In some embodiments the adhesive layer comprises at least one adhesive and the adhesive is at least one of a pressure sensitive adhesive, heat activated adhesive and a B-staged adhesive. When the adhesive layer includes a pressure sensitive adhesive, the bonding steep may include adding pressures tone or both of the exterior surfaces of the receptor substrate and segmented transfer tape. Heat may also be applied to one or both of the receptor substrate and segmented transfer tape. When the bonding step includes a heat activated adhesive or a B-staged adhesive, heat may be applied to one or both of the receptor substrate and segmented transfer tape. Pressure may also be applied to one or both of the receptor substrate exterior surface and segmented transfer tape exterior surface. When the bonding step includes a B-staged adhesive, further curing of the B-stages adhesive may be achieved by the use of at least one of heat and actinic radiation. Pressure may also be applied to one or both of the receptor substrate exterior surface and segmented transfer tape exterior surface.

The methods disclosed herein to pattern and transfer optical elements, e.g. micro-optical elements, may be used for use in display, semiconductor, traffic, and solar applications. Some application examples include the patterned transfer of redirection or concentration optics on solar modules, the use of collimation optics on LCD backlight units, the use of patterned retroreflectors on signage, or the use of diffractive optics on security documents. In some embodiments, the method of making a micro-optical assembly includes wherein the micro-optical structures include at least one of daylight redirecting optical structures, light extraction optical structures and wide angle color distribution optical structures (e.g. for OLEDs or LEDs).

The term "actinic radiation" refers to wavelengths of radiation that can crosslink or cure polymers and can include ultraviolet, visible, and infrared wavelengths and can include digital exposures from rastered lasers, thermal digital imaging, and electron beam scanning.

The term "polysiloxanes" refers to oligomeric or polymeric organosilicon compounds that include silicon-oxygen bonds and may include carbon-carbon and/or carbon-hydrogen bonds.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

Select embodiments of the present disclosure include, but are not limited to, the following:

In a first embodiment, the present disclosure provides a micro-optical assembly comprising:
  a first transparent receptor substrate having a first major surface and a second major surface, wherein the first transparent substrate includes a first graphics layer, including at least one first graphic, disposed on one of the transparent substrate's first and second major surfaces; and
  at least one micro-optical element, the micro-optical element comprising:
    a backfill layer having a structured first major surface and an opposed second major surface, wherein the structured first major surface of the backfill layer includes micro-optical structures; and
    an adhesive layer having a first major surface and an opposed second major surface, wherein the second major surface of the adhesive layer is adjacent to or in contact with the opposed second major surface of the backfill layer; and
  wherein, the first major surface of the adhesive layer is disposed on at least one of the first major surface of the first transparent receptor substrate and the first graphics layer.

In a second embodiment, the present disclosure provides a micro-optical assembly according to the first embodiment, wherein the at least one micro-optical element is a plurality of micro-optical elements.

In a third embodiment, the present disclosure provides a micro-optical assembly according to the second embodiment, wherein the plurality of micro-optical elements is in a pattern.

In a fourth embodiment, the present disclosure provides a micro-optical assembly according to any one of the first through third embodiments, wherein the at least one micro-optical element includes at least one through hole.

In a fifth embodiment, the present disclosure provides a micro-optical assembly according to the fourth embodiment, wherein the at least through hole is a plurality of through holes.

In a sixth embodiment, the present disclosure provides a micro-optical assembly according to the fifth embodiment, wherein the plurality of through holes is in a pattern.

In a seventh embodiment, the present disclosure provides a micro-optical assembly according to any one of the fourth through sixth embodiments, wherein the at least one graphic of the first graphics layer overlaps with the at least one through hole of the backfill layer.

In an eighth embodiment, the present disclosure provides a micro-optical assembly according to anyone of the first through seventh embodiments, wherein the at least one first graphic of the first graphics layer is a plurality of first graphics.

In a ninth embodiment, the present disclosure provides a micro-optical assembly according to the eight embodiment, wherein the plurality of first graphics is in a pattern.

In a tenth embodiment, the present disclosure provides a micro-optical assembly according to anyone of the first through ninth embodiments, wherein the first graphics layer is disposed on the first major surface of the first transparent receptor substrate.

In an eleventh embodiment, the present disclosure provides a micro-optical assembly according to anyone of the first through ninth embodiments, wherein the first graphics layer is disposed on the second major surface of the first transparent receptor substrate.

In a twelfth embodiment, the present disclosure provides a micro-optical assembly according to anyone of the first through eleventh embodiments, wherein the first receptor transparent substrate further comprises a second graphics layer, including at least one first graphic, the second graphics layer is disposed on the major surface of the first transparent receptor substrate opposite the first graphics layer.

In a thirteenth embodiment, the present disclosure provides a micro-optical assembly according to anyone of the first through twelfth embodiments, wherein the at least one first graphic of the first graphics layer is in registry with the at least one micro-optical element.

In a fourteenth embodiment, the present disclosure provides a micro-optical assembly according to anyone of the first through thirteenth embodiments, wherein the at least one graphic of the first graphics layer does not overlap with the at least one micro-optical element.

In a fifteenth embodiment, the present disclosure provides a micro-optical assembly according to anyone of the first through thirteenth embodiments, wherein the at least one graphic of the first graphics layer overlaps with the at least one micro-optical element.

In a sixteenth embodiment, the present disclosure provides a micro-optical assembly according to anyone of the first through fifteenth embodiments, further comprising a second transparent substrate having a first major surface and a second major surface.

In a seventeenth embodiment, the present disclosure provides a micro-optical assembly according to the sixteenth embodiment, wherein the first major surface of the second substrate is adjacent to the backfill layer of the at least one micro-optical element In an eighteenth embodiment, the present disclosure provides a micro-optical assembly according to the sixteenth or seventeenth embodiments, wherein the second transparent substrate further comprises a third graphics layer, including at least one first graphic, disposed on the second transparent substrate's first or second major surface.

In a nineteenth embodiment, the present disclosure provides a micro-optical assembly according to the eighteenth embodiment, wherein the second transparent substrate further comprises a fourth graphics layer, including at least one first graphic, disposed on the major surface of the second transparent substrate opposite the third graphics layer.

In a twentieth embodiment, the present disclosure provides a micro-optical assembly according to anyone of the first through nineteenth embodiments, wherein the first transparent receptor substrate is at least one of a transparent glass substrate and a transparent polymer substrate.

In a twenty-first embodiment, the present disclosure provides a micro-optical assembly according to anyone of the sixteenth through twentieth embodiments, wherein the second transparent substrate is at least one of a transparent glass substrate and a transparent polymer substrate.

In a twenty-second embodiment, the present disclosure provides a micro-optical assembly according to anyone of the first through nineteenth embodiments, wherein the first transparent receptor substrate is a glass panel for an insulated glazing unit.

In a twenty-third embodiment, the present disclosure provides a micro-optical assembly according to anyone of the sixteenth through nineteenth embodiments, wherein the first transparent receptor substrate and the second transparent substrate are glass panels for an insulated glazing unit.

In a twenty-fourth embodiment, the present disclosure provides a micro-optical assembly according to anyone of the first through twenty-third embodiments, wherein the micro-optical structures include at least one of daylight redirecting optical structures, light extraction optical structures and wide angle color distribution optical structures.

In a twenty-fifth embodiment, the present disclosure provides a method of making a micro-optical assembly comprising:
  providing a segmented transfer tape comprising:
    a removable template layer having a structured surface and an opposed second surface;
    a transfer layer, the transfer layer comprising:
      a backfill layer disposed on and conforming to at least a portion of the structured surface of the removable template layer, wherein the backfill layer has a structured first major surface adjacent the structured surface of the removable template layer and an opposed second major surface, wherein the structured first major surface of the backfill layer includes micro-optical structures; and
      an adhesive layer having a first major surface and an opposed second major surface, wherein the second major surface of the adhesive layer is adjacent to or in contact with the second major surface of the backfill layer;
    at least one transferable segment formed in the transfer layer, the at least one transferable segment includes an adhesive surface and has a shape, relative to the plane of the adhesive surface;
    at least one non-transferable segment formed in the transfer layer, the at least one non-transferable segment includes an adhesive surface, wherein a passivating layer is disposed on at least a portion of the adhesive surface of the at least one non-transferrable segment; and
    at least one kerf extending from the first major surface of the adhesive layer, through the transfer layer and into at least a portion of the removable template layer, the depth of the kerf is less than the thickness of the transfer tape and, wherein the shape of the at least one transferable segment is defined by the at least one kerf.
  providing a first transparent receptor substrate having a first major surface, wherein the first transparent receptor substrate includes a first graphics layer, including at least one first graphic, disposed on one of the transparent receptor substrate's first and second major surfaces;
  disposing the adhesive surface of the at least one transferable segment of the segmented transfer tape onto the first major surface of the first transparent receptor substrate;
  bonding the adhesive layer of the at least one transferable segment to at least one of the first major surface of the first transparent receptor substrate and the first graphics layer; and
  removing the removable template layer and the at least one non-transferable segment of the transfer tape from the first transparent receptor substrate, while the at least one transferable segment, remains bonded to the first transparent receptor substrate.

In a twenty-sixth embodiment, the present disclosure provides a method of making a micro-optical assembly according to the twenty-fifth embodiment, wherein the at least one transferable segment includes a plurality of transferable segments.

In a twenty-seventh embodiment, the present disclosure provides a method of making a micro-optical assembly according to the twenty-sixth embodiment, wherein the plurality of transferable segments is in a pattern.

In a twenty-eighth embodiment, the present disclosure provides a method of making a micro-optical assembly according to any one of the twenty-fifth though twenty-seventh embodiments, wherein the refractive index of the adhesive layer is no more than 0.15 higher or lower than the refractive index of the receptor substrate.

In a twenty-ninth embodiment, the present disclosure provides a method of making a micro-optical assembly according to any one of the twenty-fifth though twenty-eighth embodiments, wherein the refractive index of the backfill layer is higher than the refractive index of the adhesive layer.

In a thirtieth embodiment, the present disclosure provides a method of making a micro-optical assembly according to any one of the twenty-fifth though twenty-ninth embodiments, wherein the adhesive layer comprises at least one adhesive and the adhesive is at least one of a pressure sensitive adhesive, heat activated adhesive and a B-staged adhesive.

In a thirty-first embodiment, the present disclosure provides a method of making a micro-optical assembly according to any one of the twenty-fifth though thirtieth embodiments, wherein the micro-optical structures include at least one of daylight redirecting optical structures, light extraction optical structures and wide angle color distribution optical structures.

In a thirty-second embodiment, the present disclosure provides a method of making a micro-optical assembly according to any one of the twenty-fifth though thirty-first embodiments, wherein the first transparent receptor substrate is a glass panel for an insulated glazing unit.

In a thirty-third embodiment, the present disclosure provides a method of making a micro-optical assembly according to any one of the twenty-fifth though thirty-second embodiments, wherein the at least one first graphic of the first graphics layer is in registry with the at least one transferable segment.

In a thirty-fourth embodiment, the present disclosure provides a method of making a micro-optical assembly according to any one of the twenty-fifth though thirty-third embodiments, wherein the first transparent receptor substrate includes a second graphics layer, including at least one first graphic, wherein the second graphics layer is disposed on the major surface of the first transparent receptor substrate opposite the first graphics layer.

In a thirty-fifth embodiment, the present disclosure provides a method of making a micro-optical assembly according to any one of the twenty-fifth though thirty-fourth embodiments, wherein the at least one first graphic of the first graphics layer does not overlap with the at least one transferable segment.

In a thirty-sixth embodiment, the present disclosure provides a method of making a micro-optical assembly according to any one of the twenty-fifth though thirty-fifth embodiments, wherein the at least one first graphic of the first graphics layer is in registry with the at least one transferable segment.

In a thirty-seventh embodiment, the present disclosure provides a method of making a micro-optical assembly according to any one of the twenty-fifth though thirty-sixth embodiments, further includes providing a second transparent substrate and, optionally, wherein the second transparent substrate is adjacent to the backfill layer of the at least one transferable segment.

In a thirty-eighth embodiment, the present disclosure provides a method of making a micro-optical assembly according to the thirty-seventh embodiment, wherein the second transparent substrate is a glass panel for an insulated glazing unit.

EXAMPLES

Segmented transfer films were prepared. Areas of the adhesive layer of the transfer film were passivated to prevent transfer. Digital (laser cutting) methods were used to pattern the transfer film. Patterned areas in the films were transferred to glass substrates.

These examples are merely for illustrative purposes only and are not meant to be limiting on the scope of the appended claims. All parts, percentages, ratios, etc. in the examples and the rest of the specification are by weight, unless noted otherwise.

Materials List

| Abbreviation | Source |
|---|---|
| L1 | Silicone release liner commercially available from Siliconature USA, LLC Chicago, IL, as M117 |
| L2 | Release liner commercially available from 3M St. Paul, MN, as 3M 5199 |
| R1 | Aliphatic urethane diacrylate commercially available from IGM Resins Charlotte, NC, as PHOTOMER 6210 |
| R2 | Hexanediol diacrylate commercially available from Sartomer Americas Exton, PA, as SR238 |
| R3 | Aliphatic urethane acrylate oligomer commercially available from Sartomer Americas Exton, PA, as CN2920 |
| R4 | Propoxylated neopentyl glycol diacrylate commercially available from Sartomer Americas Exton, PA, as SR9003 |
| R5 | Silicone polyether acrylate commercially available from Evonik Corp. Parsippany, NY as TEGORAD 2250 |
| R6 | Trimethylolpropane triacrylate commercially available from Sartomer Americas, Exton, PA, as SR351. |
| AP1 | Acrylic Primer available from Dow Chemical Company, Midland, MI, as RHOPLEX 3208. |
| PI1 | Photoinitiator commercially available from BASF Corp. Wyandotte, MI, as LUCRIN TPO |
| PI2 | Photoinitiator commercially available from BASF Corp. Florham Park, NJ, as IRGACURE 4265 |
| LS1 | Light stabilizer commercially available from BASF Corp. Florham Park, NJ, as TINUVIN 479 |
| LS2 | Light stabilizer BASF Corp. Florham Park, NJ, as Tinuvin 123 |
| S1 | 1-methoxy-2-propanol commercially available from Dow Chemical Midland, MI, as DOWANOL PM |
| ADH1 | Silicone adhesive in ethyl acetate (an adhesive composition was prepared using the same proportions and same MQ resin as described in Example 1 of U.S. Pat. No. 7,947,376 but using the polymer solution described in U.S. Pat. No. 8,765,881 Example 12.) |
| NP1 | Surface treated zirconia particles, 60.2% solids in solvent. 62.8% of an A-174 methacryloxypropyl trimethoxysilane (available from Momentive Performance Materials Inc., Waterford, NY) surface treated 8 nm zirconia particle sol, 60.2% solids in methoxy propanol solvent (available as Dowanol PM from Dow Chemical Company, Midland, MI). The surface treated 8 nm zirconia (ZrO2) particle sol was produced as follows. An aqueous ZrO2 sol, like that produced during formation of U.S. Pat. No. 8,647,510 example 17, was first produced. This aqueous sol was concentrated to 31.75% ZrO2. The concentrated sol (400 grams) was charged to a 32 oz jar. 44.10 g of 3-(methacryloyloxy)-propyltrimethoxysilane (available from Alfa-Aesar, Ward Hill, MA), 400 g 1-methoxy-2-propanol (available as Dowanol PM from Dow Chemical Company, Midland, MI) and 0.15 g of 5 weight percent Prostab 5198 in water (Prostab 5198 available from BASF Corporation, Florham Park, NJ) were added to the sol in that order with stirring. The jar was sealed and heated to 90° C. for 16 hours. The resultant mixture (844.25 grams) was then precipitated as described below. A 2000 mL beaker was charged with DI water (1100 grams) and concentrated ammonia (25.20 grams, 29 wt % NH3). The above jar of surface modified |

| Abbreviation | Source |
|---|---|
| | ZrO2 was poured into the aqueous ammonia and stirred slowly for 10 minutes. This resulted in a white precipitate. The precipitate was isolated on a Buchner funnel (Whatman #4 filter paper). It was washed twice with 140 mL of DI water. The resultant damp solids were then dissolved in a 2000 mL beaker charged with 1-methoxy-2-propanol (1000 grams) and stirred to result in a translucent solution (about 10 weight percent solid). This sol was stripped to 50% solids and charged with 1-methoxy-2-propanol (400 g) and then concentrated to 60.2 weight percent solids. |
| I1 | UV curing clear ink commercially available from Mimaki USA, Inc. Suwanee, GA, as SPC-0659CL |
| I2 | UV curing cyan ink commercially available from Mimaki USA, Inc. Suwanee, GA, as SPC-0659C |
| I3 | UV curing magenta ink commercially available from Mimaki USA, Inc. Suwanee, GA, as SPC-0659M |
| I4 | UV curing yellow ink commercially available from Mimaki USA, Inc. Suwanee, GA, as SPC-0659Y |
| I5 | UV curing black ink commercially available from Mimaki USA, Inc. Suwanee, GA, as SPC-0659K |
| I6 | UV curing white ink commercially available from Mimaki USA, Inc. Suwanee, GA, as SPC-0659W |

Preparation of Lamination Transfer Film with Daylight Redirecting Optics

A single input roll of lamination transfer film was used for all examples. The roll is a daylight redirecting optics film containing an embedded microstructured diffuser. The film comprises a polymer substrate, a microstructured template layer, a release coating, a backfill coating, an adhesive coating, and a removable liner. The film is used to transfer the micro-optical elements (backfill and adhesive) to a glass or similar substrate.

Daylight Redirection Microstructured Template/Release Coated Film

The supporting substrate used was a 3-mil biaxially-oriented PET film having an adhesion promoting primer coating comprising AP1. The replicating resin was a 75/25 blend of R1 and R2 with 0.5% photoinitiator PI1. The replicating resin was applied to the PET substrate in a manner and rate such that the resin was evenly distributed across the region to be replicated. Replication of the resin was conducted at 30 fpm on a tool heated to 125° F. The tool, having the same but complimentary shape as the desired daylight redirecting structure, had been previously fabricated using a diamond-turning process. The desired periodic structure comprised two peaks and four facets per period with one facet per side of the function. The peaks were rounded slightly as a result of the diamond-turning process. See U.S. Patent Application Ser. No. 62/094,626, entitled "OPTICAL STRUCTURES FOR REDIRECTING DAYLIGHT" which is hereby incorporated herein by reference in its entirety. Radiation from a Fusion "D" lamp operating at 600 W/in was transmitted through the film to cure the resin while in contact with the tool. The replicated Daylight Redirection Microstructured Template Film (replicated resin on PET substrate) was then removed from the tool and wound into a roll in preparation for further processing.

To allow subsequent removal of materials cast into it, the replicated Daylight Redirection Microstructured Template Film was surface treated in a low pressure plasma chamber. After removal of the air from the chamber, perfluorohexane (C6F14) and oxygen were introduced to the chamber at flow rates of 600 and 300 sccm, respectively with a total chamber pressure of 300 mTorr. The film was treated with RF power of 3000 W as the film moved through the treatment zone at 40 ft/min. This formed the Daylight Redirection Microstructured Template/Release Coated Film.

Embedded Microstructured Diffuser Template/Release Coated Film

A 3-mil biaxially-oriented PET film having an adhesion promoting primer coating comprising AP1 had the structure from a cylindrical replication tool replicated onto the film. This formed the Embedded Microstructured Diffuser Template which was the diffuse interface between the light redirecting optics and adhesive (diffuser template). The cylindrical replication tool was made by the method used for the "First Tool" described in WO 2014/081693. The replicating resin was a 60/20/20 blend of R1, R2 and R6 with a photoinitiator package comprising of 0.5% PI1. The replicating resin was applied to the PET film in a manner and rate such that the resin was evenly distributed across the region to be replicated. Replication of the resin was conducted at 100 fpm on a replication tool heated to 125 deg F. The replication tool, having the same but complimentary shape as the desired diffuser structure, had been previously fabricated using the process described in WO 2014/081693. Radiation from Fusion "D" lamps operating at 600 W/in was transmitted through the film to cure the resin while in contact with the tool. The Embedded Microstructured Diffuser Template film (replicated resin and PET substrate) was then removed from the tool and wound into a roll in preparation for further processing. The Embedded Microstructured Diffuser Template film was release treated in a low pressure plasma chamber to allow its removal after curing of the redirecting optics resin. After removal of the air from the chamber, perfluorohexane ($C_6F_{14}$) and oxygen were introduced to the chamber at flow rates of 600 and 300 sccm, respectively with a total chamber pressure of 300 mTorr. The film was treated with RF power of 3000 W as the film moved through the treatment zone at 40 ft/min. This formed the Embedded Microstructured Diffuser Template/Release Coated Film.

Backfill Coated Daylight Redirection Microstructured Template/Release Film with Embedded Microstructured Diffuse Interface The Embedded Microstructured Diffuser Template/Release Coated Film was filled with a 69.5% solids resin solution using a die coater on a roll to roll processing line at a line speed of 20 ft/min, a coating width of 12 inches and a flow rate of 184 g/min. See Table 1 for the formulation.

TABLE 1

Backfill Coating Formulation

| Item | % wt |
|---|---|
| 80/20 R3/R4 | 28.2 |
| 75/25 LS1/LS2 | 2.8 |
| PI2 | 0.7 |
| R5 | 0.1 |
| NP1 | 62.8 |
| S1 | 5.4 |

The film was dried through three convection oven zones, each about 10 feet in length with air temperatures of 70, 80 and 90 deg C., respectively. After drying, the Embedded Microstructured Diffuser Template/Release Coated Film was laminated to the free, uncured resin surface. With both templates remaining in place, the resin was cured by passing light from a 600 w/in Fusion H-bulb through the construction. This formed the Backfill Coated Daylight Redirection Microstructured Template/Release Film with Embedded Microstructured Diffuse Interface.

Adhesive Coating

The Backfill Coated Daylight Redirection Microstructured Template/Release Film with Embedded Microstructured Diffuse Interface was coated with adhesive through the same roll to roll processing line. In-line and before coating with adhesive, the Embedded Microstructured Diffuser Template/Release Coated Film was removed. The exposed microstructured diffusing structure of the Backfill Coated Daylight Redirection Microstructured Template/Release Film was coated with adhesive at 20 ft/min using a die coater. A 15% solids silicone adhesive (ADH1) was applied. The coated film was then dried through three convection oven zones, each about 10 feet in length with air temperatures of 70, 80 and 90° C., respectively. After drying, liner L1 was laminated to the exposed adhesive and the entire construction wound into a roll in preparation for further processing. This formed the Lamination Transfer Film with Daylight Redirecting Optics.

Example Preparation Procedure

Digital Design Preparation

Digital designs were created in Adobe Illustrator CS5 (Adobe Systems, San Jose, Calif.). The designs included four layers corresponding to fiducial marks in the corners outside of the circle design pattern, laser scoring/kerf lines, a color graphics layer, and passivation areas. Offsets between the edge of the passivation area and the laser scoring/kerf line were included in the design.

Glass Substrate Cleaning

Glass substrates, 4"×6"×3 mm, were wiped with a lint free cloth and then rinsed with isopropyl alcohol. The substrates were dried in air before use in printing or lamination transfer.

Optics Integrity Check

The integrity of the redirecting optics was checked using a collimated high intensity LED flashlight (Duracell Durabeam Ultra 1000 Lumen flashlight) as a source. The lens assembly on the front of the flashlight was adjusted for the smallest possible spot size. The sample was held vertically approximately 1 ft from a white wall. The source was aimed at a spot on the center of the sample at a distance of approximately 1 ft with approximate elevation angle of 45 degrees in a vertical plane perpendicular to the wall and sample. Control samples of daylight redirecting optics show a diffuse bright spot of deflected light about 30 to 45 degrees on the wall above the horizontal plane through the center of the spot on the sample. A bright spot of transmitted light is also visible on the wall.

EXAMPLES

Example 1 (E1)

This Example is an assembly of two 4"×6"×3 mm pieces of glass—piece A with a white dot gradient pattern and piece B with a matching dot pattern of daylight redirecting optics. When the two pieces are assembled, aligned, and separated by a small gap, the white dots attenuate the light incident on the assembly and, hence, the light redirected by the daylight redirecting dots. The attenuation varies according to the white dot gradient pattern.

Graphics Layer Inkjet Printing

A UV inkjet printer (UJF-3042HG, Mimaki Engineering Co., LTD., Japan) was used to print both fiducial marks and a white graphics layer onto the surface of a clean 4"×6"×3 mm glass substrate (piece A). The glass substrate was taped to the printing bed and then printed using single cartridge of UV curing white ink (I6) (at resolution of 720×900, 12 passes). The print pattern was a regular array of approximately 3 mm diameter white dots on approximately 6 mm centers. The graphics layer on piece A had a gradient of white ink density parallel to the 6" edge. Dots were absent on one end of the gradient and fully dense (opaque) on the other end.

Passivation Layer and Fiducials Inkjet Printing

A UV inkjet printer (UJF-3042HG, Mimaki Engineering Co., LTD., Japan) was used to print both fiducial marks and non-tacky adhesive passivation layers on top of the adhesive layer of the lamination transfer films. Sampled were taped to the printing bed after first removing the liner (L1) from the lamination transfer film, exposing the adhesive layer. The passivation patterns were printed using two cartridges of (I1) UV curing clear ink (at resolution of 720×900 and 12 passes) to produce a continuous, non-tacky, patterned layer on top of the adhesive. Fiducial files were printed using single cartridges of (I2) UV curing cyan ink (at resolution of 720×900, 12 passes).

Laser Scoring/Kerf Generation

The lamination transfer film with daylight redirecting optics and printed passivation layer and fiducials described above was scored to the desired final transfer patterns by laser cutting (ILS 9.75, Universal Laser Systems, Scottsdale, Ariz. within the printed regions using a predetermined passivation offset value of 400 microns. Fiducial marks were first cut on a substrate taped to the laser bed. Printed fiducial marks on the lamination transfer film were then aligned with the laser cut fiducials and the digital design from above was run (90% speed at 10% power and 1000 pulses per inch at a z height of 0.01") to produce kerfs that extended only through the adhesive and backfill layers. The laser score pattern was a regular array of approximately 3 mm diameter white dots on approximately 6 mm centers that corresponded to the white gradient graphics layer pattern described above.

Lamination Transfer Process

The laser scored lamination transfer film with daylight redirecting optics and printed passivation layer and fiducials described above was laminated, adhesive side down, to a glass substrate (piece B) with a roller. The template film was removed, leaving the backfill and adhesive layers on glass.

Assembly of Piece A and Piece B

Piece A and Piece B were aligned with printed elements facing each other and then fixed in position with 1/16" thick×3/8" wide Black Glazing Tape (Brin Glass, Minneapolis, Minn., part #SM 5700-1215) to form an assembly. The Optics Integrity Check described above was performed. The backlit assembly exhibited light redirecting characteristics (angular variation of brightness) as well as a gradient of opacity due to the opaque white dot gradient array that was aligned to the redirecting optical elements (FIGS. 8A-8D).

Example 2 (E2)

This Example is an assembly of two 4"×6"×3 mm pieces of glass—piece A with a dot pattern of daylight redirecting optics and a complementary hole array graphics pattern of a neutral semitransparent tint and piece B that is blank. When the two pieces are assembled, aligned, and separated by a small gap, the daylight redirecting dots redirect incident light while the surrounding neutral semitransparent tint attenuates light. The redirected light is not attenuated. The assembly represents an insulating glazing unit with unattenuated redirecting optics and glare reduction (tint).

This Example was prepared using the methods of Example 1, except for the following. The graphics layer pattern was an array of holes and had a neutral gray semitransparent appearance. The passivated and scored daylight redirecting optics lamination transfer film was laminated to the glass substrate with the printed hole array (piece A) in alignment with the hole pattern. The laminate was heated at 85° C. for 5 minutes. The liner was removed and then a high durometer (70-90) rubber screen printing squeegee was used to hand laminate and wet-out adhesive onto the glass. The scored and passivated lamination transfer template film was then immediately peeled off, leaving only the desired patterned backfill and adhesive layers on the glass. The backfill/adhesive patterns were transferred directly over the printed graphics on glass. The printed fiducial marks on the glass were then removed with a razor blade.

The Optics Integrity Check described above was performed. The backlit assembly exhibited light redirecting characteristics (angular variation of brightness) as well as light attenuation in the interstitial regions between optical elements due to the semitransparent neutral tint that was aligned to the redirecting optical elements. The brightness of the optical elements was not attenuated by the tint because the holes in the tint were aligned with the optical elements (FIGS. 9A-9D).

Example 3 (E3)

This Example is an assembly of two 4"×6"×3 mm pieces of glass—piece A with a dot pattern of daylight redirecting optics and a uniform layer of printed neutral semitransparent tint and piece B that is blank. When the two pieces are assembled, aligned, and separated by a small gap, the daylight redirecting dots redirect incident light while the surrounding neutral semitransparent tint attenuates light. The redirected light is also attenuated. The assembly represents an insulating glazing unit with attenuated redirecting optics and glare reduction (tint).

This Example was prepared using the methods of Example 2, except for the following. The passivated and scored daylight redirecting optics lamination transfer film was laminated to the glass substrate first, before the graphics layer pattern was printed. The graphics layer pattern was a uniform rectangle of neutral gray semitransparent appearance that covered all of the transferred redirecting optics dots.

The Optics Integrity Check described above was performed. The backlit assembly exhibited light redirecting characteristics (angular variation of brightness) as well as light attenuation over the entire surface (FIGS. 10A-10D).

Example 4 (E4)

This Example is an assembly of two 4"×6"×3 mm pieces of glass—piece A with a custom digital pattern of daylight redirecting optics and a corresponding custom digital graphics layer forming a composite artwork. When the two pieces are assembled, aligned, and separated by a small gap, the daylight redirecting regions of the artwork redirect incident light while the surrounding semitransparent colored regions attenuate and filter incident light. The effect is similar to that of stained glass, but with functional redirecting elements. Depending upon the design of each layer, the redirected light may or may not be attenuated by the semitransparent graphics layer elements. The assembly represents an insulating glazing unit with attenuated redirecting optics and glare reduction (tint).

This example was prepared using the methods of Example 2, except for the following. Both the daylight redirecting optics and the graphics layer patterns were custom digital patterns made from a single Adobe Illustrator file and designed to be aligned on the glass substrate.

Figure 11B:
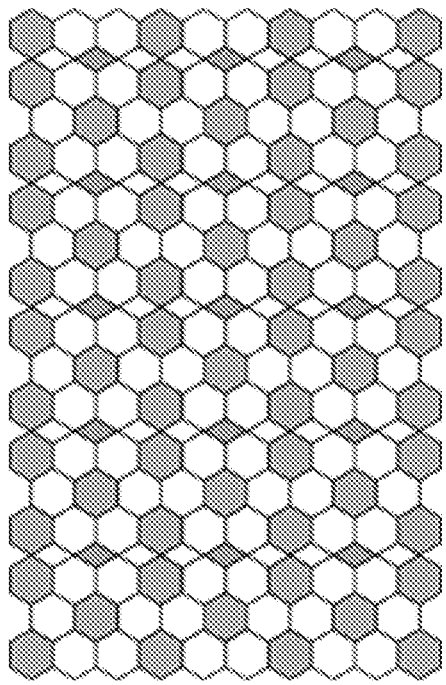
FIG. 11B is the pattern of the graphics layer of Example 4.
Figure 11D:
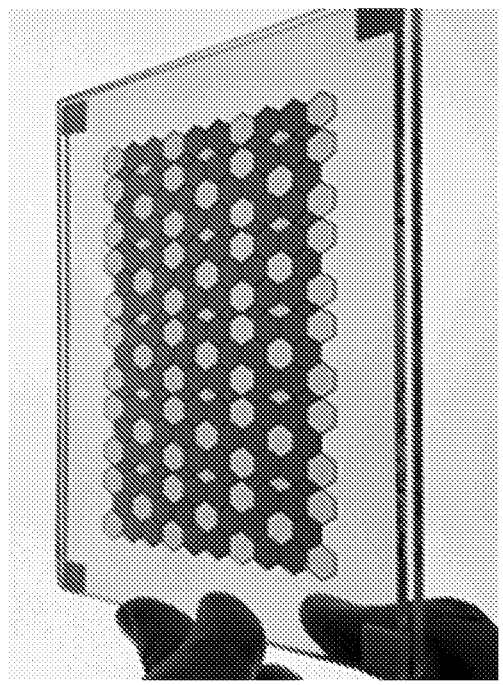
FIG. 11D is a backlit photograph (tilt view) of the micro-optical assembly of Example 4.
Figure 11A:
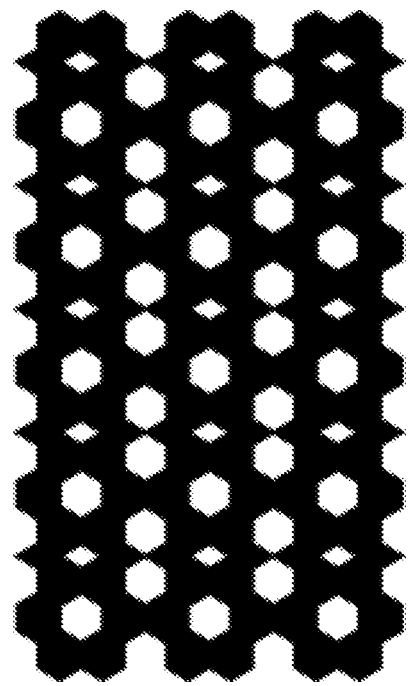
FIG. 11A is the pattern of the micro-optical element of Example 4.
Figure 11C:
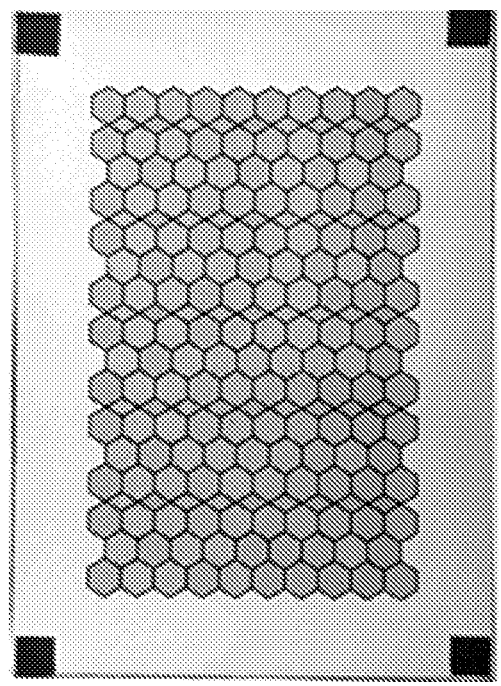
FIG. 11C is a backlit photograph (top view) of the micro-optical assembly of Example 4.

The Optics Integrity Check described above was performed. The backlit sample exhibited light redirecting characteristics (angular variation of brightness) in areas corresponding to the transferred optical elements (FIGS. 11C-11D).

What is claimed is:

1. A micro-optical assembly comprising:
    a first transparent receptor substrate having a first major surface and a second major surface, wherein the first transparent substrate includes a first graphics layer, including at least one first graphic, disposed directly on one of the transparent substrate's first and second major surfaces;
    and at least one micro-optical element, the micro-optical element comprising:
        a backfill layer having a structured first major surface and an opposed second major surface, wherein the structured first major surface of the backfill layer includes micro-optical structures; and
        an adhesive layer having a first major surface and an opposed second major surface, wherein the second major surface of the adhesive layer is in direct contact with the opposed second major surface of the backfill layer; and
    wherein, the first major surface of the adhesive layer is disposed on at least one of the first major surface of the first transparent receptor substrate and the first graphics layer.

2. The micro-optical assembly of claim 1, wherein the at least one micro-optical element is a plurality of micro-optical elements.

3. The micro-optical assembly of claim 2, wherein the plurality of micro-optical elements is in a pattern.

4. The micro-optical assembly of claim 1, wherein the at least one microoptical element includes at least one through hole.

5. The micro-optical assembly of claim 4, wherein the at least through hole is a plurality of through holes.

6. The micro-optical assembly of claim 5, wherein the plurality of through holes is in a pattern.

7. The micro-optical assembly of claim 4, wherein the at least one graphic of the first graphics layer overlaps with the at least one through hole of the backfill layer.

8. The micro-optical assembly of claim 1, wherein the at least one first graphic of the first graphics layer is a plurality of first graphics.

9. The micro-optical assembly of claim 8, wherein the plurality of first graphics is in a pattern.

10. The micro-optical assembly of claim 1, wherein the first graphics layer is disposed on the first major surface of the first transparent receptor substrate.

11. The micro-optical assembly of claim 1, wherein the first graphics layer is disposed on the second major surface of the first transparent receptor substrate.

12. The micro-optical assembly of claim 1, wherein the first receptor transparent substrate further comprises a second graphics layer, including at least one first graphic, the second graphics layer is disposed on the major surface of the first transparent receptor substrate opposite the first graphics layer.

13. The micro-optical assembly of claim 1, wherein the at least one first graphic of the first graphics layer is in registry with the at least one micro-optical element.

14. The micro-optical assembly of claim 1, wherein the at least one graphic of the first graphics layer does not overlap with the at least one micro-optical element.

15. The micro-optical assembly of claim 1, wherein the at least one graphic of the first graphics layer overlaps with the at least one micro-optical element.

16. The micro-optical assembly of claim 1 further comprising a second transparent substrate having a first major surface and a second major surface.

17. The micro-optical assembly of claim 16, wherein the first major surface of the second substrate is adjacent to the backfill layer of the at least one micro-optical element.

18. The micro-optical assembly of claim 17, wherein the second transparent substrate further comprises a third graphics layer, including at least one first graphic, disposed on the second transparent substrate's first or second major surface.

19. The micro-optical assembly of claim 18, wherein the second transparent substrate further comprises a fourth graphics layer, including at least one first graphic, disposed on the major surface of the second transparent substrate opposite the third graphics layer.

20. A method of making a micro-optical assembly comprising:
providing a segmented transfer tape comprising:
a removable template layer having a structured surface and an opposed second surface;
a transfer layer, the transfer layer comprising:
a backfill layer disposed on and conforming to at least a portion of the structured surface of the removable template layer, wherein the backfill layer has a structured first major surface adjacent the structured surface of the removable template layer and an opposed second major surface, wherein the structured first major surface of the backfill layer includes micro-optical structures; and
an adhesive layer having a first major surface and an opposed second major surface, wherein the second major surface of the adhesive layer is adjacent to or in contact with the second major surface of the backfill layer;
at least one transferable segment formed in the transfer layer, the at least one transferable segment includes an adhesive surface and has a shape, relative to the plane of the adhesive surface;
at least one non-transferable segment formed in the transfer layer, the at least one non-transferable segment includes an adhesive surface, wherein a passivating layer is disposed on at least a portion of the adhesive surface of the at least one non-transferrable segment; and
at least one kerf extending from the first major surface of the adhesive layer, through the transfer layer and into at least a portion of the removable template layer, the depth of the kerf is less than the thickness of the transfer tape and, wherein the shape of the at least one transferable segment is defined by the at least one kerf;
providing a first transparent receptor substrate having a first major surface, wherein the first transparent receptor substrate includes a first graphics layer, including at least one first graphic, disposed on one of the transparent receptor substrate's first and second major surfaces;
disposing the adhesive surface of the at least one transferable segment of the segmented transfer tape onto the first major surface of the first transparent receptor substrate;
bonding the adhesive layer of the at least one transferable segment to at least one of the first major surface of the first transparent receptor substrate and the first graphics layer; and
removing the removable template layer and the at least one non-transferable segment of the transfer tape from the first transparent receptor substrate, while the at least one transferable segment, remains bonded to the first transparent receptor substrate.

* * * * *

UNITED STATES PATENT AND TRADEMARK OFFICE
CERTIFICATE OF CORRECTION

PATENT NO. : 11,086,056 B2
APPLICATION NO. : 15/577022
DATED : August 10, 2021
INVENTOR(S) : Wolk et al.

It is certified that error appears in the above-identified patent and that said Letters Patent is hereby corrected as shown below:

In the Claims

<u>Column 56</u>
Line 64, In Claim 4, delete "microoptical" and insert -- micro-optical --, therefor.

Signed and Sealed this
Twenty-sixth Day of April, 2022

Katherine Kelly Vidal
*Director of the United States Patent and Trademark Office*